(12) United States Patent
Anthamatten et al.

(10) Patent No.: US 12,076,966 B2
(45) Date of Patent: Sep. 3, 2024

(54) SHAPE MEMORY CONTACT PRINTING METHODS

(71) Applicant: The University of Rochester, Rochester, NY (US)

(72) Inventors: Mitchell Anthamatten, Rochester, NY (US); Alexander A. Shestopalov, Rochester, NY (US)

(73) Assignee: The University of Rochester, Rochester, NY (US)

( * ) Notice: Subject to any disclaimer, the term of this patent is extended or adjusted under 35 U.S.C. 154(b) by 91 days.

(21) Appl. No.: 17/678,222

(22) Filed: Feb. 23, 2022

(65) Prior Publication Data

US 2022/0266582 A1 Aug. 25, 2022

Related U.S. Application Data

(60) Provisional application No. 63/152,624, filed on Feb. 23, 2021.

(51) Int. Cl.
*B32B 37/00* (2006.01)

(52) U.S. Cl.
CPC ........ *B32B 37/025* (2013.01); *B32B 37/0046* (2013.01); *B32B 2457/00* (2013.01)

(58) Field of Classification Search
CPC ............ B32B 2457/00; B32B 37/0046; B32B 37/025; B41K 1/36; H01L 21/6835; H01L 21/78; H01L 2221/68354; H01L 2221/68381; H01L 27/156; H10K 71/12; G03F 7/0002

See application file for complete search history.

(56) References Cited

U.S. PATENT DOCUMENTS

| 10,046,353 | B2 * | 8/2018 | Kim ...................... G03F 7/0002 |
| 2010/0316845 | A1 | 12/2010 | Rule et al. |
| 2013/0069275 | A1 | 3/2013 | Menard et al. |
| 2015/0352586 | A1 * | 12/2015 | Kim ........................ B05C 11/00 427/256 |
| 2018/0100046 | A1 * | 4/2018 | Kim .......................... B05D 1/26 |
| 2018/0207641 | A1 | 7/2018 | Kim et al. |
| 2022/0266582 | A1 * | 8/2022 | Anthamatten ........ B32B 37/025 |

OTHER PUBLICATIONS

English translation of WO-2008051318.*
English translation of WO-2016134286.*
Ahmed N et al. Active Polymeric Composite Membranes for Localized Actuation and Sensing in Microtransfer Printing. J Microelectromech S 2015, 24(4), 1016-1028.
Behl M et al. Shape-Memory Polymers and Shape-Changing Polymers. Adv Polym Sci 2010, 226, 1-40.
Benz M et al. The deformation and adhesion of randomly rough and patterned surfaces. J Phys Chem B 2006, 110(24), 11884-11893.
Bower CA et al. Emissive displays with transfer-printed assemblies of 8 μm×15 μm inorganic light-emitting diodes. Photonics Research 2017, 5(2), A23-A29.

(Continued)

*Primary Examiner* — Sonya M Sengupta
(74) *Attorney, Agent, or Firm* — Meunier Carlin & Curfman LLC

(57) ABSTRACT

Describes are methods of contacting printing with a shape-memory stamp. For example, disclosed herein are methods of patterning thin films using shape memory contact printing.

16 Claims, 39 Drawing Sheets

1. Compression at 70 °C to 0.3mm, 0.6mm, or 0.9mm deformation
2. Cooling to 23 °C at constant deformation
3. Feature detachment at 23 °C

(56) References Cited

OTHER PUBLICATIONS

Carlson A et al. Shear-enhanced adhesiveless transfer printing for use in deterministic materials assembly. Appl Phys Lett 2011, 98(26), 264104.
Carlson A et al. Transfer Printing Techniques for Materials Assembly and Micro/Nanodevice Fabrication. Advanced Materials. 2012, 24, 5284-5318.
Cha S et al. Poly(dimethylsiloxane) Stamp Coated with a Low-Surface-Energy, Diffusion-Blocking, Covalently Bonded Perfluoropolyether Layer and Its Application to the Fabrication of Organic Electronic Devices by Layer Transfer. ACS Appl Mater Inter 2018, 10(28), 24003-24012.
Chen Z et al. MicroLED technologies and applications: characteristics, fabrication, progress, and challenges. Journal of Physics D-Applied Physics 2021, 54(12), 123001.
Cho H et al. Organic Thin-Film Transistors with Transfer-Printed Au Electrodes on Flexible Substrates. Japanese Journal of Applied Physics. 2010, 49, 05EB08.
Choi W et al. Chemically Compatible Sacrificial Layer-Assisted Lift-Off Patterning Method for Fabrication of Organic Light-Emitting Displays. Jpn J Appl Phys 2011, 50(8), 080219.
Clark R et al. Perspective: New process technologies required for future devices and scaling. Apl Mater 2018, 6(5), 058203.
Corbett B et al. Transfer print techniques for heterogeneous integration of photonic components. Prog Quant Electron 2017, 52, 1-17.
Croll AB et al. Switchable Adhesives for Multifunctional Interfaces. Adv Mater Technol-US 2019, 4(8), 1900193.
del Campo A et al. Contact Shape Controls Adhesion of Bioinspired Fibrillar Surfaces. Langmuir 2007, 23(20), 10235-10243.
Eisenhaure J et al. An Internally Heated Shape Memory Polymer Dry Adhesive. Polymers-Basel 2014, 6(8), 2274-2286.
Eisenhaure J et al. Laser-Driven Shape Memory Effect for Transfer Printing Combining Parallelism with Individual Object Control. Advanced Materials Technologies. 2016, 1(7), 1600098.
Eisenhaure J et al. The Use of Shape Memory Polymers for MEMS Assembly. Journal of Microelectromechanical Systems. 2016, 25, 69-77.
Eisenhaure JD et al. Microstructured Shape Memory Polymer Surfaces with Reversible Dry Adhesion. ACS Appl Mater Inter 2013, 5(16), 7714-7717.
Eisenhaure JD et al. The Use of Shape Memory Polymers for Microassembly by Transfer Printing. J Microelectromech S 2014, 23(5), 1012-1014.
Fan ZY et al. Toward the Development of Printable Nanowire Electronics and Sensors. Advanced Materials. 2009, 21, 3730-3743.
Galliano A et al. Adhesion and friction of PDMS networks: molecular weight effects. J Colloid Interf Sci 2003, 265(2), 372-379.
Gong L et al. Fundamentals and Advances in the Adhesion of Polymer Surfaces and Thin Films. Langmuir 2019, 35(48), 15914-15936.
Greenwood JA et al. The Mechanics of Adhesion of Viscoelastic Solids. Philosophical Magazine a-Physics of Condensed Matter Structure Defects and Mechanical Properties. 1981, 43, 697-711.
Hensel R et al. Engineering Micropatterned Dry Adhesives: From Contact Theory to Handling Applications. Adv Funct Mater 2018, 28(28), 1800865.
Hensel R et al. Wetting Resistance at Its Topographical Limit: The Benefit of Mushroom and Serif T Structures. Langmuir 2013, 29(4), 1100-1112.
Huang Y et al. Direct Laser Writing-Based Programmable Transfer Printing via Bioinspired Shape Memory Reversible Adhesive. ACS Appl Mater Inter 2016, 8(51), 35628-35633.
Hwang SH et al. Droplet-Mediated Deterministic Microtransfer Printing: Water as a Temporary Adhesive. ACS Appl Mater Inter 2019, 11(8), 8645-8653.
Jeon S et al. Multilayer metal-oxide-metal nanopatterns via nanoimprint and strip-off for multispectral resonance. Appl Surf Sci 2018, 428, 280-288.

Jiang DJ et al. Rate-dependent interaction between thin films and interfaces during micro/nanoscale transfer printing. Soft Matter 2012, 8(2), 418-423.
Johnson KL et al. Surface energy and the contact of elastic solids. Proceedings of the Royal Society of London. A. Mathematical and Physical Sciences 1971, 324(1558), 301-313.
Kang JH et al. Enhanced adhesive strength between shape memory polymer nanocomposite and titanium alloy. Compos Sci Technol 2014, 96, 23-30.
Kang SM et al. Robust superomniphobic surfaces with mushroom-like micropillar arrays. Soft Matter 2012, 8(33), 8563-8568.
Kaufmann T et al. Stamps, inks and substrates: polymers in microcontact printing. Polymer Chemistry. 2010, 1, 371-387.
Keum H et al. Microassembly of Heterogeneous Materials using Transfer Printing and Thermal Processing. Sci Rep-Uk 2016, 6, 29925.
Kim BH et al. Multilayer Transfer Printing for Pixelated, Multicolor Quantum Dot Light-Emitting Diodes. Acs Nano 2016, 10(5), 4920-4925.
Kim KH et al. Inverted top-emitting organic light-emitting diodes by whole device transfer. Organic Electronics 2008, 9(6), 1118-1121.
Kim S et al. Soft nanocomposite electroadhesives for digital micro- and nanotransfer printing. Sci Adv 2019, 5(10), eaax4790.
Kim S et al. Wet Self-Cleaning of Biologically Inspired Elastomer Mushroom Shaped Microfibrillar Adhesives. Langmuir 2009, 25(13), 7196-7199.
Kim S. Micro-LEGO for MEMS. Micromachines (Basel) 2019, 10(4), 267.
Kim TH et al. Kinetically controlled, adhesiveless transfer printing using microstructured stamps. Appl Phys Lett 2009, 94(11), 113502.
Kim-Lee HJ et al. Interface mechanics of adhesiveless microtransfer printing processes. Journal of Applied Physics. 2014, 115, 7.
Kippenberg TJ et al. Fabrication and coupling to planar high-Q silica disk microcavities. Appl Phys Lett 2003, 83(4), 797-799.
Lee et al. Geometry- and Length Scale-Dependent Deformation and Recovery on Micro-and Nanopatterned Shape Memory Polymer surfaces. Scientific Reports, 2016, 6, 23686.
Lee H et al. Semicrystalline Shape-Memory Elastomers: Effects of Molecular Weight, Architecture, and Thermomechanical Path. Macromol Mater Eng 2017, 302(12), 1700297.
Li J et al. High-Resolution Organic Light-Emitting Diodes Patterned via Contact Printing. ACS Appl Mater Interfaces 2016, 8(26), 16809-15.
Li JH et al. Urethane-acrylate polymers in high-resolution contact printing. Journal of Materials Chemistry C. 2016, 4, 4155-4165.
Li W et al. Antibody modified gold nano-mushroom arrays for rapid detection of alpha-fetoprotein. Biosensors and Bioelectronics 2015, 68, 468-474.
Li Y et al. 48×48 pixelated addressable full-color micro display based on flip-chip micro LEDs. Appl Optics 2019, 58(31), 8383-8389.
Li. High-Resolution Contact Transfer via Optimized Polyurethane-Acrylate and Its Application in Fabricating Micro-Patterned Organic Light Emitting Diodes. Dissertation, 2015 University of Rochester, 201 pages.
Linghu C et al. Rapidly tunable and highly reversible bio-inspired dry adhesion for transfer printing in air and a vacuum. Soft Matter 2018, 15(1), 30-37.
Liu JS et al. Sacrificial layer-assisted nanoscale transfer printing. Microsyst Nanoeng 2020, 6(1), 80.
Liu W et al. Metal-Assisted Transfer Strategy for Construction of 2D and 3D Nanostructures on an Elastic Substrate. ACS Nano 2019, 13(1), 440-448.
Long H et al. Silica-based microcavity fabricated by wet etching. Chinese Physics B 2017, 26(5), 054211.
Mahmoud N et al. Micro-Transfer-Printing of Al2O3-Capped Short-Wave-Infrared PbS Quantum Dot Photoconductors. ACS Applied Nano Materials 2018, 2(1), 299-306.
Maugis D et al. Fracture Mechanics and Adherence of Viscoelastic Bodies. Journal of Physics D-Applied Physics. 1978, 11, 1989-&.

(56) References Cited

OTHER PUBLICATIONS

McPhillimy J et al. High accuracy transfer printing of single-mode membrane silicon photonic devices. Opt Express 2018, 26(13), 16679-16688.
Meitl MA et al. Transfer printing by kinetic control of adhesion to an elastomeric stamp. Nature Materials. 2006, 5, 33-38.
Michal BT et al. Stimuli-Responsive Reversible Two-Level Adhesion from a Structurally Dynamic Shape-Memory Polymer. ACS Appl Mater Inter 2016, 8(17), 11041-11049.
Michel B et al. Printing meets lithography: Soft approaches to high-resolution patterning. Chimia. 2002, 56, 527-542.
Mrozek RA et al. Highly compliant shape memory polymer gels for tunable damping and reversible adhesion. Smart Mater Struct 2016, 25(2), 025004.
Murphy MP et al. Enhanced Adhesion by Gecko-Inspired Hierarchical Fibrillar Adhesives. ACS Appl Mater Inter 2009, 1(4), 849-855.
Neuking K et al. Surface engineering of shape memory alloy/polymer-composites: Improvement of the adhesion between polymers and pseudoelastic shape memory alloys. Mat Sci Eng a-Struct 2008, 481, 606-611.
NSF Award Abstract #1530540, SNM: Modulation of Surface Topography for Scalable Contact Printing, accessed online on Dec. 17, 2018 at https://www.nsf.gov/awardsearch/showAward?AWD_ID=1530540.
Obaid S et al. Highly Efficient Microscale Gallium Arsenide Solar Cell Arrays as Optogenetic Power Options. IEEE Photonics Journal 2019, 11(1), 1-8.
Olah A et al. Hydrophobic recovery of UV/ozone treated poly(dimethylsiloxane): adhesion studies by contact mechanics and mechanism of surface modification. Appl Surf Sci 2005, 239(3-4), 410-423.
Parbrook PJ et al. Micro-Light Emitting Diode: From Chips to Applications. Laser Photonics Rev 2021, 15(5), 2000133.
Park J et al. Multilayer transfer printing for polyelectrolyte multilayer patterning: Direct transfer of layer-by-layer assembled micropatterned thin films. Adv Mater 2004, 16(6), 520-+.
Park J et al. Transfer Printing of Electronic Functions on Arbitrary Complex Surfaces. ACS Nano 2020, 14(1), 12-20.
Park JK et al. Reversible Underwater Dry Adhesion of a Shape Memory Polymer. Adv Mater Interfaces 2019, 6(3), 1801542.
Park TH et al. Contact printing of the emitting layer for high performance multilayered phosphorescent organic light-emitting diodes. Organic Electronics 2011, 12(6), 1063-1067.
Peng P et al. One-Step Selective Adhesive Transfer Printing for Scalable Fabrication of Stretchable Electronics. Adv Mater Technol-US 2018, 3(3), 1700264.
Rapp L et al. Improvement in semiconductor laser printing using a sacrificial protecting layer for organic thin-film transistors fabrication. Applied Surface Science. 2011, 257, 5245-5249.
Sadhu VB et al. Surface modification of elastomeric stamps for microcontact printing of polar inks. Langmuir 2007, 23(12), 6850-6855.
Sarwate P et al. Controllable strain recovery of shape memory polystyrene to achieve superhydrophobicity with tunable adhesion. J Micromech Microeng 2014, 24(11), 115006.
Saulnier F et al. Adhesion between a viscoelastic material and a solid surface. Macromolecules 2004, 37(3), 1067-1075.
Seo J et al. Micro-wedge array surface of a shape memory polymer as a reversible dry adhesive. Extreme Mech Lett 2016, 9, 207-214.
Shaw-Stewart J et al. Laser-Induced Forward Transfer of Polymer Light-Emitting Diode Pixels with Increased Charge Injection. ACS Applied Materials & Interfaces. 2011, 3, 309-316.
Sheng X et al. Printing-based assembly of quadruple-junction four-terminal microscale solar cells and their use in high-efficiency modules. Nat Mater 2014, 13(6), 593-8.
Shin SH et al. Dual nanotransfer printing for complementary plasmonic biosensors. Nanotechnology 2019, 30(38), 385302.
Shull KR. Contact mechanics and the adhesion of soft solids. Materials Science & Engineering R-Reports. 2002, 36, 1-45.
Si SH et al. Image inverting, topography and feature size manipulation using organic/inorganic bi-layer lift-off for nanoimprint template. Microelectron Eng 2018, 197, 39-44.
Smythe EJ et al. A Technique to Transfer Metallic Nanoscale Patterns to Small and Non-Planar Surfaces. ACCS Nano 2009, 3(1), 59-65.
Taniguchi J et al. Nanoprint lithography of gold nanopatterns on polyethylene terephthalate. Microelectronic Engineering. 2009, 86, 590-595.
Tiwari A et al. The effect of surface roughness and viscoelasticity on rubber adhesion. Soft Matter 2017, 13(19), 3602-3621.
Vazquez-Mena O et al. Analysis of the blurring in stencil lithography. Nanotechnology 2009, 20(41), 415303.
Voskuhl J et al. Advances in contact printing technologies of carbohydrate, peptide and protein arrays. Current Opinion in Chemical Biology. 2014, 18, 1-7.
Wang RM et al. Shape Memory- and Hydrogen Bonding-Based Strong Reversible Adhesive System. Langmuir 2010, 26(5), 2999-3002.
Wang Y et al. Programmable, reversible and repeatable wrinkling of shape memory polymer thin films on elastomeric substrates for smart adhesion. Soft Matter 2017, 13(31), 5317-5323.
Wobser V et al. Light-Activated Hydrophobic Adhesive for Shape-Memory Polymer Nerve Cuffs. MRS Adv 2016, 1(1), 1-7.
Xue YG et al. A theoretical model of reversible adhesion in shape memory surface relief structures and its application in transfer printing. J Mech Phys Solids 2015, 77, 27-42.
Yang SY et al. Elastomer Surfaces with Directionally Dependent Adhesion Strength and Their Use in Transfer Printing with Continuous Roll-to-Roll Applications. Adv Mater 2012, 24(16), 2117-2122.
Yi H et al. Simple and Reliable Fabrication of Bioinspired Mushroom-Shaped Micropillars with Precisely Controlled Tip Geometries. ACS Appl Mater Inter 2016, 8(34), 22671-22678.
Yoon J et al. Heterogeneously Integrated Optoelectronic Devices Enabled by Micro-Transfer Printing. Adv Opt Mater 2015, 3(10), 1313-1335.
Yoon J et al. Ultrathin silicon solar microcells for semitransparent, mechanically flexible and microconcentrator module designs. Nature Materials. 2008, 7, 907-915.
Zare Y. Determination of polymer-nanoparticles interfacial adhesion and its role in shape memory behavior of shape memory polymer nanocomposites. Int J Adhes Adhes 2014, 54, 67-71.
Zhang HY et al. In-situ switchable superhydrophobic shape memory microstructure patterns with reversible wettability and adhesion. Appl Surf Sci 2020, 525, 146525.
Zhou H et al. Transfer Printing and its Applications in Flexible Electronic Devices. Nanomaterials (Basel) 2019, 9(2), 283.
Kim, et al., Modulation of Interfacial Adhesion Using Semicrystalline Shape-Memory Polymers. Langmuir 2022, 38, 3607-3616.
Kim, et al., Contact Printing of Multilayered Thin Films with Shape Memory Polymers. ACS Nano 2022, 16, 6134-6144.

* cited by examiner

Semicrystalline Polycaprolactone Polymer (PCL-SP)

Melting Temperature ($T_M$): 39 °C
Water Contact Angle: 73° (static); 99° (adv.); 23° (reced.)
Young's Modulus: 3.8 MPa at 60 °C, 175 MPa at 23 °C

PCL-SP Cylindrical and Hemispherical Features

Cylinder     Hemisphere

Contact Mechanics Measuring System (CMMS)

4-5: Deposition of Au (12nm) and HS-C$_x$F$_y$ SAM
5-4R: Printing cycle and donor substrate cleaning with Nanostrip at 75°C
4R-5R: Deposition of Au (12nm) and HS-C$_x$F$_y$ SAM

*Thermo-mechanical shape-memory cycle*

1-2: Compression to a set deformation and hold at 80°C
3: Cooling at a fixed deformation to 25 °C
4: Unloading and detachment from the donor

*Rubbery compression*

1-2: Compression to a set deformation and hold at 80°C
4: Unloading and detachment from the donor

1-2: Compression to a set deformation and hold at 25°C
4: Unloading and detachment from the donor

1. Al:
49.2 mN/m
80nm

2. TCTA-FIrpic:
38 mN/m
60nm

3. Au-SAM:
15.9 mN/m
12nm

4. SiO₂:
43.8 mN/m

5. TCTA/MoOx:
27 mN/m, 21nm

*Pick up control at 80°C*

*Pick up control at 25°C*

1: Compression to a set deformation and hold at 25°C or 80°C
2: Unloading and detachment from the donor

SHAPE MEMORY CONTACT PRINTING METHODS

CROSS-REFERENCE TO RELATED APPLICATIONS

This application claims the benefit of priority to U.S. Provisional Application No. 63/152,624 filed Feb. 23, 2021, which is hereby incorporated herein by reference in its entirety.

STATEMENT OF GOVERNMENT SUPPORT

This invention was made with government support under ECCS-1530540 awarded by National Science Foundation. The government has certain rights in the invention.

BACKGROUND

Over the past two decades, contact transfer printing has evolved into a viable manufacturing technology that can deposit and pattern various ink materials. Contact printing relies on the elastomeric stamp that forms an adhesive and conformal contact with the ink layer during the ink pickup, and on the interfacial fracture of the ink-stamp interface during the ink transfer. Contact printing is inherently amenable to replicate large-area patterns on flat or curvilinear substrates, and it has potential to evolve into a universal platform for large-area, parallel deposition of multiple types of materials at the sub-micrometer length scale. However, the key to enabling such manufacturing is to establish clean and reliable methods for controlling interfacial adhesion and fracture mechanics during the ink pickup and release. The methods disclosed herein address these and other needs.

SUMMARY

In accordance with the purposes of the disclosed methods, as embodied and broadly described herein, the disclosed subject matter relates to methods of contacting printing with a shape-memory stamp. For example, disclosed herein are methods of patterning thin films using shape memory contact printing. More specifically, disclosed herein are methods of patterning thin films of organic and/or inorganic materials with high resolution using shape memory contact printing.

For example, disclosed herein are methods of contact printing with a shape-memory stamp, the shape-memory stamp comprising a shape-memory polymer having a transition temperature, the methods comprising:
 a) heating the shape-memory stamp to a temperature above the transition temperature;
 b) contacting the shape-memory stamp with a donor substrate while the shape-memory stamp is above the transition temperature, wherein the donor substrate has a thin film disposed on a surface thereof and contacting the shape-memory stamp with the donor substrate comprises contacting a surface of the shape-memory stamp with the thin film;
 c) while the surface of the shape-memory stamp is in contact with the thin film, cooling the shape-memory stamp to a temperature below the transition temperature, thereby temporarily fixing the shape-memory polymer and the shape-memory stamp, such that the shape-memory polymer and the shape-memory stamp are in a temporarily fixed state;
 d) separating the shape-memory stamp in the temporarily fixed state from the donor substrate, thereby picking up the thin film from the donor substrate with the shape-memory stamp in the temporarily fixed state, such that the shape-memory stamp in the temporarily fixed state includes the thin film on the surface thereof after being separated from the donor substrate, such that the shape-memory stamp is in a printed temporarily fixed state and has a printed surface;
 e) contacting the printed surface of the shape-memory stamp in the printed temporarily fixed state with a top surface of a receiver substrate;
 f) heating the shape-memory stamp in the printed temporarily fixed state to a temperature above the transition temperature while in contact with the top surface of the receiver substrate, thereby depositing the thin film on the top surface; and
 g) after heating the shape-memory stamp in the printed temporarily fixed state to a temperature above the transition temperature, separating the shape-memory stamp from the receiver substrate, wherein the thin film remains on the top surface of the receiver substrate after the shape-memory stamp is separated from the receiver substrate, thereby transferring the thin film onto the top surface of the receiver substrate, the thin film transferred to the top surface of the receiver substrate being a printed element having an average size of from 1 nanometer (nm) to 100 micrometers (microns, μm).

In some examples, the methods can further comprise, after step g), re-using the shape memory stamp to repeat steps a)-g).

In some examples, the methods can further comprise, before step a), making the shape-memory stamp, the shape-memory polymer, or a combination thereof.

The shape-memory polymer can, for example, comprise a semi-crystalline polymer, a glass forming network polymer, or a combination thereof. In some examples, the shape-memory polymer comprises a polycaprolactone polymer, a urethane-acrylate polymer, a thiol-vinyl network polymer, or a combination thereof.

In some examples, the methods can further comprise, before step a), determining the transition temperature.

In some examples, the transition temperature is above room temperature.

In some examples, the shape-memory polymer has a first Young's modulus at a temperature above the transition temperature and a second Young's modulus at a temperature below the transition temperature, the first Young's modulus being lower than the second Young's modulus.

In some examples, the shape memory polymer stamp has a set of features extending from a bottom surface along a central axis to a terminal surface, the terminal surface being opposite and axially spaced apart from the bottom surface, wherein contacting a surface of the shape-memory stamp with the thin film comprises contacting the terminal surface with the thin film.

In some examples, the methods can further comprise, after step b) and before step c), compressing the shape-memory stamp against the donor substrate.

In some examples, the donor substrate has a first surface and a set of protrusions extending from the first surface along an axis to a second surface, the second surface being opposite and axially spaced apart from the first surface, the second surface being planar, and the thin film is disposed on the second surface. In some examples, the set of protrusions have a first section and a second section, the first section extending from the first surface along a first portion of the axis, the second section adjoining the first section and extending along a second portion of the axis to the second surface; wherein the first section has a first average characteristic dimension where the first section adjoins the second section; wherein the second section has a second average characteristic dimension where the first section adjoins the second section; and wherein the first average characteristic dimension is smaller than the second average characteristic dimension. In certain examples, compressing the shape-memory stamp against the donor substrate comprises compressing the shape-memory stamp along the direction of the axis of the set of protrusions such that the surface of the shape-memory polymer deforms from being substantially flat to being indented by the set of protrusions; cooling the shape-memory stamp to a temperature below the transition temperature fixes the indentations in the surface of the shape-memory stamp; the shape-memory stamp in the temporarily fixed state includes the thin film within the indentations after being separated from the donor substrate, such that the printed surface of the shape-memory stamp in the printed temporarily fixed state is an indented printed surface; contacting the printed surface of the shape-memory stamp with the top surface of the receiver substrate comprises contacting the indented printed surface of the shape-memory stamp with the top surface of the receiver substrate; and heating the shape-memory stamp in the printed temporarily fixed state to a temperature above the transition temperature while in contact with the top surface of the receiver substrate further comprises the indented surface of the shape-memory polymer returning to being substantially flat thereby contacting the thin film with the top surface.

In some examples, the methods can further comprise, before step a) or step b), making the donor substrate.

In some examples, the thin film comprises an organic semiconductor, an inorganic light-emitting material, or a combination thereof.

In some examples, the thin film has an average thickness of from 1 nanometer (nm) to 50 micrometers (µm, microns).

In some examples, the thin film comprises a plurality of layers and the composition of a given layer differs from the other layer(s) contacting said given layer.

In some examples, the method has a resolution of 10 micrometers or less.

Also disclosed herein are printed substrates made by any of the methods disclosed herein. Also disclosed herein are articles of manufacture comprising any of the printed substrates, e.g. made by any of the methods, disclosed herein. In some examples, the article comprises an electronic device, a photonic device, an optical device, or a combination thereof.

Additional advantages will be set forth in part in the description that follows or may be learned by practice of the aspects described below. The advantages described below will be realized and attained by elements and combinations particularly pointed out in the appended claims. It is to be understood that both the foregoing general description and the following detailed description are exemplary and explanatory only and are not restrictive.

BRIEF DESCRIPTION OF THE FIGURES

The accompanying figures, which are incorporated in and constitute a part of this specification, illustrate several aspects described below.

DETAILED DESCRIPTION

Figure 1:
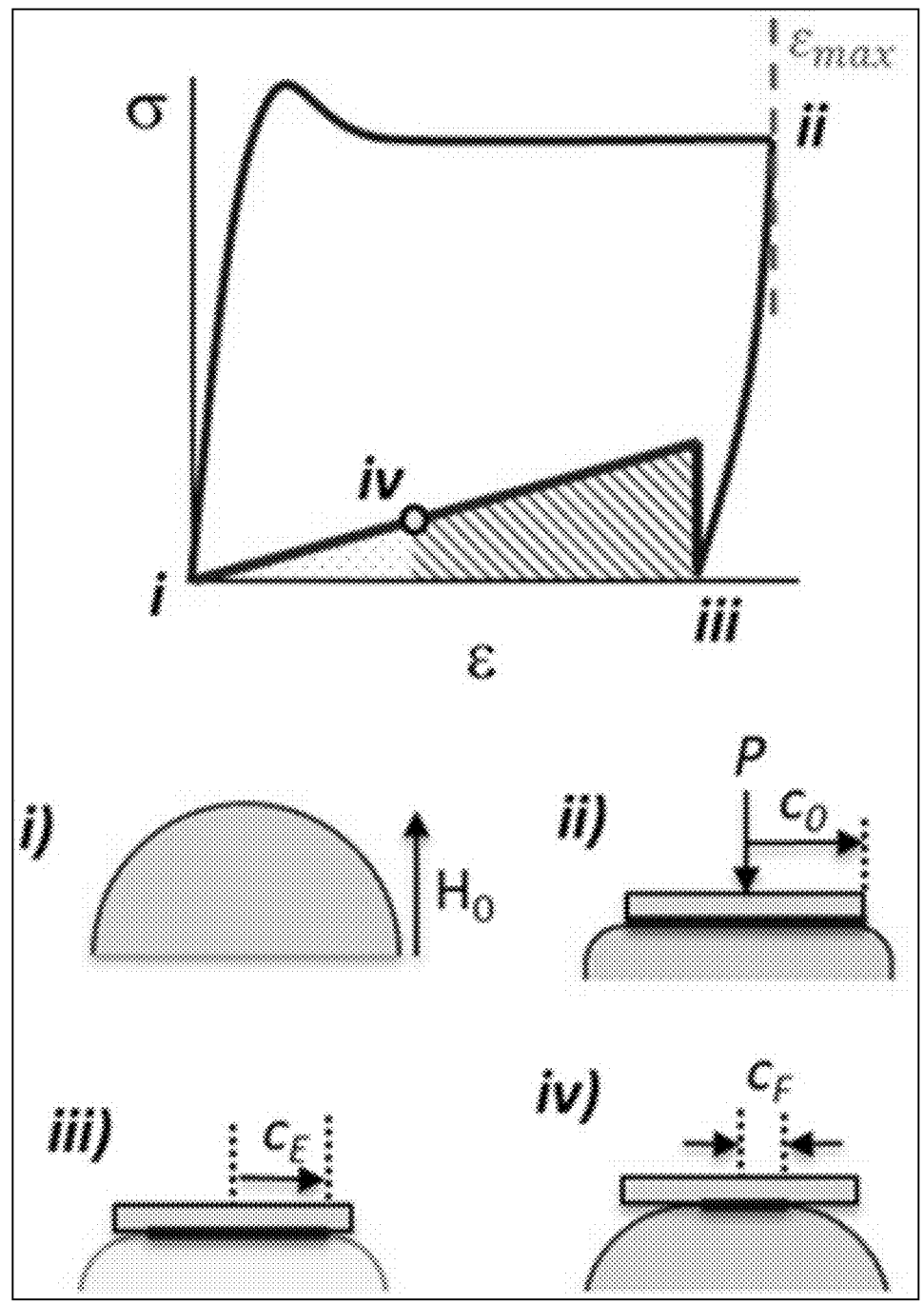
FIG. 1. Schematic showing stress vs. strain of a hemi-spherical feature interacting with a thin ink layer during sequential shape and adhesive changes: (i) a surface feature initially height $H_0$; (ii) after compression to a contact area with radius co while above $T_{SM}$; (iii) after cooling beneath $T_{SM}$ and load removal; and (iv) after heating above $T_{SM}$. For a crack size a>>h, steady-state adhesive loss develops.

The methods and compositions described herein may be understood more readily by reference to the following detailed description of specific aspects of the disclosed subject matter and the Examples included therein.

Before the present methods and compositions are disclosed and described, it is to be understood that the aspects described below are not limited to specific synthetic methods or specific reagents, as such may, of course, vary. It is also to be understood that the terminology used herein is for the purpose of describing particular aspects only and is not intended to be limiting.

Also, throughout this specification, various publications are referenced. The disclosures of these publications in their entireties are hereby incorporated by reference into this application in order to more fully describe the state of the art to which the disclosed matter pertains. The references disclosed are also individually and specifically incorporated by reference herein for the material contained in them that is discussed in the sentence in which the reference is relied upon.

In this specification and in the claims that follow, reference will be made to a number of terms, which shall be defined to have the following meanings:

Throughout the description and claims of this specification the word "comprise" and other forms of the word, such as "comprising" and "comprises," means including but not limited to, and is not intended to exclude, for example, other additives, components, integers, or steps.

As used in the description and the appended claims, the singular forms "a," "an," and "the" include plural referents unless the context clearly dictates otherwise. Thus, for example, reference to "a composition" includes mixtures of two or more such compositions, reference to "the compound" includes mixtures of two or more such compounds, reference to "an agent" includes mixture of two or more such agents, and the like.

"Optional" or "optionally" means that the subsequently described event or circumstance can or cannot occur, and that the description includes instances where the event or circumstance occurs and instances where it does not.

Values can be expressed herein as an "average" value. "Average" generally refers to the statistical mean value.

By "substantially" is meant within 5%, e.g., within 4%, 3%, 2%, or 1%.

"Exemplary" means "an example of" and is not intended to convey an indication of a preferred or ideal embodiment. "Such as" is not used in a restrictive sense, but for explanatory purposes.

It is understood that throughout this specification the identifiers "first" and "second" are used solely to aid the reader in distinguishing the various components, features, or steps of the disclosed subject matter. The identifiers "first" and "second" are not intended to imply any particular order, amount, preference, or importance to the components or steps modified by these terms.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AB, BBC, AAABCCCC, CBBAAA, CABABB, and so forth. The skilled artisan will understand that typically there is no limit on the number of items or terms in any combination, unless otherwise apparent from the context.

References in the specification and concluding claims to parts by weight of a particular element or component in a composition denotes the weight relationship between the element or component and any other elements or components in the composition or article for which a part by weight is expressed. Thus, in a compound containing 2 parts by weight of component X and 5 parts by weight component Y, X and Y are present at a weight ratio of 2:5, and are present in such ratio regardless of whether additional components are contained in the compound.

A weight percent (wt. %) of a component, unless specifically stated to the contrary, is based on the total weight of the formulation or composition in which the component is included.

The term "(co)polymer" includes homopolymers, copolymers, or mixtures thereof.

The term "(meth)acryl . . . " includes "acryl . . . ," "methacryl . . . ," or mixtures thereof.

As used herein, "molecular weight" refers to number-average molecular weight as measured by $^1$H NMR spectroscopy, unless clearly indicated otherwise.

Disclosed herein are methods of contacting printing with a shape-memory stamp, the shape-memory stamp comprising a shape-memory polymer having a transition temperature (e.g., a melting temperature or glass transition temperature).

Shape-memory polymers (SMPs) form a class of materials that can store and release elastic energy upon applying an external stimulus, such as heat or light. A shape-memory material can be deformed to a temporary shape and can return to its original shape after the application of the external stimulus. For example, a material heated above its shape-memory transition temperature, $T_{SM}$, can be elastically deformed by subjecting it to external stresses and subsequently cooled, while under stress, beneath $T_{SM}$. In the cooled state, external stresses can be removed and the material can retain its deformed shape. Upon heating above $T_{SM}$, the material can recover its elastic strain energy and can return to its original shape.

The shape-memory polymer can comprise any suitable shape-memory polymer, such as those known in the art. In some examples, the shape-memory polymer comprises a semi-crystalline polymer, a glass forming network polymer (e.g., glassy network polymer), or a combination thereof.

In some examples, the shape-memory polymer comprises a semi-crystalline polymer. Examples of semi-crystalline polymers include, but are not limited to, polyethylene, polyethylene terephthalate, polytetrafluoroethylene, isotactic polypropylene, polyphenylene sulfide, polyetherketone, polyetheretherketone, polyphthalamide, polyetherketoneketone, thermoplastic polyimide, polybutylene terephthalate, polyoxymethylene, nylon, polyesters, polyethers (e.g., polyethylene glycol, polypropylene glycol, polytetramethylene glycol, polytetramethylene ether glycol, polyoxymethylene, polyethylene oxide, polypropylene oxide, polytetrahydrofuran, polyphenyl ether), poly(caprolactone), and copolymers thereof.

In some examples, the shape-memory polymer comprises a glass forming network polymer. Examples of glass forming network polymers include, but are not limited to, thiol-vinyl network polymers. For example, the glass forming network polymer can be derived from pentaerythritol tetrakis(3-mercaptopropionate) (PETMP) and 1,3,5-triallyl-1,3,5-triazine-2,4,6(1H,3H,5H)-trione (TTT).

In some examples, the shape-memory polymer comprises a polycaprolactone polymer, a urethane-acrylate polymer, a thiol-vinyl network polymer, or a combination thereof.

In some examples, the methods can further comprise (e.g., before step a)), making the shape-memory stamp. In some examples the methods can further comprise making the shape-memory polymer.

The shape-memory polymer can be made using chemical reactions such as cross-linking, substitution reactions, addition reactions, "click" chemical reactions, polymerization reactions, or any number of chemical reactions known in the art. For example, the methods can comprise polymerizing a polymerizable composition to form the shape-memory polymer. Examples of reactions include, but are not limited to, photocuring, two photon polymerization, free radical polymerization, cationic polymerization, anionic polymerization, coordination polymerization, ring-opening polymerization, chain-growth polymerization, chain transfer polymerization, emulsion polymerization, ionic polymerization, solution polymerization, step-growth polymerization, suspension polymerization, radical polymerization, condensation reactions, cycloaddition reactions, electrophilic additions, and nucleophilic additions (e.g., Michael additions).

In some examples, the methods can further comprise shaping or molding the shape-memory polymer to form the shape-memory stamp.

In some examples, the methods can comprise disposing the polymerizable composition in a mold that imparts a shape and polymerizing the polymerizable composition in the mold to form the shape-memory stamp comprising the shape-memory polymer.

In some examples, the methods can further comprise determining the transition temperature. In some examples, the transition temperature can be above room temperature. As used herein, room temperature means at a temperature of from 20° C. to 25° C.

The shape memory polymer can, for example, have a first Young's modulus at a temperature above the transition temperature and a second Young's modulus at a temperature below the transition temperature, the first Young's modulus being lower than the second Young's modulus (e.g., by a factor of 2 or more, 5 or more, or 10 or more).

In some examples, the first Young's modulus can be 50 mega pascals (MPa) or less (e.g., 45 MPa or less, 40 MPa or less, 35 MPa or less, 30 MPa or less, 25 MPa or less, 20 MPa or less, 15 MPa or less, 10 MPa or less, 5 MPa or less, 4 MPa or less, 3 MPa or less, 2 MPa or less, 1 MPa or less, 0.9 MPa or less, 0.8 MPa or less, 0.7 MPa or less, 0.6 MPa or less, 0.5 MPa or less, 0.4 MPa or less, 0.3 MPa or less, or 0.2 MPa or less). In some examples, the first Young's modulus can be 0.1 MPa or more (e.g., 0.2 MPa or more, 0.3 MPa or more, 0.4 MPa or more, 0.5 MPa or more, 0.6 MPa or more, 0.7 MPa or more, 0.8 MPa or more, 0.9 MPa or more, 1 MPa or more, 2 MPa or more, 3 MPa or more, 4 MPa or more, 5 MPa or more, 10 MPa or more, 15 MPa or more, 20 MPa or more, 25 MPa or more, 30 MPa or more, 35 MPa or more, 40 MPa or more, or 45 MPa or more). The first Young's modulus can range from any of the minimum values described above to any of the maximum values described above. For example, the first Young's modulus can be from 0.1 MPa to 50 MPa (e.g., from 0.1 MPa to 25 MPa, from 25 MPa to 50 MPa, from 0.1 MPa to 10 MPa, from 10 MPa to 20 MPa, from 20 MPa to 30 MPa, from 30 MPa to 40 MPa, from 40 MPa to 50 MPa, from 1 MPa to 50 MPa, from 0.1 MPa to 45 MPa, or from 1 MPa to 45 MPa).

For example, the shape memory polymer can have a Young's modulus at 70° C. of 50 MPa or less (e.g., 45 MPa or less, 40 MPa or less, 35 MPa or less, 30 MPa or less, 25 MPa or less, 20 MPa or less, 15 MPa or less, 10 MPa or less, 5 MPa or less, 4 MPa or less, 3 MPa or less, 2 MPa or less, 1 MPa or less, 0.9 MPa or less, 0.8 MPa or less, 0.7 MPa or less, 0.6 MPa or less, 0.5 MPa or less, 0.4 MPa or less, 0.3 MPa or less, or 0.2 MPa or less). In some examples, the shape memory polymer can have a Young's modulus at 70° C. of 0.1 MPa or more (e.g., 0.2 MPa or more, 0.3 MPa or more, 0.4 MPa or more, 0.5 MPa or more, 0.6 MPa or more, 0.7 MPa or more, 0.8 MPa or more, 0.9 MPa or more, 1 MPa or more, 2 MPa or more, 3 MPa or more, 4 MPa or more, 5 MPa or more, 10 MPa or more, 15 MPa or more, 20 MPa or more, 25 MPa or more, 30 MPa or more, 35 MPa or more, 40 MPa or more, or 45 MPa or more). The Young's modulus of the shape memory polymer 70° C. can range from any of the minimum values described above to any of the maximum values described above. For example, the shape memory polymer can have a Young's modulus at 70° C. of from 0.1 MPa to 50 MPa (e.g., from 0.1 MPa to 25 MPa, from 25 MPa to 50 MPa, from 0.1 MPa to 10 MPa, from 10 MPa to 20 MPa, from 20 MPa to 30 MPa, from 30 MPa to 40 MPa, from 40 MPa to 50 MPa, from 1 MPa to 50 MPa, from 0.1 MPa to 45 MPa, or from 1 MPa to 45 MPa).

In some examples, the second Young's modulus can be 100 MPa or more (e.g., 125 MPa or more, 150 MPa or more, 175 MPa or more, 200 MPa or more, 225 MPa or more, 250 MPa or more, 275 MPa or more, 300 MPa or more, 325 MPa or more, 350 MPa or more, 400 MPa or more, 450 MPa or more, 500 MPa or more, 600 MPa or more, 700 MPa or more, 800 MPa or more, 900 MPa or more, 1 GPa or more, 1.25 GPa or more, 1.5 GPa or more, or 1.75 GPa or more). In some examples, the second Young's modulus can be 2 giga pascals (GPa) or less (e.g., 1.75 GPa or less, 1.5 GPa or less, 1.25 GPa or less, 1 GPa or less, 900 MPa or less, 800 MPa or less, 700 MPa or less, 600 MPa or less, 500 MPa or less, 450 MPa or less, 400 MPa or less, 350 MPa or less, 325 MPa or less, 300 MPa or less, 275 MPa or less, 250 MPa or less, 225 MPa or less, 200 MPa or less, 175 MPa or less, 150 MPa or less, or 125 MPa or less). The second Young's modulus can range from any of the minimum values described above to any of the maximum values describes above. For example, the second Young's modulus can be from 100 MPa to 2 GPa (e.g., from 100 MPa to 500 MPa, from 500 MPa to 2 GPa, from 100 MPa to 250 MPa, from 250 MPa to 500 MPa, from 500 MPa to 750 MPa, from 750 MPa to 1 GPa, from 1 GPa to 2 GPa, from 125 MPa to 2 GPa, from 100 MPa to 1.75 GPa, or from 125 MPa to 1.75 GPa).

For example, the shape memory polymer can have a Young's modulus at 23° C. of 100 MPa or more (e.g., 125 MPa or more, 150 MPa or more, 175 MPa or more, 200 MPa or more, 225 MPa or more, 250 MPa or more, 275 MPa or more, 300 MPa or more, 325 MPa or more, 350 MPa or more, 400 MPa or more, 450 MPa or more, 500 MPa or more, 600 MPa or more, 700 MPa or more, 800 MPa or more, 900 MPa or more, 1 GPa or more, 1.25 GPa or more, 1.5 GPa or more, or 1.75 GPa or more). In some examples, the shape memory polymer can have a Young's modulus at 23° C. of 2 giga pascals (GPa) or less (e.g., 1.75 GPa or less, 1.5 GPa or less, 1.25 GPa or less, 1 GPa or less, 900 MPa or less, 800 MPa or less, 700 MPa or less, 600 MPa or less, 500 MPa or less, 450 MPa or less, 400 MPa or less, 350 MPa or less, 325 MPa or less, 300 MPa or less, 275 MPa or less, 250 MPa or less, 225 MPa or less, 200 MPa or less, 175 MPa or less, 150 MPa or less, or 125 MPa or less). The Young's modulus of the shape memory polymer at 23° C. can range from any of the minimum values described above to any of the maximum values describes above. For example, the shape memory polymer can have a Young's modulus at 23° C. of from 100 MPa to 2 GPa (e.g., from 100 MPa to 500 MPa, from 500 MPa to 2 GPa, from 100 MPa to 250 MPa, from 250 MPa to 500 MPa, from 500 MPa to 750 MPa, from 750 MPa to 1 GPa, from 1 GPa to 2 GPa, from 125 MPa to 2 GPa, from 100 MPa to 1.75 GPa, or from 125 MPa to 1.75 GPa).

The methods disclosed herein comprise, step a), heating the shape-memory stamp to a temperature above the transition temperature, for example, such that the shape-memory polymer and the shape-memory stamp are in a deformable state.

In some examples, the methods can comprise heating the shape-memory stamp to a temperature of 40° C. or more (e.g., 45° C. or more, 50° C. or more, 55° C. or more, 60° C. or more, 65° C. or more, 70° C. or more, 75° C. or more, 80° C. or more, 85° C. or more, 90° C. or more, 95° C. or more, 100° C. or more, 105° C. or more, 110° C. or more, 115° C. or more, 120° C. or more, 125° C. or more, 130° C. or more, 135° C. or more, 140° C. or more, or 145° C. or more). In some examples, the methods can comprise heating the shape-memory stamp to a temperature of 150° C. or less (e.g., 145° C. or less, 140° C. or less, 135° C. or less, 130° C. or less, 125° C. or less, 120° C. or less, 115° C. or less, 110° C. or less, 105° C. or less, 100° C. or less, 95° C. or less, 90° C. or less, 85° C. or less, 80° C. or less, 75° C. or less, 70° C. or less, 65° C. or less, 60° C. or less, 55° C. or less, 50° C. or less, or 45° C. or less). The temperature to which the shape-memory stamp is heated can range from any of the minimum values described above to any of the maximum values described above. For example, the methods can comprise heating the shape-memory stamp to a temperature of from 40° C. to 150° C. (e.g., from 40° C. to 95° C., from 95° C. to 150° C., from 40° C. to 60° C., from 60° C. to 80° C., from 80° C. to 100° C., from 100° C. to 120° C., from 120° C. to 150° C., from 45° C. to 150° C., from 40° C. to 145° C., from 45° C. to 145° C., from 40° C. to 100° C., from 40° C. to 90° C., or from 50° C. to 90° C.).

In some examples, the shape-memory stamp is heated for an amount of time of 1 second or more (e.g., 5 seconds or more, 10 seconds or more, 15 seconds or more, 20 seconds or more, 25 seconds or more, 30 seconds or more, 35 seconds or more, 40 seconds or more, 45 seconds or more, 50 seconds or more, 55 seconds or more, 1 minute or more, 1.5 minutes or more, 2 minutes or more, 2.5 minutes or more, 3 minutes or more, 3.5 minutes or more, 4 minutes or more, 4.5 minutes or more, 5 minutes or more, 6 minutes or more, 7 minutes or more, 8 minutes or more, 9 minutes or more, 10 minutes or more, 15 minutes or more, 20 minutes or more, 25 minutes or more, 30 minutes or more, 35 minutes or more, 40 minutes or more, 45 minutes or more, 50 minutes or more, 55 minutes or more, 1 hour or more, 1.25 hours or more, 1.5 hours or more, or 1.75 hours or more). In some examples, the shape-memory stamp is heated for an amount of time of 2 hours or less (e.g., 1.75 hours or less, 1.5 hours or less, 1.25 hours or less, 1 hour or less, 55 minutes or less, 50 minutes or less, 45 minutes or less, 40 minutes or less, 35 minutes or less, 30 minutes or less, 25 minutes or less, 20 minutes or less, 15 minutes or less, 10 minutes or less, 9 minutes or less, 8 minutes or less, 7 minutes or less, 6 minutes or less, 5 minutes or less, 4.5 minutes or less, 4 minutes or less, 3.5 minutes or less, 3 minutes or less, 2.5 minutes or less, 2 minutes or less, 1.5 minutes or less, 1 minute or less, 55 seconds or less, 50 seconds or less, 45 seconds or less, 40 seconds or less, 35 seconds or less, 30 seconds or less, 25 seconds or less, 20 seconds or less, 15 seconds or less, 10 seconds or less, or 5 seconds or less). The amount of time for which the shape-memory stamp is heated can range from any of the minimum values described above to any of the maximum values described above. For example, the shape-memory stamp can be heated for an amount of time of from 1 second to 2 hours (e.g., from 1 second to 30 minutes, from 30 minutes to 2 hours, from 1 second to 1 minute, from 1 minute to 10 minutes, from 10 minutes to 1 hour, from 1 hour to 2 hours, from 5 seconds to 2 hours, from 1 second to 1.75 hours, from 1 second to 1 hour, from 1 second to 30 minutes, or from 1 second to 10 minutes).

The methods further comprise, step b), contacting the shape-memory stamp with a donor substrate while the shape-memory stamp above the transition temperature (e.g., while the shape-memory stamp is in the deformable state). The donor substrate can comprise any suitable material. Examples of suitable donor substrates include, but are not limited to, polymers, glass, quartz, silicon, metals, ceramics, nitrides (e.g. silicon nitride), oxides (e.g. silicon dioxide, indium tin oxide (ITO)), porous materials, and combinations thereof.

The donor substrate has a thin film disposed on a surface thereof and contacting the shape-memory stamp with the donor substrate while the shape-memory stamp is above the transition temperature (e.g. while the shape memory stamp is in the deformable state) in step b) can, for example, comprise contacting a surface of the shape-memory stamp with the thin film.

The thin film can, for example, have an average thickness of 1 nanometer (nm) or more (e.g., 2 nm or more, 3 nm or more, 4 nm or more, 5 nm or more, 6 nm or more, 7 nm or more, 8 nm or more, 9 nm or more, 10 nm or more, 15 nm or more, 20 nm or more, 25 nm or more, 30 nm or more, 35 nm or more, 40 nm or more, 45 nm or more, 50 nm or more, 60 nm or more, 70 nm or more, 80 nm or more, 90 nm or more, 100 nm or more, 125 nm or more, 150 nm or more, 175 nm or more, 200 nm or more, 225 nm or more, 250 nm or more, 300 nm or more, 350 nm or more, 400 nm or more, 450 nm or more, 500 nm or more, 600 nm or more, 700 nm or more, 800 nm or more, 900 nm or more, 1 micrometer (μm) or more, 1.5 μm or more, 2 μm or more, 2.5 μm or more, 3 μm or more, 3.5 μm or more, 4 μm or more, 4.5 μm or more, 5 μm or more, 6 μm or more, 7 μm or more, 8 μm or more, 9 μm or more, 10 μm or more, 15 μm or more, 20 μm or more, 25 μm or more, 30 μm or more, 35 μm or more, 40 μm or more, or 45 μm or more). In some examples, the thin film can have an average thickness of 50 μm or less (e.g., 45 μm or less, 40 μm or less, 35 μm or less, 30 μm or less, 25 μm or less, 20 μm or less, 15 μm or less, 10 μm or less, 9 μm or less, 8 μm or less, 7 μm or less, 6 μm or less, 5 μm or less, 4.5 μm or less, 4 μm or less, 3.5 μm or less, 3 μm or less, 2.5 μm or less, 2 μm or less, 1.5 μm or less, 1 μm or less, 900 nm or less, 800 nm or less, 700 nm or less, 600 nm or less, 500 nm or less, 450 nm or less, 400 nm or less, 350 nm or less, 300 nm or less, 250 nm or less, 225 nm or less, 200 nm or less, 175 nm or less, 150 nm or less, 125 nm or less, 100 nm or less, 90 nm or less, 80 nm or less, 70 nm or less, 60 nm or less, 50 nm or less, 45 nm or less, 40 nm or less, 35 nm or less, 30 nm or less, 25 nm or less, 20 nm or less, 15 nm or less, 10 nm or less, 9 nm or less, 8 nm or less, 7 nm or less, 6 nm or less, or 5 nm or less). The average thickness of the thin film can range from any of the minimum values described above to any of the maximum values described above. For example, the thin film can have an average thickness of from 1 nanometer (nm) to 50 micrometers (μm, microns) (e.g., from 1 nm to 500 nm, from 500 nm to 50 μm, from 1 nm to 10 nm, from 10 nm to 100 nm, from 100 nm to 1 μm, from 1 μm to 10 μm, from 10 μm to 50 μm, from 5 nm to 50 μm, from 1 nm to 45 μm, from 5 nm to 45 μm, from 1 nm to 10 μm, or from 1 nm to 200 nm). Average thickness can be measured using methods known in the art, such as evaluation by optical microscopy, electron microscopy, atomic force microscopy, profilometry, or white light scanning interferometry.

The thin film can comprise any suitable material. Examples of suitable materials include, but are not limited to, organic materials, inorganic materials, biological materials, self-assembled monolayers, colloidal materials, polymeric materials, etc.

In some examples, the thin film can comprise an organic material and/or an inorganic material. In some examples, the thin film can comprise an organic semiconductor, an inorganic light-emitting material, or a combination thereof. In some examples, the thin film can comprise tris(4-carbazoyl-9-yl-phenyl)amine (TCTA), bis(3,5-difluoro-2-(pyridin-2-yephenyl)(picolinoyloxy)iridium (FIrpic), aluminum (Al), or combination thereof.

In some examples, the thin film can comprise a plurality of layers, wherein the composition and/or the thickness of each layer can vary. For example, the thin film can comprise a plurality of layers and the composition of a given layer differs from the other layer(s) contacting said given layer.

In some examples, the thin film can comprise a first layer and a second layer, where the composition of the first layer is different than the composition of the second layer. In some examples, the thin film can comprise a first layer and a second layer, wherein the first layer comprises Tris(4-carbazoyl-9-yl-phenyl)amine (TCTA) and bis(3,5-difluoro-2-(pyridin-2-yl)phenyl)(picolinoyloxy)iridium (FIrpic) and the second layer comprises aluminum (Al).

In some examples, the thin film is a continuous film. In some examples, the thin film comprises a plurality of sections. For example, the thin film can comprise a plurality of sections in an ordered array (e.g., pattern), such that the thin film is in said ordered array (e.g., pattern).

The surface of the shape-memory stamp contacted with the thin film can, for example, be substantially planar (e.g., flat).

In some examples, the surface of the shape-memory stamp contacted with the thin film can have an average surface area of 100 square nanometers ($nm^2$) or more (e.g., 500 $nm^2$ or more, $1 \times 10^3$ $nm^2$ or more, $5 \times 10^3$ $nm^2$ or more, $1 \times 10^4$ $nm^2$ or more, $5 \times 10^4$ $nm^2$ or more, $1 \times 10^5$ $nm^2$ or more, $5 \times 10^5$ $nm^2$ or more, 1 square micrometer ($\mu m^2$) or more, 5 $\mu m^2$ or more, 10 $\mu m^2$ or more, 50 $\mu m^2$ or more, 100 $\mu m^2$ or more, 500 $\mu m^2$ or more, $1 \times 10^3$ $\mu m^2$ or more, $5 \times 10^3$ $\mu m^2$ or more, $1 \times 10^4$ $\mu m^2$ or more, $5 \times 10^4$ $\mu m^2$ or more, $1 \times 10^5$ $\mu m^2$ or more, $5 \times 10^5$ $\mu m^2$ or more, 1 square millimeter ($mm^2$) or more, 5 $mm^2$ or more, 10 $mm^2$ or more, or 50 $mm^2$ or more). In some examples, the surface of the shape-memory stamp contacted with the thin film can have an average surface area of 100 square millimeters ($mm^2$) or less (e.g., 50 $mm^2$ or less, 10 $mm^2$ or less, 5 $mm^2$ or less, 1 $mm^2$ or less, $5 \times 10^5$ square micrometer ($\mu m^2$) or less, $1 \times 10^5$ $\mu m^2$ or less, $5 \times 10^4$ $\mu m^2$ or less, $1 \times 10^4$ $\mu m^2$ or less, $5 \times 10^3$ $\mu m^2$ or less, $1 \times 10^3$ $\mu m^2$ or less, 500 $\mu m^2$ or less, 100 $\mu m^2$ or less, 50 $\mu m^2$ or less, 10 $\mu m^2$ or less, 5 $\mu m^2$ or less, 1 $\mu m^2$ or less, $5 \times 10^5$ square nanometers ($nm^2$) or less, $1 \times 10^5$ $nm^2$ or less, $5 \times 10^4$ $nm^2$ or less, $1 \times 10^4$ $nm^2$ or less, $5 \times 10^3$ $nm^2$ or less, $1 \times 10^3$ $nm^2$ or less, or 500 $nm^2$ or less). The average surface area of the surface of the shape-memory stamp contacted with the thin film can range from any of the minimum values described above to any of the maximum values described above. For example, the surface of the shape-memory stamp contacted with the thin film can have an average surface area of from 100 $nm^2$ to 100 $mm^2$ (e.g., from 100 $nm^2$ to 100 $\mu m^2$, from 100 $\mu m^2$ to 100 $mm^2$, from 100 $nm^2$ to $1 \times 10^5$ $nm^2$, from $1 \times 10^5$ $nm^2$ to 100 $\mu m^2$, from 100 $\mu m^2$ to $1 \times 10^5$ $\mu m^2$, from $1 \times 10^5$ $\mu m^2$ to 100 $mm^2$, from 500 $nm^2$ to 100 $mm^2$, from 100 $nm^2$ to 50 $mm^2$, or from 500 $nm^2$ to 50 $mm^2$).

In some examples, the shape memory polymer stamp has a set of features extending from a bottom surface. As used herein "a set of features" and "the set of features" are meant to include any number of features in any arrangement. Thus, for example, "a set of features" includes one or more features (e.g., 2 or more; 3 or more; 4 or more; 5 or more; 10 or more; 15 or more; 20 or more; 25 or more; 30 or more; 40 or more; 50 or more; 75 or more; 100 or more; 150 or more; 200 or more; 250 or more; 300 or more; 400 or more; 500 or more; 750 or more; 1000 or more; 1500 or more; 2000 or more; 2500 or more; 3000 or more; 4000 or more; 5000 or more; 7500 or more; $1 \times 10^4$ or more; $2.5 \times 10^4$ or more; $5 \times 10^4$ or more; $7.5 \times 10^4$ or more; $1 \times 10^5$ or more; $2.5 \times 10^5$ or more; $5 \times 10^5$ or more; $7.5 \times 10^5$ or more; $1 \times 10^6$ or more; $5 \times 10^6$ or more; $1 \times 10^7$ or more; $5 \times 10^7$ or more; $1 \times 10^8$ or more; $5 \times 10^8$ or more; $1 \times 10^9$ or more; $5 \times 10^9$ or more; or $1 \times 10^{10}$ or more). In some examples, the set of features can comprise a plurality of features. In some examples, the set of features comprises a plurality of features in an ordered array.

The set of features extending from the bottom surface can, independently, be any shape. For example, the set of features can, independently, be a polyhedron (e.g., a platonic solid, a prism, a pyramid), a cylinder, a hemicylinder, an elliptical cylinder, a hemi-elliptical cylinder, a sphere, a hemisphere, a cone, a semicone, etc.

In some examples, each of the features can extend from a bottom surface along a central axis to a terminal surface, the terminal surface being opposite and axially spaced apart from the bottom surface. In certain examples, contacting a surface of the shape-memory stamp with the thin film comprises contacting the terminal surface with the thin film. The terminal surface of the features can, independently, be substantially planar (e.g., flat) or non-planar (e.g., pyramidal, hemispherical, conical, etc.).

In some examples, the central axis of each of the features is substantially parallel to each other. In some examples, the bottom surface of the shape-memory stamp is substantially planar and the central axis of each of the features is substantially perpendicular to the bottom surface. In some examples, the bottom surface of the shape-memory stamp is substantially planar, the terminal surface is substantially planar, and the central axis of each of the features is substantially perpendicular to the bottom surface, such that the terminal surface is substantially parallel to the terminal surface.

The features can have an average height, the average height being the average dimension of the central axis of the features (e.g., the average distance from the bottom surface to the terminal surface). In some examples, the features can have an average height of 10 nanometers (nm) or more (e.g., 15 nm or more, 20 nm or more, 25 nm or more, 30 nm or more, 35 nm or more, 40 nm or more, 45 nm or more, 50 nm or more, 60 nm or more, 70 nm or more, 80 nm or more, 90 nm or more, 100 nm or more, 125 nm or more, 150 nm or more, 175 nm or more, 200 nm or more, 225 nm or more, 250 nm or more, 300 nm or more, 350 nm or more, 400 nm or more, 450 nm or more, 500 nm or more, 600 nm or more, 700 nm or more, 800 nm or more, 900 nm or more, 1 micrometer ($\mu m$) or more, 1.5 $\mu m$ or more, 2 $\mu m$ or more, 2.5 $\mu m$ or more, 3 $\mu m$ or more, 3.5 $\mu m$ or more, 4 $\mu m$ or more, 4.5 $\mu m$ or more, 5 $\mu m$ or more, 6 $\mu m$ or more, 7 $\mu m$ or more, 8 $\mu m$ or more, 9 $\mu m$ or more, 10 $\mu m$ or more, 15 $\mu m$ or more, 20 $\mu m$ or more, 25 $\mu m$ or more, 30 $\mu m$ or more, 35 $\mu m$ or more, 40 $\mu m$ or more, 45 $\mu m$ or more, 50 $\mu m$ or more, 60 $\mu m$ or more, 70 $\mu m$ or more, 80 $\mu m$ or more, or 90 $\mu m$ or more). In some examples, the features can have an average height of 100 µm or less (e.g., 90 µm or less, 80 µm or less, 70 µm or less, 60 µm or less, 50 µm or less, 45 µm or less, 40 µm or less, 35 µm or less, 30 µm or less, 25 µm or less, 20 µm or less, 15 µm or less, 10 µm or less, 9 µm or less, 8 µm or less, 7 µm or less, 6 µm or less, 5 µm or less, 4.5 µm or less, 4 µm or less, 3.5 µm or less, 3 µm or less, 2.5 µm or less, 2 µm or less, 1.5 µm or less, 1 µm or less, 900 nm or less, 800 nm or less, 700 nm or less, 600 nm or less, 500 nm or less, 450 nm or less, 400 nm or less, 350 nm or less, 300 nm or less, 250 nm or less, 225 nm or less, 200 nm or less, 175 nm or less, 150 nm or less, 125 nm or less, 100 nm or less, 90 nm or less, 80 nm or less, 70 nm or less, 60 nm or less, 50 nm or less, 45 nm or less, 40 nm or less, 35 nm or less, 30 nm or less, 25 nm or less, 20 nm or less, or 15 nm or less). The average height of the features can range from any of the minimum values described above to any of the maximum values described above. For example, the features can have an average height of from 10 nanometers (nm) to 100 micrometers (microns, µm) (e.g., from 10 nm to 1 µm, from 1 µm to 100 µm, from 10 nm to 100 nm, from 100 nm to 1 µm, from 1 µm to 10 µm, from 10 µm to 100 µm, from 15 nm to 100 µm, from 10 nm to 90 µm, or from 15 nm to 90 µm). Average height can be measured using methods known in the art, such as evaluation by optical microscopy, electron microscopy, atomic force microscopy, profilometry, or white light scanning interferometry.

In some examples, the set of features can comprise a plurality of features wherein the average height of the plurality of features can be substantially monodisperse. "Monodisperse" and "homogeneous height distribution," as used herein, and generally describe a population of features where all of the features have the same or nearly the same average height. As used herein, a monodisperse distribution refers to distributions in which 80% of the distribution (e.g., 85% of the distribution, 90% of the distribution, or 95% of the distribution) lies within 25% of the average height (e.g., within 20% of the average height, within 15% of the average height, within 10% of the average height, or within 5% of the average height).

Each of the features can have a cross-sectional shape in a plane perpendicular to the central axis, wherein the cross-sectional shape can be any shape, such as a regular shape, an irregular shape, an isotropic shape, or an anisotropic shape. In some examples, the cross-sectional shape of each of the set of features can be substantially circular, ovate, ovoid, elliptic, triangular, rectangular, polygonal, etc. In some examples, the cross-sectional shape of each of the set of features is substantially the same. In some examples, the cross-sectional shape of the features can vary along the axis.

The set of features can have an average characteristic dimension. The term "characteristic dimension," as used herein refers to the largest straight line distance between two points in the plane of the cross-sectional shape of each of the features. "Average characteristic dimension" and "mean characteristic dimension" are used interchangeably herein, and generally refer to the statistical mean characteristic dimension of the feature in a population of features. For example, for a cylindrical set of features, the cross-sectional shape can be substantially circular and the average characteristic dimension can refer to the average diameter.

In some examples, the average characteristic dimension of the set of features can be 1 nanometer (nm) or more (e.g., 2 nm or more, 3 nm or more, 4 nm or more, 5 nm or more, 6 nm or more, 7 nm or more, 8 nm or more, 9 nm or more, 10 nm or more, 15 nm or more, 20 nm or more, 25 nm or more, 30 nm or more, 35 nm or more, 40 nm or more, 45 nm or more, 50 nm or more, 60 nm or more, 70 nm or more, 80 nm or more, 90 nm or more, 100 nm or more, 125 nm or more, 150 nm or more, 175 nm or more, 200 nm or more, 225 nm or more, 250 nm or more, 300 nm or more, 350 nm or more, 400 nm or more, 450 nm or more, 500 nm or more, 600 nm or more, 700 nm or more, 800 nm or more, 900 nm or more, 1 micrometer (µm) or more, 1.5 µm or more, 2 µm or more, 2.5 µm or more, 3 µm or more, 3.5 µm or more, 4 µm or more, 4.5 µm or more, 5 µm or more, 6 µm or more, 7 µm or more, 8 µm or more, 9 µm or more, 10 µm or more, 15 µm or more, 20 µm or more, 25 µm or more, 30 µm or more, 35 µm or more, 40 µm or more, 45 µm or more, 50 µm or more, 60 µm or more, 70 µm or more, 80 µm or more, or 90 µm or more). In some examples, the average characteristic dimension of the set of features can be 100 µm or less (e.g., 90 µm or less, 80 µm or less, 70 µm or less, 60 µm or less, 50 µm or less, 45 µm or less, 40 µm or less, 35 µm or less, 30 µm or less, 25 µm or less, 20 µm or less, 15 µm or less, 10 µm or less, 9 µm or less, 8 µm or less, 7 µm or less, 6 µm or less, 5 µm or less, 4.5 µm or less, 4 µm or less, 3.5 µm or less, 3 µm or less, 2.5 µm or less, 2 µm or less, 1.5 µm or less, 1 µm or less, 900 nm or less, 800 nm or less, 700 nm or less, 600 nm or less, 500 nm or less, 450 nm or less, 400 nm or less, 350 nm or less, 300 nm or less, 250 nm or less, 225 nm or less, 200 nm or less, 175 nm or less, 150 nm or less, 125 nm or less, 100 nm or less, 90 nm or less, 80 nm or less, 70 nm or less, 60 nm or less, 50 nm or less, 45 nm or less, 40 nm or less, 35 nm or less, 30 nm or less, 25 nm or less, 20 nm or less, 15 nm or less, 10 nm or less, or 5 nm or less). The average characteristic dimension of the set of features can range from any of the minimum values described above to any of the maximum values described above. For example, the set of features can have an average characteristic dimension of from 1 nanometer (nm) to 100 micrometers (microns, µm) (e.g., from 1 nm to 1 µm, from 1 µm to 100 µm, from 1 nm to 10 nm, from 10 nm to 100 nm, from 100 nm to 1 µm, from 1 µm to 10 µm, from 10 µm to 100 µm, from 5 nm to 100 µm, from 1 nm to 90 µm, or from 5 nm to 90 µm). Average characteristic dimension can be measured using methods known in the art, such as evaluation by optical microscopy, electron microscopy, atomic force microscopy, profilometry, or white light scanning interferometry.

In some examples, the set of features can comprise a plurality of features wherein the average characteristic dimension of the plurality of features can be substantially monodisperse. "Monodisperse" and "homogeneous characteristic dimension distribution," as used herein, and generally describe a population of features where all of the features have the same or nearly the same average characteristic dimension. As used herein, a monodisperse distribution refers to distributions in which 80% of the distribution (e.g., 85% of the distribution, 90% of the distribution, or 95% of the distribution) lies within 25% of the average characteristic dimension (e.g., within 20% of the average characteristic dimension, within 15% of the average characteristic dimension, within 10% of the average characteristic dimension, or within 5% of the average characteristic dimension).

In some examples, the average characteristic dimension of the set of features is within 20% of the average size of the printed element (e.g., within 15%, within 10%, within 5%, or within 1%). In some examples, the average characteristic dimension of the set of features is substantially the same as the average size of the printed element.

In certain examples, where the thin film comprises a plurality of sections in an ordered array (e.g., pattern) and the shape-memory stamp comprises a set of features, the methods can further comprise aligning the set of features with the plurality of sections (e.g. pattern) of the thin film (e.g., prior to contacting the shape-memory stamp with the donor substrate).

In some examples, the donor substrate has first surface and a set of protrusions extending from the first surface. As used herein "a set of protrusions" and "the set of protrusions" are meant to include any number of protrusions in any arrangement. Thus, for example, "a set of protrusions" includes one or more protrusions (e.g., 2 or more; 3 or more; 4 or more; 5 or more; 10 or more; 15 or more; 20 or more; 25 or more; 30 or more; 40 or more; 50 or more; 75 or more; 100 or more; 150 or more; 200 or more; 250 or more; 300 or more; 400 or more; 500 or more; 750 or more; 1000 or more; 1500 or more; 2000 or more; 2500 or more; 3000 or more; 4000 or more; 5000 or more; 7500 or more; $1\times10^4$ or more; $2.5\times10^4$ or more; $5\times10^4$ or more; $7.5\times10^4$ or more; $1\times10^5$ or more; $2.5\times10^5$ or more; $5\times10^5$ or more; $7.5\times10^5$ or more; $1\times10^6$ or more; $5\times10^6$ or more; $1\times10^7$ or more; $5\times10^7$ or more; $1\times10^8$ or more; $5\times10^8$ or more; $1\times10^9$ or more; $5\times10^9$ or more; or $1\times10^{10}$ or more). In some examples, the set of protrusions can comprise a plurality of protrusions. In some examples, the set of protrusions comprises a plurality of protrusions in an ordered array.

The set of protrusions extending from the first surface can, independently, be any shape. For example, the set of protrusions can, independently, a polyhedron (e.g., a platonic solid, a prism, a pyramid), a cylinder, a hemicylinder, an elliptical cylinder, a hemi-elliptical cylinder, a cone, a semicone, etc.

In some examples, each of the protrusions can extend from the first surface along a axis to a second surface, the second surface being opposite and axially spaced apart from the first surface, the second surface being planar, and the thin film being disposed on (at least) the second surface. In some examples, the set of protrusions comprises a plurality of protrusions in an ordered array (e.g. pattern), such that the thin film is in said ordered array (e.g., pattern).

In some examples, the axis of each of the protrusions are substantially parallel to each other. In some examples, the first surface of the donor substrate is substantially planar. In some examples, the first surface of the donor substrate is substantially planar and the axis of each of the protrusions are substantially perpendicular to the first surface. In some examples, the first surface of the donor substrate is substantially planar, the second surface is substantially planar, and the axis of each of the protrusions are substantially perpendicular to the first surface, such that the second surface is substantially parallel of the first surface.

The set of protrusions can have an average height, the average height being the average dimension of the axis of the set of protrusions (e.g. the average distance from the first surface to the second surface). In some examples, the set of protrusions can have an average height of 10 nanometers (nm) or more (e.g., 15 nm or more, 20 nm or more, 25 nm or more, 30 nm or more, 35 nm or more, 40 nm or more, 45 nm or more, 50 nm or more, 60 nm or more, 70 nm or more, 80 nm or more, 90 nm or more, 100 nm or more, 125 nm or more, 150 nm or more, 175 nm or more, 200 nm or more, 225 nm or more, 250 nm or more, 300 nm or more, 350 nm or more, 400 nm or more, 450 nm or more, 500 nm or more, 600 nm or more, 700 nm or more, 800 nm or more, 900 nm or more, 1 micrometer (μm) or more, 1.5 μm or more, 2 μm or more, 2.5 μm or more, 3 μm or more, 3.5 μm or more, 4 μm or more, 4.5 μm or more, 5 μm or more, 6 μm or more, 7 μm or more, 8 μm or more, 9 μm or more, 10 μm or more, 15 μm or more, 20 μm or more, 25 μm or more, 30 μm or more, 35 μm or more, 40 μm or more, 45 μm or more, 50 μm or more, 60 μm or more, 70 μm or more, 80 μm or more, or 90 μm or more). In some examples, the set of protrusions can have an average height of 100 μm or less (e.g., 90 μm or less, 80 μm or less, 70 μm or less, 60 μm or less, 50 μm or less, 45 μm or less, 40 μm or less, 35 μm or less, 30 μm or less, 25 μm or less, 20 μm or less, 15 μm or less, 10 μm or less, 9 μm or less, 8 μm or less, 7 μm or less, 6 μm or less, 5 μm or less, 4.5 μm or less, 4 μm or less, 3.5 μm or less, 3 μm or less, 2.5 μm or less, 2 μm or less, 1.5 μm or less, 1 μm or less, 900 nm or less, 800 nm or less, 700 nm or less, 600 nm or less, 500 nm or less, 450 nm or less, 400 nm or less, 350 nm or less, 300 nm or less, 250 nm or less, 225 nm or less, 200 nm or less, 175 nm or less, 150 nm or less, 125 nm or less, 100 nm or less, 90 nm or less, 80 nm or less, 70 nm or less, 60 nm or less, 50 nm or less, 45 nm or less, 40 nm or less, 35 nm or less, 30 nm or less, 25 nm or less, 20 nm or less, or 15 nm or less). The average height of the set of protrusions can range from any of the minimum values described above to any of the maximum values described above. For example, the set of protrusions can have an average height of from 10 nanometers (nm) to 100 micrometers (microns, μm) (e.g., from 10 nm to 1 μm, from 1 μm to 100 μm, from 10 nm to 100 nm, from 100 nm to 1 μm, from 1 μm to 10 μm, from 10 μm to 100 μm, from 15 nm to 100 μm, from 10 nm to 90 μm, or from 15 nm to 90 μm). Average height can be measured using methods known in the art, such as evaluation by optical microscopy, electron microscopy, atomic force microscopy, profilometry, or white light scanning interferometry.

In some examples, the set of protrusions can comprise a plurality of protrusions wherein the average height of the plurality of protrusions can be substantially monodisperse. "Monodisperse" and "homogeneous height distribution," as used herein, and generally describe a population of protrusions where all of the protrusions have the same or nearly the same average height. As used herein, a monodisperse distribution refers to distributions in which 80% of the distribution (e.g., 85% of the distribution, 90% of the distribution, or 95% of the distribution) lies within 25% of the average height (e.g., within 20% of the average height, within 15% of the average height, within 10% of the average height, or within 5% of the average height).

Each of the protrusions can have a cross-sectional shape in a plane perpendicular to the axis, wherein the cross-sectional shape can be any shape, such as a regular shape, an irregular shape, an isotropic shape, or an anisotropic shape. In some examples, the cross-sectional shape of each of the set of protrusions can be substantially circular, ovate, ovoid, elliptic, triangular, rectangular, polygonal, etc. In some examples, the cross-sectional shape of each of the set of protrusions is substantially the same. In some examples, the cross-sectional shape of the protrusions can vary along the axis.

The set of protrusions can have an average characteristic dimension. The term "characteristic dimension," as used herein refers to the largest straight line distance between two points in the plane of the cross-sectional shape of each of the protrusions. "Average characteristic dimension" and "mean characteristic dimension" are used interchangeably herein, and generally refer to the statistical mean characteristic dimension of the protrusions in a population of protrusions. For example, for a cylindrical set of protrusions, the cross-sectional shape can be substantially circular and the average characteristic dimension can refer to the average diameter.

In some examples, the average characteristic dimension of the set of protrusions in the plane of the second surface can be 10 nanometers (nm) or more (e.g., 15 nm or more, 20 nm or more, 25 nm or more, 30 nm or more, 35 nm or more, 40 nm or more, 45 nm or more, 50 nm or more, 60 nm or more, 70 nm or more, 80 nm or more, 90 nm or more, 100 nm or more, 125 nm or more, 150 nm or more, 175 nm or more, 200 nm or more, 225 nm or more, 250 nm or more, 300 nm or more, 350 nm or more, 400 nm or more, 450 nm or more, 500 nm or more, 600 nm or more, 700 nm or more, 800 nm or more, 900 nm or more, 1 micrometer (μm) or more, 1.5 μm or more, 2 μm or more, 2.5 μm or more, 3 μm or more, 3.5 μm or more, 4 μm or more, 4.5 μm or more, 5 μm or more, 6 μm or more, 7 μm or more, 8 μm or more, 9 μm or more, 10 μm or more, 15 μm or more, 20 μm or more, 25 μm or more, 30 μm or more, 35 μm or more, 40 μm or more, 45 μm or more, 50 μm or more, 60 μm or more, 70 μm or more, 80 μm or more, or 90 μm or more). In some examples, the average characteristic dimension of the set of protrusions in the plane of the second surface can be 100 μm or less (e.g., 90 μm or less, 80 μm or less, 70 μm or less, 60 μm or less, 50 μm or less, 45 μm or less, 40 μm or less, 35 μm or less, 30 μm or less, 25 μm or less, 20 μm or less, 15 μm or less, 10 μm or less, 9 μm or less, 8 μm or less, 7 μm or less, 6 μm or less, 5 μm or less, 4.5 μm or less, 4 μm or less, 3.5 μm or less, 3 μm or less, 2.5 μm or less, 2 μm or less, 1.5 μm or less, 1 μm or less, 900 nm or less, 800 nm or less, 700 nm or less, 600 nm or less, 500 nm or less, 450 nm or less, 400 nm or less, 350 nm or less, 300 nm or less, 250 nm or less, 225 nm or less, 200 nm or less, 175 nm or less, 150 nm or less, 125 nm or less, 100 nm or less, 90 nm or less, 80 nm or less, 70 nm or less, 60 nm or less, 50 nm or less, 45 nm or less, 40 nm or less, 35 nm or less, 30 nm or less, 25 nm or less, 20 nm or less, or 15 nm or less). The average characteristic dimension of the set of protrusions can range from any of the minimum values described above to any of the maximum values described above. For example, the average characteristic dimension of the set of protrusions in the plane of the second surface can be from 10 nanometers (nm) to 100 micrometers (microns, μm) (e.g., from 10 nm to 1 μm, from 1 μm to 100 μm, from 10 nm to 100 nm, from 100 nm to 1 μm, from 1 μm to 10 μm, from 10 μm to 100 μm, from 15 nm to 100 μm, from 10 nm to 90 μm, or from 15 nm to 90 μm). Average characteristic dimension can be measured using methods known in the art, such as evaluation by optical microscopy, electron microscopy, atomic force microscopy, profilometry, or white light scanning interferometry.

In some examples, the set of protrusions can comprise a plurality of protrusions wherein the average characteristic dimension of the plurality of protrusions in the plane of the second surface can be substantially monodisperse. "Monodisperse" and "homogeneous characteristic dimension distribution," as used herein, and generally describe a population of protrusions where all of the protrusions have the same or nearly the same average characteristic dimension. As used herein, a monodisperse distribution refers to distributions in which 80% of the distribution (e.g., 85% of the distribution, 90% of the distribution, or 95% of the distribution) lies within 25% of the average characteristic dimension (e.g., within 20% of the average characteristic dimension, within 15% of the average characteristic dimension, within 10% of the average characteristic dimension, or within 5% of the average characteristic dimension).

In some examples, each of the protrusions can have a first section and a second section, the first section extending from the first surface along a first portion of the axis, the second section adjoining the first section and extending along a second portion of the axis to the second surface, wherein the first section has a first average characteristic dimension where the first section adjoins the second section, wherein the second section has a second average characteristic dimension where the first section adjoins the second section, wherein the first average characteristic dimension is smaller than the second average characteristic dimension.

In some examples, the second average characteristic dimension is substantially the same as the average characteristic dimension in the plane of the second surface.

In some examples, the average characteristic dimension of the first section can vary along the axis (e.g., tapered or stepped).

In some examples, the cross-sectional shape of the protrusions in the first section is the same as the cross-sectional shape in the second section. In some examples, the cross-sectional shape of the protrusions in the first section is different than the cross-sectional shape in the second section.

In certain examples, where the donor substrate comprises a set of protrusions and the shape-memory stamp comprises a set of features, the methods can further comprise aligning the set of features with the set of protrusions (e.g., prior to contacting the shape-memory stamp with the donor substrate).

In some examples, the methods can further comprise, before step a) or step b), making the donor substrate. For example, the methods can further comprise making the set of protrusions on a substrate, for example, via chemical vapor deposition (CVD), atomic layer deposition (ALD), physical vapor deposition (PVD), sputtering, pulsed layer deposition, molecular beam epitaxy, evaporation, lithographic patterning, etching, micromachining, reactive ion etching (RIE), direct laser ablation, or a combination thereof. In some examples, the set of protrusions can be integrally formed with the substrate.

In some examples, the methods can further comprise disposing the thin film on the second surface. The thin film can be deposited using techniques, such as, for example, electroplating, lithographic deposition, electron beam deposition, thermal deposition, spin coating, drop-casting, zone casting, dip coating, blade coating, spraying, vacuum filtration, chemical vapor deposition (CVD), atomic layer deposition (ALD), physical vapor deposition (PVD), sputtering, pulsed layer deposition, molecular beam epitaxy, evaporation, or combinations thereof.

In some examples, the methods can further comprise functionalizing or modifying the donor substrate and/or the second surface before disposing the thin film thereon, e.g. to modify the surface energy or modify the interfacial adhesion between the donor substrate and/or the second surface and the thin film.

In some examples, the methods can further comprise, after step b) and before step c), compressing the shape-memory stamp against the donor substrate.

In some examples, the shape-memory stamp can be compressed for an amount of time of 1 second or more (e.g., 5 seconds or more, 10 seconds or more, 15 seconds or more, 20 seconds or more, 25 seconds or more, 30 seconds or more, 35 seconds or more, 40 seconds or more, 45 seconds or more, 50 seconds or more, 55 seconds or more, 1 minute or more, 1.5 minutes or more, 2 minutes or more, 2.5 minutes or more, 3 minutes or more, 3.5 minutes or more, 4 minutes or more, 4.5 minutes or more, 5 minutes or more, 6 minutes or more, 7 minutes or more, 8 minutes or more, 9 minutes or more, 10 minutes or more, 15 minutes or more, 20 minutes or more, or 25 minutes or more). In some examples, In some examples, the shape-memory stamp can be compressed for an amount of time of 30 minutes less (e.g., 25 minutes or less, 20 minutes or less, 15 minutes or less, 10 minutes or less, 9 minutes or less, 8 minutes or less, 7 minutes or less, 6 minutes or less, 5 minutes or less, 4.5 minutes or less, 4 minutes or less, 3.5 minutes or less, 3 minutes or less, 2.5 minutes or less, 2 minutes or less, 1.5 minutes or less, 1 minute or less, 55 seconds or less, 50 seconds or less, 45 seconds or less, 40 seconds or less, 35 seconds or less, 30 seconds or less, 25 seconds or less, 20 seconds or less, 15 seconds or less, 10 seconds or less, or 5 seconds or less). The amount of time for which the shape-memory stamp is compressed can range from any of the minimum values described above to any of the maximum values described above. For example, the shape-memory stamp can be compressed for an amount of time of from 1 second to 30 minutes (e.g., from 1 second to 1 minute, from 1 minute to 30 minutes, from 1 second to 30 seconds, from 30 seconds to 1 minute, from 1 minute to 30 minutes, from 5 seconds to 30 minutes, from 1 second to 25 minutes, from 5 seconds to 25 minutes, from 1 second to 10 minutes, or from 1 second to 5 minutes).

In certain examples, where the shape-memory stamp comprises the set of features and the terminal surface is non-planar, compressing the shape-memory stamp against the donor substrate can cause the terminal surface to deform from non-planar to at least a portion being substantially planar.

In certain examples, where the donor substrate comprises the set of protrusions, compressing the shape-memory stamp against the donor substrate can comprise compressing the shape-memory stamp along the direction of the axis of the set of protrusions such that the surface of the shape-memory polymer deforms from being substantially flat to being indented by the set of protrusions. In certain examples, where the donor substrate comprises the set of protrusions and the shape-memory stamp comprises the set of features, compressing the shape-memory stamp against the donor substrate can comprise compressing the shape-memory stamp along the direction of the axis of the set of protrusions such that the terminal surface deforms to being indented by the set of protrusions. In some examples, the set of protrusions comprises a plurality of protrusions in an ordered array (e.g. pattern), such that the indentations are formed in said ordered array (e.g., pattern).

The methods further comprise, after step b) (and after the optional compression, when performed), step c) cooling the shape-memory stamp to a temperature below the transition temperature, thereby temporarily fixing the shape-memory polymer and the shape-memory stamp, such that the shape-memory polymer and the shape-memory stamp are in a temporarily fixed state. In some examples, cooling the shape-memory stamp to a temperature below the transition temperature, thereby temporarily fixing the shape-memory polymer and the shape-memory stamp, can further comprise storing an amount of elastic energy in the shape-memory polymer.

In some examples, there is a first amount of interfacial adhesion between the thin film and the shape-memory polymer in the temporarily fixed state and a second amount of interfacial adhesion between the thin film and the donor substrate, wherein the first amount of interfacial adhesion is greater than the second amount of interfacial adhesion.

In some examples, the transition temperature is above room temperature and cooling to a temperature below the transition temperature comprises cooling to room temperature.

In some examples, the methods can comprise cooling the shape-memory stamp to a temperature below the transition temperature by 5° C. or more (e.g., 10° C. or more, 15° C. or more, 20° C. or more, 25° C. or more, 30° C. or more, 35° C. or more, 40° C. or more, 45° C. or more, 50° C. or more, 55° C. or more, 60° C. or more, 65° C. or more, 70° C. or more, 75° C. or more, 80° C. or more, 85° C. or more, 90° C. or more, or 95° C. or more). In some examples, the methods can comprise cooling the shape-memory stamp to a temperature below the transition temperature by 100° C. or less (e.g., 95° C. or less, 90° C. or less, 85° C. or less, 80° C. or less, 75° C. or less, 70° C. or less, 65° C. or less, 60° C. or less, 55° C. or less, 50° C. or less, 45° C. or less, 40° C. or less, 35° C. or less, 30° C. or less, 25° C. or less, 20° C. or less, 15° C. or less, or 10° C. or less). The temperature to which the shape-memory stamp is cooled relative to the transition temperature can range from any of the minimum values described above to any of the maximum values described above. For example, the methods can comprise cooling the shape-memory stamp to a temperature from 5° C. to 100° C. below the transition temperature (e.g., from 5° C. to 50° C., from 50° C. to 100° C., from 5° C. to 20° C., from 20° C. to 40° C., from 40° C. to 60° C., from 60° C. to 80° C., from 80° C. to 100° C., from 10° C. to 100° C., from 5° C. to 95° C., from 10° C. to 95° C., from 10° C. to 100° C., from 20° C. to 100° C., from 40° C. to 100° C., from 60° C. to 100° C., from 80° C. to 100° C.).

In some examples, the shape-memory stamp is cooled for an amount of time of 1 second or more (e.g., 5 seconds or more, 10 seconds or more, 15 seconds or more, 20 seconds or more, 25 seconds or more, 30 seconds or more, 35 seconds or more, 40 seconds or more, 45 seconds or more, 50 seconds or more, 55 seconds or more, 1 minute or more, 1.5 minutes or more, 2 minutes or more, 2.5 minutes or more, 3 minutes or more, 3.5 minutes or more, 4 minutes or more, 4.5 minutes or more, 5 minutes or more, 6 minutes or more, 7 minutes or more, 8 minutes or more, 9 minutes or more, 10 minutes or more, 15 minutes or more, 20 minutes or more, 25 minutes or more, 30 minutes or more, 35 minutes or more, 40 minutes or more, 45 minutes or more, 50 minutes or more, 55 minutes or more, 1 hour or more, 1.25 hours or more, 1.5 hours or more, or 1.75 hours or more). In some examples, the shape-memory stamp is cooled for an amount of time of 2 hours or less (e.g., 1.75 hours or less, 1.5 hours or less, 1.25 hours or less, 1 hour or less, 55 minutes or less, 50 minutes or less, 45 minutes or less, 40 minutes or less, 35 minutes or less, 30 minutes or less, 25 minutes or less, 20 minutes or less, 15 minutes or less, 10 minutes or less, 9 minutes or less, 8 minutes or less, 7 minutes or less, 6 minutes or less, 5 minutes or less, 4.5 minutes or less, 4 minutes or less, 3.5 minutes or less, 3 minutes or less, 2.5 minutes or less, 2 minutes or less, 1.5 minutes or less, 1 minute or less, 55 seconds or less, 50 seconds or less, 45 seconds or less, 40 seconds or less, 35 seconds or less, 30 seconds or less, 25 seconds or less, 20 seconds or less, 15 seconds or less, 10 seconds or less, or 5 seconds or less). The amount of time for which the shape-memory stamp is cooled can range from any of the minimum values described above to any of the maximum values described above. For example, the shape-memory stamp can be cooled for an amount of time of from 1 second to 2 hours (e.g., from 1 second to 30 minutes, from 30 minutes to 2 hours, from 1 second to 1 minute, from 1 minute to 10 minutes, from 10 minutes to 1 hour, from 1 hour to 2 hours, from 5 seconds to 2 hours, from 1 second to 1.75 hours, from 1 second to 1 hour, from 1 second to 30 minutes, or from 1 second to 10 minutes).

In certain examples, where the donor substrate comprises the set of protrusions and compressing the shape-memory stamp causes the surface of the shape-memory stamp to be indented by the set of protrusions, cooling the shape-memory stamp to a temperature below the transition temperature can fix the indentations in the surface of the shape-memory stamp.

The methods further comprise, after step c), step d), separating the shape-memory stamp in the temporarily fixed state from the donor substrate, thereby picking up the thin film from the donor substrate with the shape-memory stamp in the temporarily fixed state, such that the shape-memory stamp in the temporarily fixed state includes the thin film on the surface thereof after being separated from the donor substrate, such that the shape-memory stamp is in a printed temporarily fixed state and has a printed surface.

In certain examples, where the donor substrate comprises the set of protrusions, the shape-memory stamp in the temporarily fixed state includes the thin film within the indentations after being separated from the donor substrate, such that the printed surface of the shape-memory stamp in the printed temporarily fixed state is and indented printed surface. In some examples, the set of protrusions comprises a plurality of protrusions in an ordered array (e.g. pattern), such that the indentations and the thin film are in said ordered array (e.g., pattern) when the shape-memory stamp is in the printed temporarily fixed state with the indented printed surface.

The methods further comprise, after step d), step e), contacting the printed surface of the shape-memory stamp in the printed temporarily fixed state with a top surface of a receiver substrate.

In certain examples, where the donor substrate comprises the set of protrusions, contacting the shape-memory stamp in the printed temporarily fixed state with the receiver substrate comprises contacting the indented printed surface of the shape-memory stamp with the top surface of the receiver substrate.

The top surface of the receiver substrate can be substantially planar (e.g., flat). The receiver substrate can comprise any suitable material. Examples of suitable receiver substrates include, but are not limited to, polymers, glass, quartz, silicon, metals, ceramics, nitrides (e.g. silicon nitride), oxides (e.g. silicon dioxide, indium tin oxide (ITO)), porous materials, and combinations thereof. In some examples, the methods can further comprise functionalizing or modifying the top surface disposing the thin film thereon, e.g. to modify the surface energy or modify the interfacial adhesion between the top surface and the thin film.

The methods further comprise, after step e), step f), heating the shape-memory stamp in the printed temporarily fixed state to a temperature above the transition temperature while in contact with the top surface of the receiver substrate (e.g., such that the shape-memory polymer and the shape-memory stamp return to the deformable state), thereby depositing the thin film on the top surface. In some examples, heating the shape-memory stamp in the printed temporarily fixed state to a temperature above the transition temperature while in contact with the top surface of the receiver substrate can further comprise releasing an amount of elastic energy from the shape-memory polymer. In some examples, there is a third amount of interfacial adhesion between the thin film and the shape-memory polymer while the shape-memory polymer is above the transition temperature (e.g., while the shape-memory polymer in the deformable state) and a fourth amount of interfacial adhesion between the thin film and the top surface, wherein the fourth amount of interfacial adhesion is greater than the sum of the third amount of interfacial adhesion and the released amount of elastic energy.

In some examples, the methods can comprise heating the shape-memory stamp to a temperature of 40° C. or more (e.g., 45° C. or more, 50° C. or more, 55° C. or more, 60° C. or more, 65° C. or more, 70° C. or more, 75° C. or more, 80° C. or more, 85° C. or more, 90° C. or more, 95° C. or more, 100° C. or more, 105° C. or more, 110° C. or more, 115° C. or more, 120° C. or more, 125° C. or more, 130° C. or more, 135° C. or more, 140° C. or more, or 145° C. or more). In some examples, the methods can comprise heating the shape-memory stamp to a temperature of 150° C. or less (e.g., 145° C. or less, 140° C. or less, 135° C. or less, 130° C. or less, 125° C. or less, 120° C. or less, 115° C. or less, 110° C. or less, 105° C. or less, 100° C. or less, 95° C. or less, 90° C. or less, 85° C. or less, 80° C. or less, 75° C. or less, 70° C. or less, 65° C. or less, 60° C. or less, 55° C. or less, 50° C. or less, or 45° C. or less). The temperature to which the shape-memory stamp is heated can range from any of the minimum values described above to any of the maximum values described above. For example, the methods can comprise heating the shape-memory stamp to a temperature of from 40° C. to 150° C. (e.g., from 40° C. to 95° C., from 95° C. to 150° C., from 40° C. to 60° C., from 60° C. to 80° C., from 80° C. to 100° C., from 100° C. to 120° C., from 120° C. to 150° C., from 45° C. to 150° C., from 40° C. to 145° C., from 45° C. to 145° C., from 40° C. to 100° C., from 40° C. to 90° C., or from 50° C. to 90° C.).

In some examples, the shape-memory stamp is heated for an amount of time of 1 second or more (e.g., 5 seconds or more, 10 seconds or more, 15 seconds or more, 20 seconds or more, 25 seconds or more, 30 seconds or more, 35 seconds or more, 40 seconds or more, 45 seconds or more, 50 seconds or more, 55 seconds or more, 1 minute or more, 1.5 minutes or more, 2 minutes or more, 2.5 minutes or more, 3 minutes or more, 3.5 minutes or more, 4 minutes or more, 4.5 minutes or more, 5 minutes or more, 6 minutes or more, 7 minutes or more, 8 minutes or more, 9 minutes or more, 10 minutes or more, 15 minutes or more, 20 minutes or more, 25 minutes or more, 30 minutes or more, 35 minutes or more, 40 minutes or more, 45 minutes or more, 50 minutes or more, 55 minutes or more, 1 hour or more, 1.25 hours or more, 1.5 hours or more, or 1.75 hours or more). In some examples, the shape-memory stamp is heated for an amount of time of 2 hours or less (e.g., 1.75 hours or less, 1.5 hours or less, 1.25 hours or less, 1 hour or less, 55 minutes or less, 50 minutes or less, 45 minutes or less, 40 minutes or less, 35 minutes or less, 30 minutes or less, 25 minutes or less, 20 minutes or less, 15 minutes or less, 10 minutes or less, 9 minutes or less, 8 minutes or less, 7 minutes or less, 6 minutes or less, 5 minutes or less, 4.5 minutes or less, 4 minutes or less, 3.5 minutes or less, 3 minutes or less, 2.5 minutes or less, 2 minutes or less, 1.5 minutes or less, 1 minute or less, 55 seconds or less, 50 seconds or less, 45 seconds or less, 40 seconds or less, 35 seconds or less, 30 seconds or less, 25 seconds or less, 20 seconds or less, 15 seconds or less, 10 seconds or less, or 5 seconds or less).

The amount of time for which the shape-memory stamp is heated can range from any of the minimum values described above to any of the maximum values described above. For example, the shape-memory stamp can be heated for an amount of time of from 1 second to 2 hours (e.g., from 1 second to 30 minutes, from 30 minutes to 2 hours, from 1 second to 1 minute, from 1 minute to 10 minutes, from 10 minutes to 1 hour, from 1 hour to 2 hours, from 5 seconds to 2 hours, from 1 second to 1.75 hours, from 1 second to 1 hour, from 1 second to 30 minutes, or from 1 second to 10 minutes).

In certain examples, where the donor substrate comprises the set of protrusions, heating the shape-memory stamp in the printed temporarily fixed state to a temperature above the transition temperature while in contact with the top surface of the receiver substrate (e.g., such that the shape-memory polymer and the shape-memory stamp return to the deformable state) further comprises the indented surface of the shape-memory polymer returning to being substantially flat thereby contacting the thin film with the top surface.

The methods further comprise, after step f), step g), separating the shape-memory stamp (e.g., while the shape-memory stamp is in the deformable state) from the receiver substrate, wherein the thin film remains on the top surface of the receiver substrate after the shape-memory stamp is separated from the receiver substrate, thereby transferring the thin film onto the top surface of the receiver substrate, the thin film transferred to the top surface of the receiver substrate being a printed element.

As used herein "a printed element" and "the printed element" are meant to include any number of printed elements in any arrangement. Thus, for example, "a printed element" includes one or more printed elements (e.g., 2 or more; 3 or more; 4 or more; 5 or more; 10 or more; 15 or more; 20 or more; 25 or more; 30 or more; 40 or more; 50 or more; 75 or more; 100 or more; 150 or more; 200 or more; 250 or more; 300 or more; 400 or more; 500 or more; 750 or more; 1000 or more; 1500 or more; 2000 or more; 2500 or more; 3000 or more; 4000 or more; 5000 or more; 7500 or more; $1\times10^4$ or more; $2.5\times10^4$ or more; $5\times10^4$ or more; $7.5\times10^4$ or more; $1\times10^5$ or more; $2.5\times10^5$ or more; $5\times10^5$ or more; $7.5\times10^5$ or more; $1\times10^6$ or more; $5\times10^6$ or more; $1\times10^7$ or more; $5\times10^7$ or more; $1\times10^8$ or more; $5\times10^8$ or more; $1\times10^9$ or more; $5\times10^9$ or more; or $1\times10^{10}$ or more). In some examples, the printed element can comprise a plurality of printed elements. In some examples, the printed element comprises a plurality of printed elements in an ordered array.

Each of the printed elements can have a shape in a plane parallel to the top surface of the receiver substrate, wherein the shape can be any shape, such as a regular shape, an irregular shape, an isotropic shape, or an anisotropic shape. In some examples, the shape of the printed element can be substantially circular, ovate, ovoid, elliptic, triangular, rectangular, polygonal, etc. In some examples, the printed element comprises a plurality of printed elements and the shape of each of the printed elements is substantially the same.

The printed element can have an average size. The term "size" of the printed element as used herein refers to the largest straight line distance between two points of the printed element in a plane parallel to the top surface of the receiver substrate. "Average size" and "mean size" are used interchangeably herein, and generally refer to the statistical mean size of the printed elements in a population of printed elements. For example, for circular printed elements the average size can refer to the average diameter.

The printed element can, for example, have an average size of 1 nanometer (nm) or more (e.g., 2 nm or more, 3 nm or more, 4 nm or more, 5 nm or more, 6 nm or more, 7 nm or more, 8 nm or more, 9 nm or more, 10 nm or more, 15 nm or more, 20 nm or more, 25 nm or more, 30 nm or more, 35 nm or more, 40 nm or more, 45 nm or more, 50 nm or more, 60 nm or more, 70 nm or more, 80 nm or more, 90 nm or more, 100 nm or more, 125 nm or more, 150 nm or more, 175 nm or more, 200 nm or more, 225 nm or more, 250 nm or more, 300 nm or more, 350 nm or more, 400 nm or more, 450 nm or more, 500 nm or more, 600 nm or more, 700 nm or more, 800 nm or more, 900 nm or more, 1 micrometer ($\mu$m) or more, 1.5 $\mu$m or more, 2 $\mu$m or more, 2.5 $\mu$m or more, 3 $\mu$m or more, 3.5 $\mu$m or more, 4 $\mu$m or more, 4.5 $\mu$m or more, 5 $\mu$m or more, 6 $\mu$m or more, 7 $\mu$m or more, 8 $\mu$m or more, 9 $\mu$m or more, 10 $\mu$m or more, 15 $\mu$m or more, 20 $\mu$m or more, 25 $\mu$m or more, 30 $\mu$m or more, 35 $\mu$m or more, 40 $\mu$m or more, 45 $\mu$m or more, 50 $\mu$m or more, 60 $\mu$m or more, 70 $\mu$m or more, 80 $\mu$m or more, or 90 $\mu$m or more). In some examples, the printed element can have an average size of 100 $\mu$m or less (e.g., 90 $\mu$m or less, 80 $\mu$m or less, 70 $\mu$m or less, 60 $\mu$m or less, 50 $\mu$m or less, 45 $\mu$m or less, 40 $\mu$m or less, 35 $\mu$m or less, 30 $\mu$m or less, 25 $\mu$m or less, 20 $\mu$m or less, 15 $\mu$m or less, 10 $\mu$m or less, 9 $\mu$m or less, 8 $\mu$m or less, 7 $\mu$m or less, 6 $\mu$m or less, 5 $\mu$m or less, 4.5 $\mu$m or less, 4 $\mu$m or less, 3.5 $\mu$m or less, 3 $\mu$m or less, 2.5 $\mu$m or less, 2 $\mu$m or less, 1.5 $\mu$m or less, 1 $\mu$m or less, 900 nm or less, 800 nm or less, 700 nm or less, 600 nm or less, 500 nm or less, 450 nm or less, 400 nm or less, 350 nm or less, 300 nm or less, 250 nm or less, 225 nm or less, 200 nm or less, 175 nm or less, 150 nm or less, 125 nm or less, 100 nm or less, 90 nm or less, 80 nm or less, 70 nm or less, 60 nm or less, 50 nm or less, 45 nm or less, 40 nm or less, 35 nm or less, 30 nm or less, 25 nm or less, 20 nm or less, 15 nm or less, 10 nm or less, or 5 nm or less). The average size of the printed element can range from any of the minimum values described above to any of the maximum values described above. For example, the printed element can have an average size of from 1 nanometer (nm) to 100 micrometers (microns, $\mu$m) (e.g., from 1 nm to 1 $\mu$m, from 1 $\mu$m to 100 $\mu$m, from 1 nm to 10 nm, from 10 nm to 100 nm, from 100 nm to 1 $\mu$m, from 1 $\mu$m to 10 $\mu$m, from 10 $\mu$m to 100 $\mu$m, from 5 nm to 100 $\mu$m, from 1 nm to 90 $\mu$m, or from 5 nm to 90 $\mu$m). Average size can be measured using methods known in the art, such as evaluation by optical microscopy, electron microscopy, atomic force microscopy, profilometry, or white light scanning interferometry.

In some examples, the printed element can comprise a plurality of printed elements wherein the average size of the plurality of printed elements can be substantially monodisperse. "Monodisperse" and "homogeneous size distribution," as used herein, and generally describe a population of printed elements where all of the printed elements have the same or nearly the same average size. As used herein, a monodisperse distribution refers to distributions in which 80% of the distribution (e.g., 85% of the distribution, 90% of the distribution, or 95% of the distribution) lies within 25% of the average size (e.g., within 20% of the average size, within 15% of the average size, within 10% of the average size, or within 5% of the average size).

In some examples, the thin film on the donor substrate comprises a plurality of sections in an ordered array (e.g., pattern), such that the thin film is in said ordered array (e.g., pattern) and the thin film transferred onto the top surface of the receiver substrate is in said ordered array (e.g., pattern), and therefore the printed element comprises a plurality of printed elements in said ordered array (e.g., pattern).

In some examples, the set of protrusions comprises a plurality of protrusions in an ordered array (e.g. pattern), such that the thin film transferred onto the top surface of the receiver substrate is in said ordered array (e.g., pattern), and therefore the printed element comprises a plurality of printed elements in said ordered array (e.g., pattern).

In some examples, the methods can further comprise, after step g), re-using the shape memory stamp to repeat steps a)-g).

In some examples, the methods can further comprise, after any one of steps d)-g), regenerating the donor substrate and using the regenerated donor substrate to repeat steps a)-g). Regenerating the donor substrate can, for example, comprise cleaning and/or stripping the donor substrate, then optionally functionalizing or modifying the donor substrate, and subsequently depositing a thin film (which can be the same or different than the previous thin film).

In some examples, the methods are high resolution. As used herein, "resolution" refers to the process or capability of distinguishing between two separate but adjacent objects. For example, the methods disclosed herein can have sub-10 μm resolution or the ability to distinguish between two separate but adjacent objects 10 micrometers (microns, μm) or less in size.

In some examples, the methods can have a resolution of 10 μm or less (e.g., 9 μm or less, 8 μm or less, 7 μm or less, 6 μm or less, 5 μm or less, 4 μm or less, 3 μm or less, 2 μm or less, 1 μm or less, 900 nanometer (nm) or less, 800 nm or less, 700 nm or less, 600 nm or less, 500 nm or less, 450 nm or less, 400 nm or less, 350 nm or less, 300 nm or less, 250 nm or less, 200 nm or less, 150 nm or less, 100 nm or less, 75 nm or less, 50 nm or less, 25 nm or less, 20 nm or less, 15 nm or less, 10 nm or less, or 5 nm or less).

Also disclosed herein are printed substrates made by any of the methods disclosed herein.

Also disclosed herein are articles of manufacture made by any of the methods disclosed herein. Also disclosed herein are articles of manufacture including any of the printed substrates made by any of the methods disclosed herein. The article of manufacture can, for example, comprise an electronic device (e.g., a microelectronic device), a photonic device, an optical device, or a combination thereof. In some examples, the article of manufacture can comprise a light emitting display, a photovoltaic device, a photoconductor, or a combination thereof.

The examples below are intended to further illustrate certain aspects of the methods and compounds described herein, and are not intended to limit the scope of the claims.

EXAMPLES

The following examples are set forth below to illustrate the methods and results according to the disclosed subject matter. These examples are not intended to be inclusive of all aspects of the subject matter disclosed herein, but rather to illustrate representative methods, compositions, and results. These examples are not intended to exclude equivalents and variations of the present invention, which are apparent to one skilled in the art.

Efforts have been made to ensure accuracy with respect to numbers (e.g., amounts, temperature, etc.) but some errors and deviations should be accounted for. Unless indicated otherwise, parts are parts by weight, temperature is in ° C. or is at ambient temperature, and pressure is at or near atmospheric. There are numerous variations and combinations of reaction conditions, e.g., component concentrations, temperatures, pressures, and other reaction ranges and conditions that can be used to optimize the product purity and yield obtained from the described process. Only reasonable and routine experimentation will be required to optimize such process conditions.

Example 1

Over the past two decades, contact transfer printing has evolved into a viable manufacturing technology that can deposit and pattern various organic, polymeric and inorganic ink materials with micro- and nanoscale precision (Michel B et al. *Chimia*. 2002, 56, 527-542; Fan Z Y et al. *Advanced Materials*. 2009, 21, 3730-3743; Kaufmann T et al. *Polymer Chemistry*. 2010, 1, 371-387; Voskuhl J et al. *Current Opinion in Chemical Biology*. 2014, 18, 1-7). Contact printing relies on the elastomeric stamp that forms an adhesive and conformal contact with the ink layer during the ink pickup, and on the interfacial fracture of the ink-stamp interface during the ink transfer (Carlson A et al. *Advanced Materials*. 2012, 24, 5284-5318). Contact printing is inherently amenable to replicate large-area patterns on flat or curvilinear substrates, and it has potential to evolve into a universal platform for large-area, parallel deposition of multiple types of materials at the sub-micrometer length scale. However, the key to enabling such manufacturing is to establish clean and reliable methods for controlling interfacial adhesion and fracture mechanics during the ink pickup and release.

Interfacial adhesion of elastomers can be affected by their viscoelasticity, stiffness, surface energy and the geometrical shape and roughness of the interface that forms the contact (Greenwood J A et al. *Philosophical Magazine a-Physics of Condensed Matter Structure Defects and Mechanical Properties*. 1981, 43, 697-711; Maugis D et al. *Journal of Physics D-Applied Physics*. 1978, 11, 1989-&; Kim-Lee H J et al. *Journal of Applied Physics*. 2014, 115, 7). Many of these parameters were used in the past to control adhesion in contact printing. Rogers et al. have demonstrated that adhesion in transfer printing can be modulated by stamping at different rates—a consequence of the viscoelastic nature of polydimethylsiloxane (PDMS) stamps that are ubiquitously applied in the majority of contact printing examples (Meitl M A et al. *Nature Materials*. 2006, 5, 33-38). Higher stamp-substrate separation velocities during inking result in greater adhesion between the stamp and ink. Rate-modulated contact printing has been successfully used to pattern large-area substrates with inorganic and organic thin films with >10 μm feature resolution, and the method was commercialized to accomplish pickup and transfer of photovoltaic (PV) stacks for the fabrication of inorganic PV devices on large-area, flexible supports (Yoon J et al. *Nature Materials*. 2008, 7, 907-915). However, material and printing mechanics have so far precluded adaptation of the rate-modulated adhesion to smaller micro- and nanopatterns (Meitl M A et al. *Nature Materials*. 2006, 5, 33-38).

Besides kinetic modulation, thin release layers on the stamp surface were used to control adhesive stamp-ink interactions (Taniguchi J et al. Microelectronic Engineering. 2009, 86, 590-595; Cho H et al. *Japanese Journal of Applied Physics*. 2010, 49, 05EB08; Shaw-Stewart J et al. *Acs Applied Materials & Interfaces*. 2011, 3, 309-316; Rapp L et al. *Applied Surface Science*. 2011, 257, 5245-5249). The use of the release layers broadens the variety of ink materials that can be patterned using contact printing. However, such processing complicates the procedure and can contaminate the deposited films.

The adhesive stamp-ink interactions can be controlled by the chemical composition and stiffness of the polymeric stamps (Li J H et al. *Journal of Materials Chemistry C*. 2016, 4, 4155-4165). For example, the surface energy of the polyurethaneacrylate (PUA) stamps can be controlled chemically, producing stamps with tunable polarity. As a consequence, high and low surface energy PUA stamps can be used to pattern a variety of hydrophobic and hydrophilic ink materials with sub-100 nm resolution and high uniformity. However, this approach requires optimization of the stamp composition for each new ink-substrate system.

Modulation of interfacial adhesion can also be achieved with stamps made of shape-memory polymers (SMP) that can change their contact area with inks using external stimuli. As such, Kim et al. have recently demonstrated that 100×100 µm inorganic plates can be printed using SMP stamps bearing small conical and cylindrical features (Eisenhaure J et al. *Advanced Materials Technologies*. 2016, 1(7), 1600098; Eisenhaure J et al. *Journal of Microelectromechanical Systems*. 2016, 25, 69-77). The metal plates are first pressed into the stamp surface, flattening the stamp features, to create a temporary large contact area at low temperature; when heated, the features return to their original shape, breaking the stamp-plate interfacial adhesion (Eisenhaure J et al. *Advanced Materials Technologies*. 2016, 1(7), 1600098; Eisenhaure J et al. *Journal of Microelectromechanical Systems*. 2016, 25, 69-77). Such contact area modulation removes the need to control adhesive interactions kinetically or through chemical modification.

Potentially, this approach could be generalized to transfer different inks using identical printing conditions and materials. However, Kim's studies were limited to transferring relatively large features. The SMP stamps in these examples can be switched only between two adhesive states—continuous large area contact with flattened features and small contact with raised features. Such bimodal adhesion control limits the size of the printed features to the size of the continuous large stamp areas. However, by optimizing the stamp feature geometry, it is possible to continuously modulate the stamp-ink contact area through thermo-mechanical SMP cycles, thus enabling tunable adhesive contacts between the individual stamp features and the inks. Such shape-memory assisted contact printing can increase print resolution to the sub-micrometer scale by reducing the size of the ink features to the dimensions of the individual stamp features.

Disclosed herein are methods for picking up and transferring thin films of inorganic and/or organic materials, or stacks thereof, using shape-memory elastomers. In this method, films are picked up and transferred by inducing thermo-mechanical responses in the shape-memory elastomer that modulate the adhesive interactions between the elastomer and the material to be transferred. The film is picked up when the stamp is in a high adhesive state. To accomplish pickup, the elastomeric stamp is first deformed at an elevated temperature to achieve high contact area. Then, while maintaining deformation, the temperature is lowered to induce a transition of the shape-memory stamp into a significantly stiffer semi-crystalline or glassy state. This process fixes the stamp (or stamp features) into a temporary shape with a high contact area such that when the deformation forces are removed, the stamp maintains a high contact area. After shape-fixing, the good adhesive contact between the stamp and the film to be transferred can enable pick-up and transfer to a target location. Film release then is achieved by heating the deformed elastomeric stamp with the film above the trigger temperature which softens the material and releases stored elastic energy, thereby breaking or reducing the adhesive contact. These methods are unique in their ability to transfer patterns of thin films at high resolution. This is achieved by (1) pre-patterning the elastomer with small geometrical features that can continuously modulate their contact area and adhesive interactions with individual thin film features, (2) using flat elastomers with enhanced surface roughness and modulating the true contact area between the elastomer and the film by compressing and flattening rough elastomer interface to achieve high adhesion state, or a combination thereof.

An example of a continuous process is shown in FIG. 1. A hemi-spherical feature is first deformed through a cold drawing process (for example flattened) to state (ii) where there is a large amount of interfacial contact. At that point, the feature is cooled beneath its shape-memory trigger temperature, where the feature becomes stiffer through shape memory, and is able to store elastic energy, such that, when the load is removed, state (iii) retains most of its flat shape, offering adhesion. Note that the elastic stresses introduced upon compression to state (ii) are stored inside of the feature, as suggested by the stress-strain curve at the top of FIG. 1. When triggered by heating above the shape-memory trigger temperature, elastic energy is released, and this energy is large enough to drive a crack between the ink layer and the feature. The crack continues to grow until the interfacial adhesive forces balance the remaining elastic deformation energy. By releasing the stored elastic energy, the interfacial contact has been substantially reduced.

The idea of shape-memory contact printing involves storage of elastic strain energy (during inking) followed by utilization of stored energy to assist material separation at the stamp-ink interface (during printing). In principle, the elastic energy release during shape-recovery can trigger material separation—even in the absence of tension used to remove the stamp. This is further illustrated using a simple scaling argument. Consider a hemi-spherical feature of radius r. Application of an axial force causes a displacement δ and material strain & that scales as ε·δ/r (Shull K R. *Materials Science & Engineering R-Reports*. 2002, 36, 1-45). Assuming the stamp is linearly elastic with a bulk modulus E, and noting that strain mainly occurs within a volume proportional to the feature size ($V=2/3\pi r^3$), then the total elastic deformation $U_{el}$ should be proportional to the feature size and scales as:

$$U_{el} \sim \frac{2}{3}\pi r^3 \int_0^{\delta/r} E\varepsilon d\varepsilon = \frac{1}{3}\pi E\delta^2 r$$

For spontaneous separation, the elastic strain energy must exceed the total adhesive contact energy, $U_{ad}=\pi r_c^2 G_c$ where $r_c$ is the contact radius and $G_c$ is the critical energy release rate. Taking the contact radius to scale as $(2r\delta)^{1/2}$, then $U_{el}/U_{ad} \sim E\delta/6G_c$, indicating that small features must be stiff to store enough elastic energy to overcome adhesion.

Figure 2:
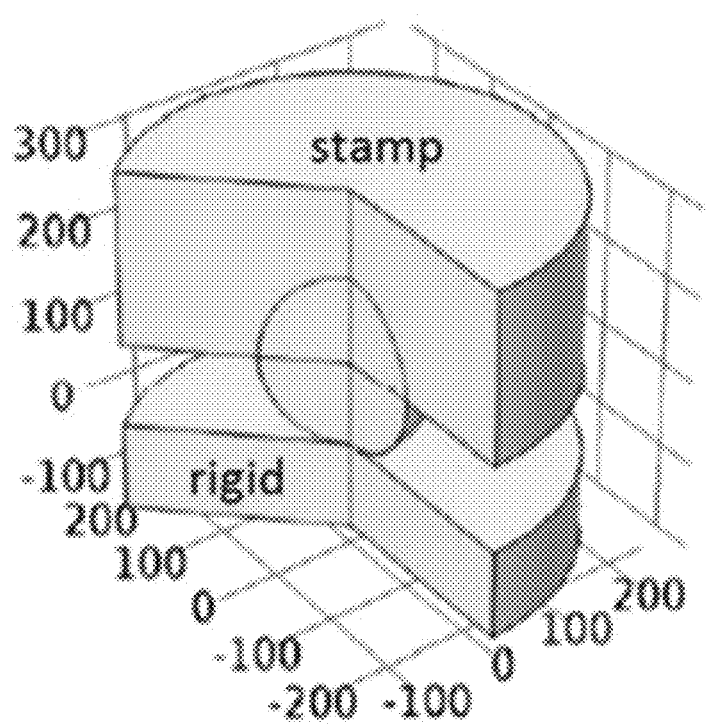
FIG. 2. Analysis of hemi-spherical features under compressive load reveals the stress distribution and shape changes.
Figure 3:
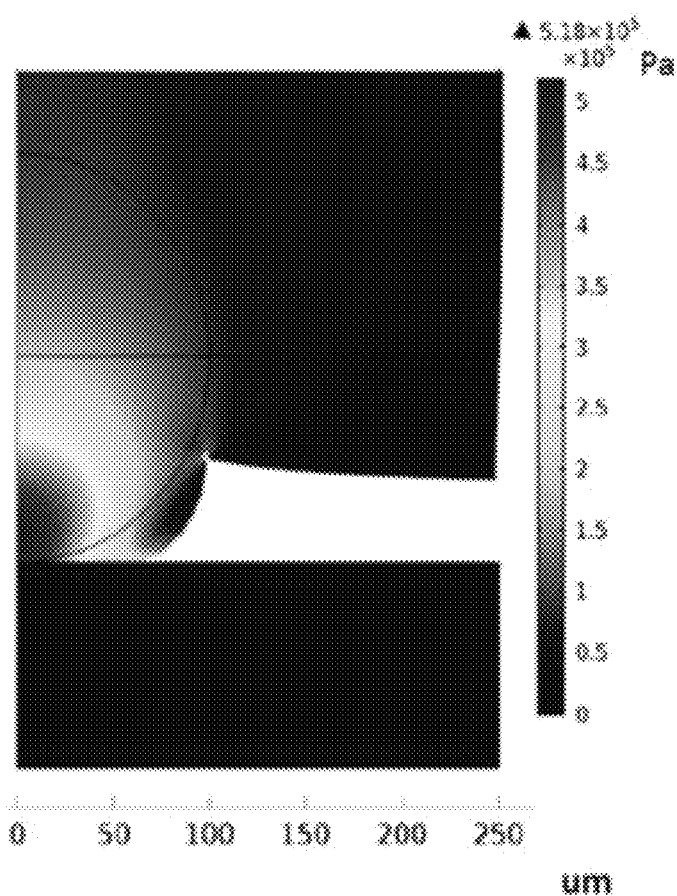
FIG. 3. Analysis of hemi-spherical features under compressive load reveals the stress distribution and shape changes.
Figure 4:
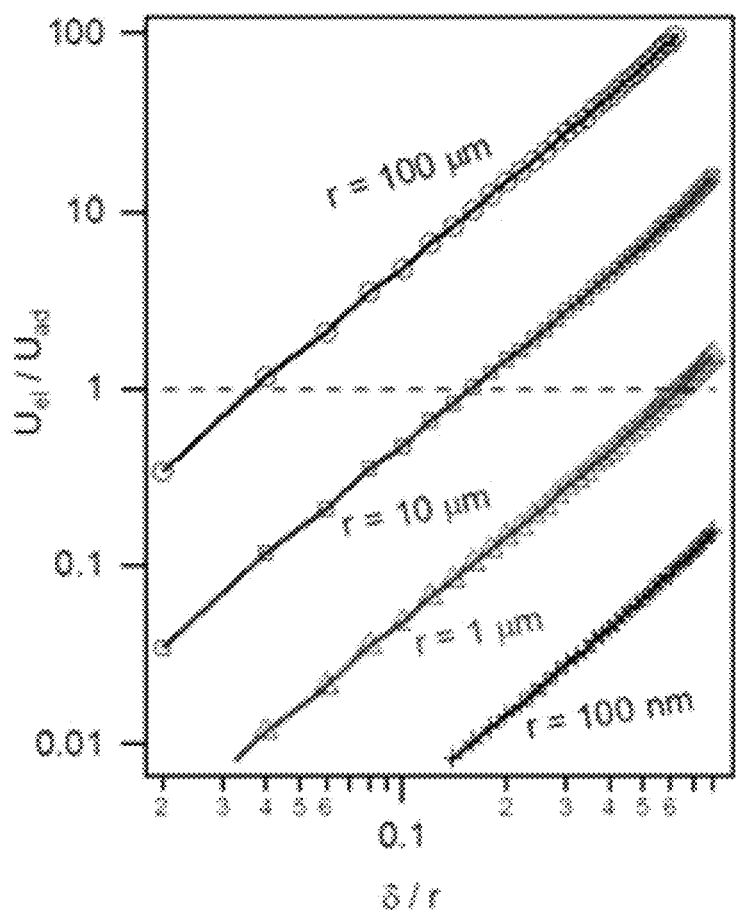
FIG. 4. Analysis of hemi-spherical features under compressive load reveals the stress distribution and shape changes. The total elastic energy of several stationary points (fixed displacement, δ) was computed for different feature scales and can exceed the adhesive contact energy suggesting that spontaneous delamination will occur during shape-recovery. The stamp was modeled as an Arruda-Boyce hyperelastic material (N=100, $G_0$=0.4 MPa).

To further examine how stored elastic energy can overcome adhesive forces, finite element analysis (Comsol®) was performed on compressed hemispherical features, and results are shown in FIG. 2-FIG. 4. For large features (r>1 µm) of a hyperelastic material ($G_0$=0.4 MPa), the total elastic deformation energy needed to compress features exceeds the adhesive interactions ($G_c$ taken as 0.1 J/m² of contacted area). If part of this elastic energy is stored in a shape-memory material, it can be released on demand to cause delamination of stamp features. Sub-micron features are inherently able to store less elastic energy, and although $U_{el}/U_{ad}$<1, the shape-memory effect can still aid in delamination when a pull-off force is applied. Stiffer elastomer stamp materials ($G_0$>4 MPa) can be used to maximize the elastic deformation energy (effectively shifting curves in FIG. 4 upward).

Example 2—Modulation of Interfacial Adhesion Using Semicrystalline Shape-Memory Polymers Abstract: Semicrystalline shape-memory elastomers are molded into deformable geometrical features to control adhesive interactions between elastomers and a glass substrate. By mechanically and thermally controlling the deformation and phase-behavior of molded features, the interfacial contact area and the interfacial adhesive force can be controlled. Results indicate that elastic energy is stored in the semicrystalline state of deformed features and can be released to break attractive interfacial forces, automatically separating the glass substrate from the elastomer. These findings suggest that the shape-memory elastomers can be applied in various contact printing applications to control adhesive forces and delamination mechanics during ink pickup and transfer.

Introduction: Over the past two decades, contact transfer printing has evolved into a viable manufacturing technology that can deposit and pattern various organic, polymeric, and inorganic ink materials with micro- and nano-scale precision (Michel B et al. *Chimia* 2002, 56(10), 527-542; Fan Z Y et al. *Adv Mater* 2009, 21(37), 3730-3743; Kaufmann T et al. *Polym Chem-Uk* 2010, 1(4), 371-387; Voskuhl J et al. *Curr Opin Chem Biol* 2014, 18, 1-7). Contact printing relies on an elastomeric stamp to form adhesive and conformal contact with an ink layer during ink pickup, and on interfacial fracture of the ink-stamp interface during ink transfer (Carlson A et al. *Adv Mater* 2012, 24(39), 5284-5318). Contact printing is inherently amenable to replicate large-area patterns on flat or curvilinear substrates, and it could potentially evolve into a universal platform for large-area, parallel deposition of multiple types of materials at the sub-micrometer length scale. However, a key to enabling such manufacturing is to establish clean and reliable methods for controlling interfacial adhesion and fracture mechanics during ink pickup and release.

Interfacial adhesion of elastomers can be affected by the material viscoelasticity, stiffness, surface energy and the geometrical shape and roughness of the contact interface (Maugis D et al. *J Phys D Appl Phys* 1978, 11(14), 1989-&; Greenwood J A et al. *Philos Mag A* 1981, 43(3), 697-711; Shull K R. *Mat Sci Eng R* 2002, 36(1), 1-45; Galliano A et al. *J Colloid Interf Sci* 2003, 265(2), 372-379; Saulnier F et al. *Macromolecules* 2004, 37(3), 1067-1075; Olah A et al. *Appl Surf Sci* 2005, 239(3-4), 410-423; Benz M et al. *J Phys Chem B* 2006, 110(24), 11884-11893; Kim-Lee H J et al. *J. Appl. Phys.* 2014, 115(14), 7; Tiwari A et al. *Soft Matter* 2017, 13(19), 3602-3621; Hensel R et al. *Adv Funct Mater* 2018, 28(28), 1800865; Gong L et al. *Langmuir* 2019, 35(48), 15914-15936). Many of these parameters were previously used to control adhesion in contact printing. Rogers et al. have demonstrated that adhesion in transfer printing can be modulated by the stamping rates—a consequence of the viscoelastic nature of polydimethylsiloxane (PDMS) stamps that are ubiquitously employed in contact printing (Meitl M A et al. *Nat Mater* 2006, 5(1), 33-38). Higher stamp-substrate separation velocities during ink pickup result in greater stamp-to-ink adhesion. Rate-modulated contact printing has been successfully used to pattern large-area substrates with inorganic and organic thin film patterns with >10 μm feature resolution, and the method was commercialized to accomplish pickup and transfer of photovoltaic (PV) stacks for the fabrication of inorganic PV devices on large-area, flexible supports (Yoon J et al. *Nat Mater* 2008, 7(11), 907-915). However, material and printing mechanics have so far precluded adaptation of rate-modulated adhesion to smaller micro- and nano-patterns.

Beyond stamp-rate modulation of adhesion, sacrificial release layers can trigger adhesive loss (Taniguchi J et al. *Microelectron Eng* 2009, 86(4-6), 590-595; Cho H et al. *Jpn J Appl Phys* 2010, 49(5), 05EB08; Rapp L et al. *Appl Surf Sci* 2011, 257(12), 5245-5249; Shaw-Stewart J et al. *Acs Appl Mater Inter* 2011, 3(2), 309-316), broadening the variety of inks that can be patterned by contact printing. However, such processing complicates contact printing and can contaminate deposited films.

It has been demonstrated that the adhesive stamp-ink interactions can be controlled by the stamp's chemical composition and stiffness (Li J H et al. *J Mater Chem C* 2016, 4(19), 4155-4165). For example, the surface energy of polyurethane-acrylate (PUA) stamps can be controlled chemically, producing stamps with tunable polarity. As a consequence, high and low surface energy PUA stamps can be used to uniformly pattern a variety of hydrophobic and hydrophilic ink materials with sub-100 nm resolution (Li J et al. *Acs Appl Mater Inter* 2016, 8(26), 16809-16815). However, this approach requires optimization of the stamp composition for each new ink-substrate system.

Modulation of interfacial adhesion can also be achieved with stamps made of shape-memory polymers (SMPs) that can be triggered using external stimuli to change their shape and contact area (Neuking K et al. *Mat Sci Eng a—Struct* 2008, 481, 606-611; Wang R M et al. *Langmuir* 2010, 26(5), 2999-3002; Eisenhaure J D et al. *Acs Appl Mater Inter* 2013, 5(16), 7714-7717; Kang J H et al. *Compos Sci Technol* 2014, 96, 23-30; Sarwate P et al. *J Micromech Microeng* 2014, 24(11), 115006; Zare Y. *Int J Adhes Adhes* 2014, 54, 67-71; Xue Y G et al. *J Mech Phys Solids* 2015, 77, 27-42; Michal B T et al. *Acs Appl Mater Inter* 2016, 8(17), 11041-11049; Seo J et al. *Extreme Mech Lett* 2016, 9, 207-214; Zhang H Y et al. *Appl Surf Sci* 2020, 525, 146525). In particular, due to the ability of switching interfacial interactions using such external stimuli as temperature, light, and magnetic/electric fields, shape-memory polymers have received considerable attention in the applications of dry adhesives (Eisenhaure J et al. *Polymers-Basel* 2014, 6(8), 2274-2286; Huang Y et al. *Acs Appl Mater Inter* 2016, 8(51), 35628-35633; Mrozek R A et al. *Smart Mater Struct* 2016, 25(2), 025004; Wobser V et al. *Mrs Adv* 2016, 1(1), 1-7; Wang Y et al. *Soft Matter* 2017, 13(31), 5317-5323; Croll A B et al. *Adv Mater Technol-Us* 2019, 4(8), 1900193; Park J K et al. *Adv Mater Interfaces* 2019, 6(3), 1801542). Kim et al. have demonstrated that arrays of 100×100 μm inorganic plates can be printed using shape-memory polymer stamps bearing small conical and cylindrical features (Eisenhaure J et al. *Adv Mater Technol-Us* 2016, 1(7), 1600098; Eisenhaure J D et al. *J Microelectromech S* 2016, 25(1), 69-77). The metal plates are first pressed into the stamp surface, flattening protruding features, to create a temporarily stable, large contact area at low temperature; when heated, features return to their original shape, breaking the stamp-plate interfacial adhesion. Such contact area modulation removes the need to control adhesive interactions kinetically or through chemical modification. Potentially, this approach could be generalized to transfer different inks using identical printing conditions and materials. However, this method involves bimodal switching between two adhesive states: continuous large-area contact with flattened features and small-area contact with raised features; and printed features must be large enough to engage onto the continuous large stamp areas.

It is proposed herein that, by optimizing stamp feature geometry, it is possible to continuously modulate the stamp-ink contact area through thermo-mechanical shape-memory polymer cycles, enabling tunable adhesive contact between individual stamp features and ink media. Such shape-memory assisted contact printing could potentially reduce the size of the ink features to the dimensions of the individual stamp features. Herein, it is demonstrated that (i)

adhesive interactions between shape-memory polymer stamps bearing macroscopic features and glass substrates can be continuously controlled by gradually changing the stamp-glass contact area through mechanical loading and thermally activated phase-transitions in a semicrystalline shape-memory polymer material; (ii) adhesion can additionally be modulated by simply varying the applied load exerted on pre-compressed features without thermomechanical programming, and (iii) that stored elastic energy in temporarily deformed shape-memory polymer feature can be released to overcome the adhesive forces between the shape-memory polymer stamp and a glass substrate. It is shown that the stamp-substrate adhesive interaction can only be controlled when the deformed shape-memory polymer materials stores sufficient elastic energy in its temporary shape and that purely elastic stamp-substrate contacts are incapable of modulating adhesive forces.

Methods and Materials

Materials. Polycaprolactone diacrylate (PCL2A, $M_n$: 4,100 g/mol), pentaerythritol tetrakis(3-mercaptopropionate) (PETMP, >95%), 4-dimethylaminopyridine (DMAP, 99%), and phenothiazine (99%) were acquired from Scientific Polymer Products, Sigma-Aldrich, Alfa Aesar, and Acros Organics, respectively.

Figure 5:
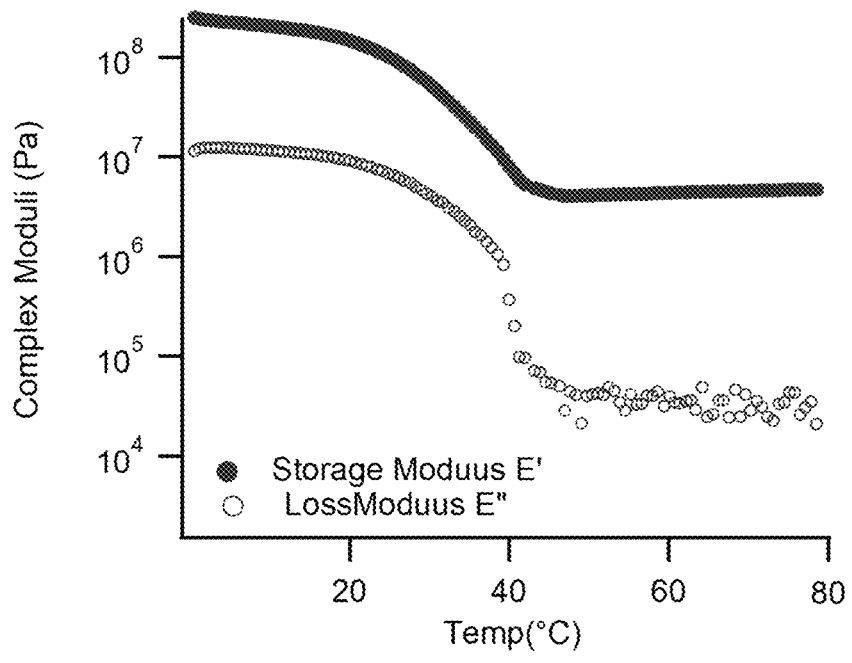
FIG. 5. Dynamic mechanical analysis of the semicrystalline polycaprolactone polymer (PCL-SP).

Preparation of Shape-Memory Elastomers. Semicrystalline shape-memory networks were prepared by crosslinking polycaprolactone diacrylate with thiolene crosslinker pentaerythritol tetrakis(3-mercaptopropionate) (Lee H et al. Macromol Mater Eng 2017, 302(12), 1700297). First, polycaprolactone diacrylate (3.5 g, 0.74 µmol) was melted at 60° C. and thoroughly mixed with finely crushed phenothiazine (10 mg, <0.3 wt %). Pentaerythritol tetrakis(3-mercaptopropionate) (0.19 g, 0.37 µmol) was then added into the mixture, followed by the base catalyst (35 mg, 1 wt %). The mixture was immediately degassed and poured into an aluminum mold with mm-scale cylinder or hemisphere features. An aluminum cover was placed on top of the material with an 800 g weight to achieve a uniform backing layer thickness of the sample. The polymer sample was cured at 60° C. for 3 days. Flat films with a thickness of 0.25 mm were also prepared by molding between glass slides, and dynamic mechanical analysis (DMA, RSA G2, TA Instruments) was performed to obtain the melting transition temperature ($T_M$) and Young's modulus. Temperature sweeps were acquired on 250 micrometer thick molded elastomer films from 0° C. to 80° C. at 5° C. min$^{-1}$. Oscillation was set to 0.50% strain and 1 Hz frequency, and the materials exhibits sharp softening transition upon melting as evident in FIG. 5.

Figure 6:
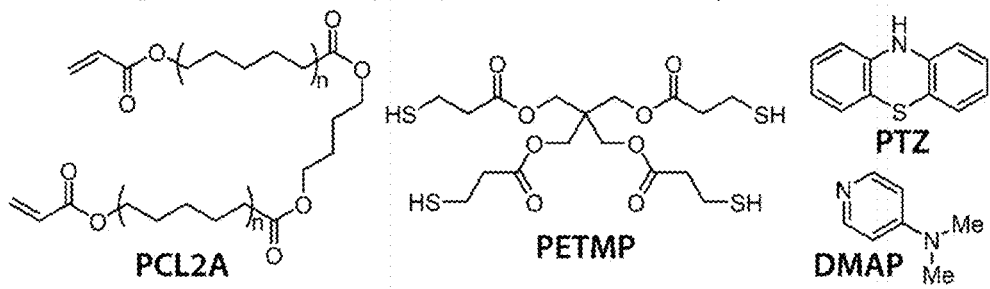
FIG. 6. Chemical composition of the semicrystalline polycaprolactone polymer (PCL-SP), geometrical dimensions of the molded cylindrical and hemispherical semicrystalline polycaprolactone polymer features, and schematics of the contact mechanics measuring system.
Figure 6:
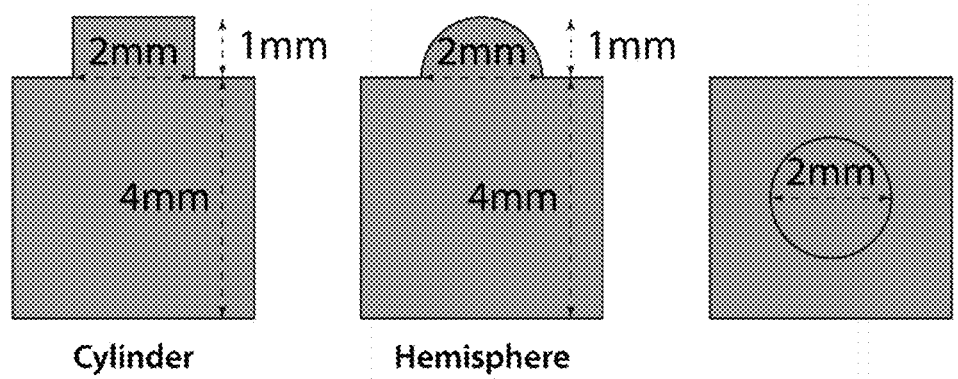
Figure 6:
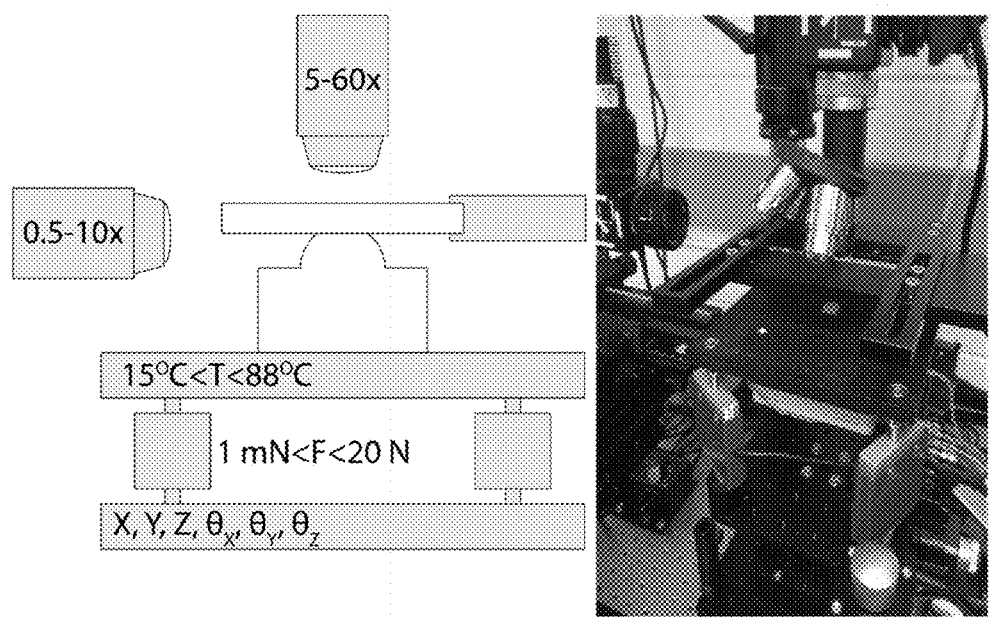

Thermo-mechanical contact testing. Compression tests were performed on a custom-built Contact Mechanics Measuring System (CMMS) shown in FIG. 6. The system is equipped with a fixed glass substrate holder, XYZ-axis stepper/piezo motor (Thorlabs apt precision control BSC 203/303, range: 50 mm/20 µm, resolution: 0.5 µm/20 nm, repeatability: 750 nm over 50 mm travel range), a multichannel amplifier with 4 load cells (Interface BSC8D-12, range: 5 N per cell, resolution: 0.05%) for force monitoring, a thermoelectric heater (TE Technology TC-720, range: 15° C. — 88° C., resolution: 0.01° C.), and custom-built lateral and vertical microscopes for profile and plan views.

For simple compression tests, the molded elastomer feature was mounted with adhesive tape in the middle of the stage with temperature control, position control and force measurement. A clean microscope glass slide was mounted into the substrate holder, and two orthogonally positioned microscope cameras were aligned with the substrate holder (profile view) and the polymer sample (plan view). The feature was compressed against and detached from the glass slide by the stage movement control, while continuously monitoring the stage position, contact area and force data. The contact area could be determined at any time by image analysis (ImageJ). Pull-off work was calculated by integration of calculated tension-versus-displacement curves using a pull-off rate of 5 µm/s.

For compressions in the amorphous state (above $T_M$), the sample was equilibrated at 70° C., compressed against the glass slide by x mm (x=0.1, 0.3, 0.6, 0.9, 1.0) at 5 µm/s, held in position for 30 seconds, and then detached by x+0.1 mm. This procedure was repeated 10 times for each displacement. Force values obtained over repeated runs were averaged, and standard deviations for all points were less than 0.03 N. The standard deviations are not displayed in the figures because of their small values.

For compressions with phase transition, the sample was heated and equilibrated at 70° C., and then compressed against the glass slide by x mm at 5 µm/s (x=0.3, 0.6, 0.9). While held under static compression, the sample was cooled to 23° C. and left for 12 hours to complete crystallization. The sample was then detached from the glass slide at the pull-off rate of 5 µm/s, and the initial detachment forces were recorded.

Compression tests were also performed below $T_M$ on previously deformed features. To achieve this, sample features were first heated to 70° C., and then compressed against the glass slide by 0.6 mm at 5 µm/s. While held under static compression, the sample was cooled to 23° C. and left for 12 hours to fix the deformation. The sample was then detached from the glass slide. Deformed features were then compressed at 23° C. against the glass slide by x mm (x=0.15, 0.20, 0.25, 0.30, 0.35, 0.40, 0.45, 0.50, 0.55, 0.60, 0.70, 0.75) at 5 µm/s, held in position for 30 seconds, then detached by x+0.1 mm. This step was repeated 10 times for each displacement, and force values were averaged. The standard deviations for all points were less than 0.03 N. The standard deviations are not displayed in the figures because of their small values.

Contact delamination with stored elastic energy. A coverslip was placed between the polymer sample and the glass slide. At 70° C., the sample was compressed by x mm (x=0.3, 0.6, 0.9) at 5 µm/s, cooled to 23° C. under static compression. After cooling, the stage was lowered by x+0.1 mm to separate the coverslip from the glass slides, and the sample was heated back to 70° C. without load to complete the shape-memory cycle and to demonstrate the loss of the adhesive contact.

Results and Discussion

Figure 7:
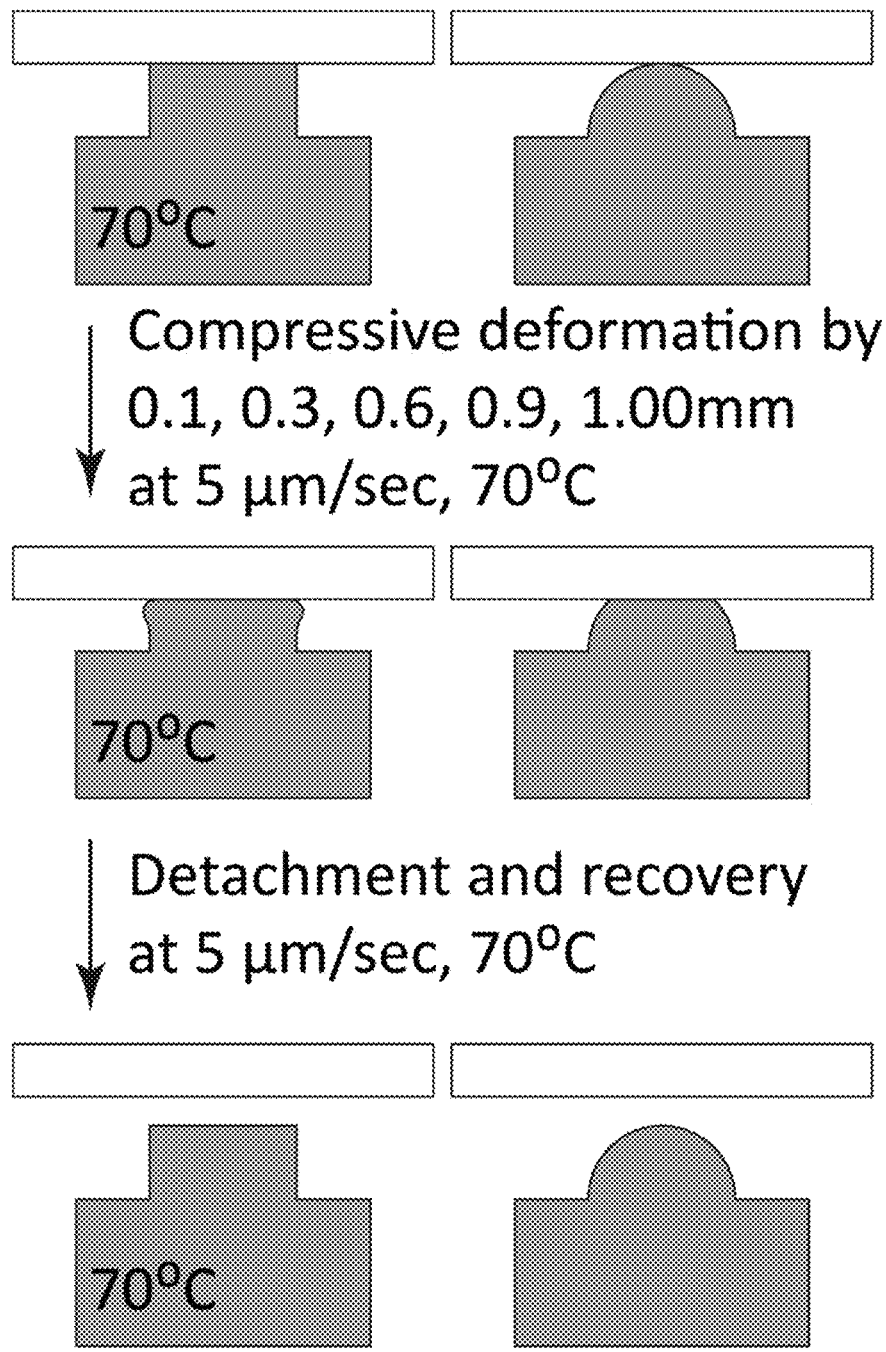
FIG. 7. Schematic elastic deformation experimental protocol.
Figure 8:
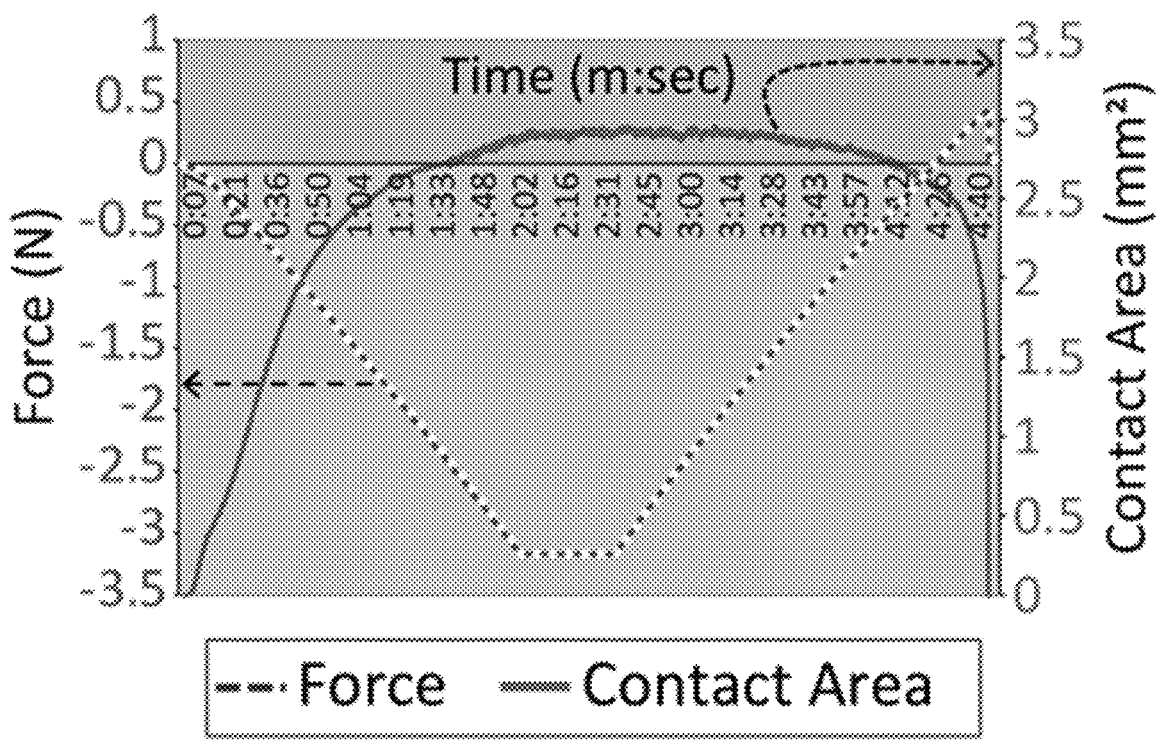
FIG. 8. Example of compression profile and contact area plot for the cylindrical feature deformation to 0.6 mm.
Figure 9:
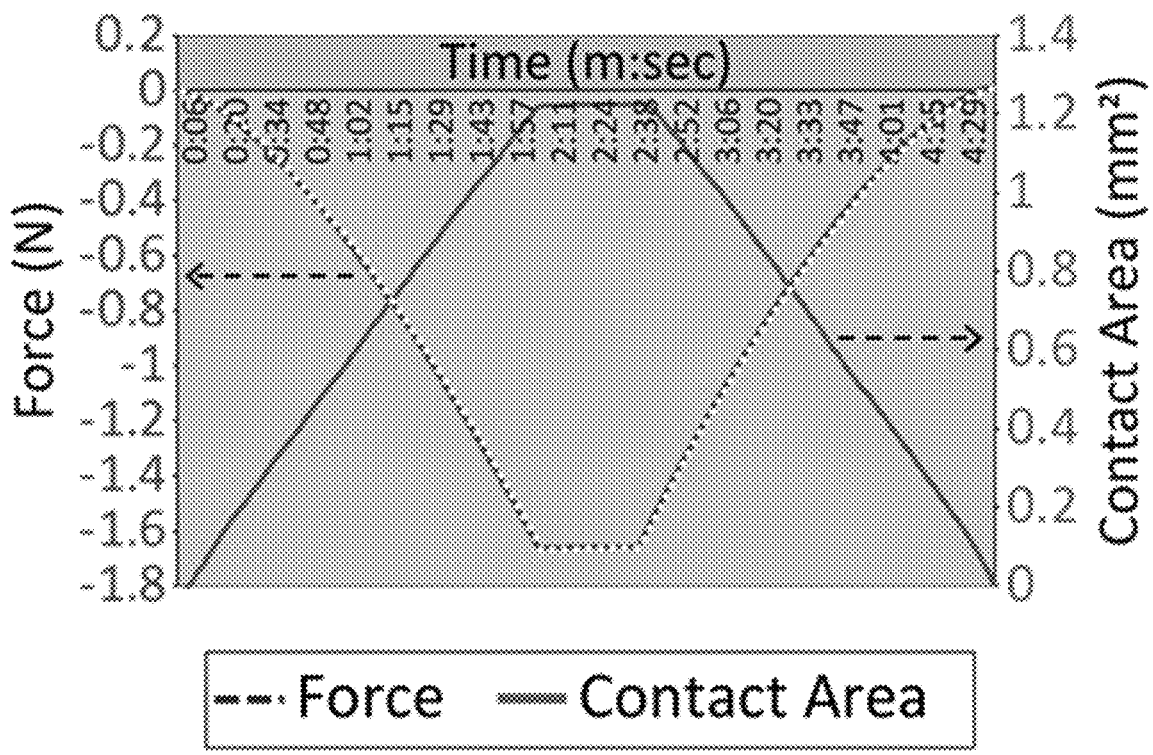
FIG. 9. Example of compression profile and contact area plots for the hemispherical feature deformation to 0.6 mm.
Figure 10:
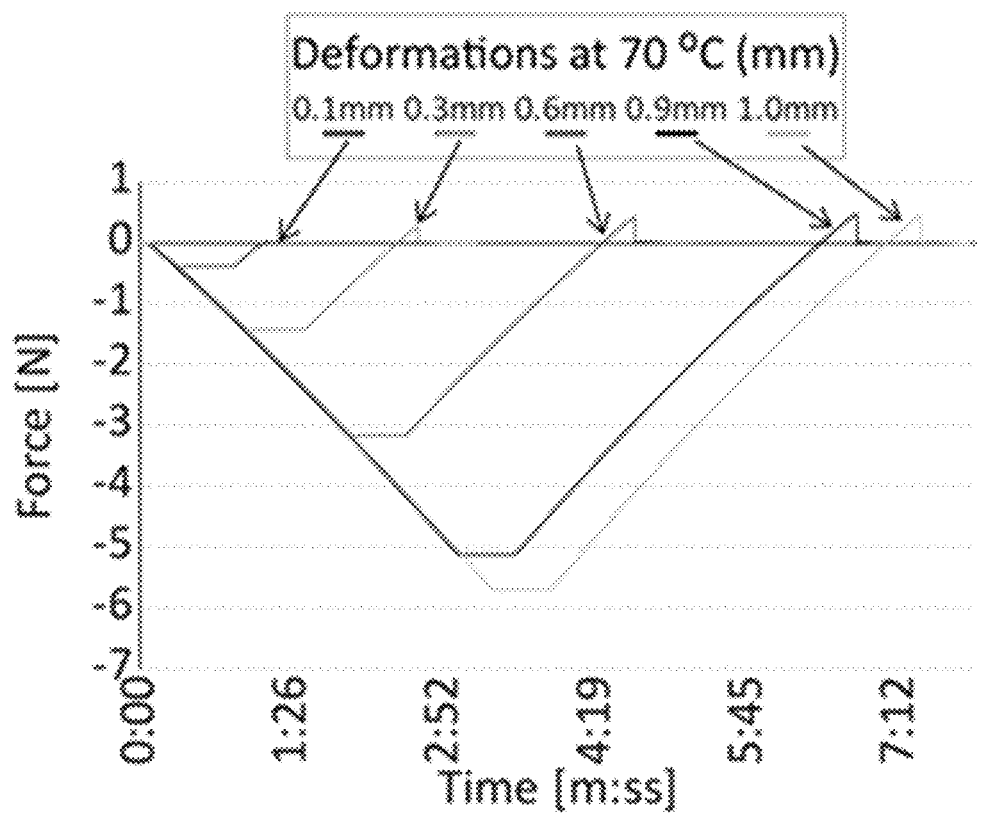
FIG. 10. Compression profile/force evolution as a function of time at different compressive deformations for the cylindrical features at 70° C. (T>$T_M$).
Figure 11:
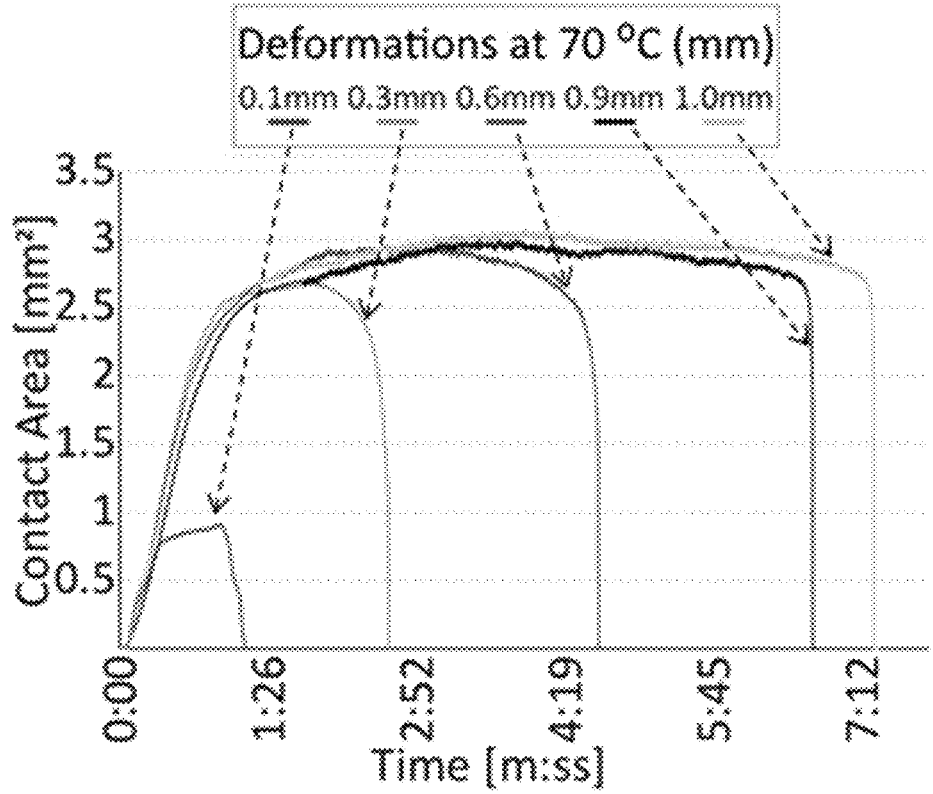
FIG. 11. Contact area plot as a function of time at different compressive deformations for the cylindrical features at 70° C. (T>$T_M$).
Figure 12:
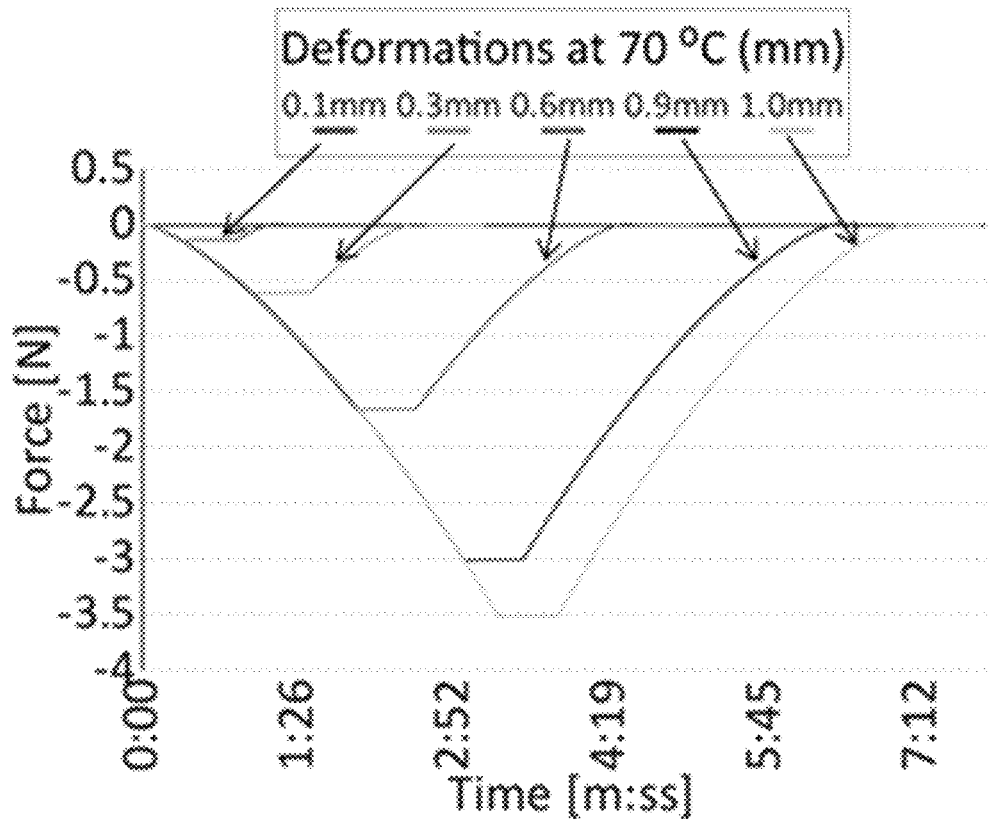
FIG. 12. Compression profile/force evolution as a function of time at different compressive deformations for the hemispherical features at 70° C. (T>$T_M$).
Figure 13:
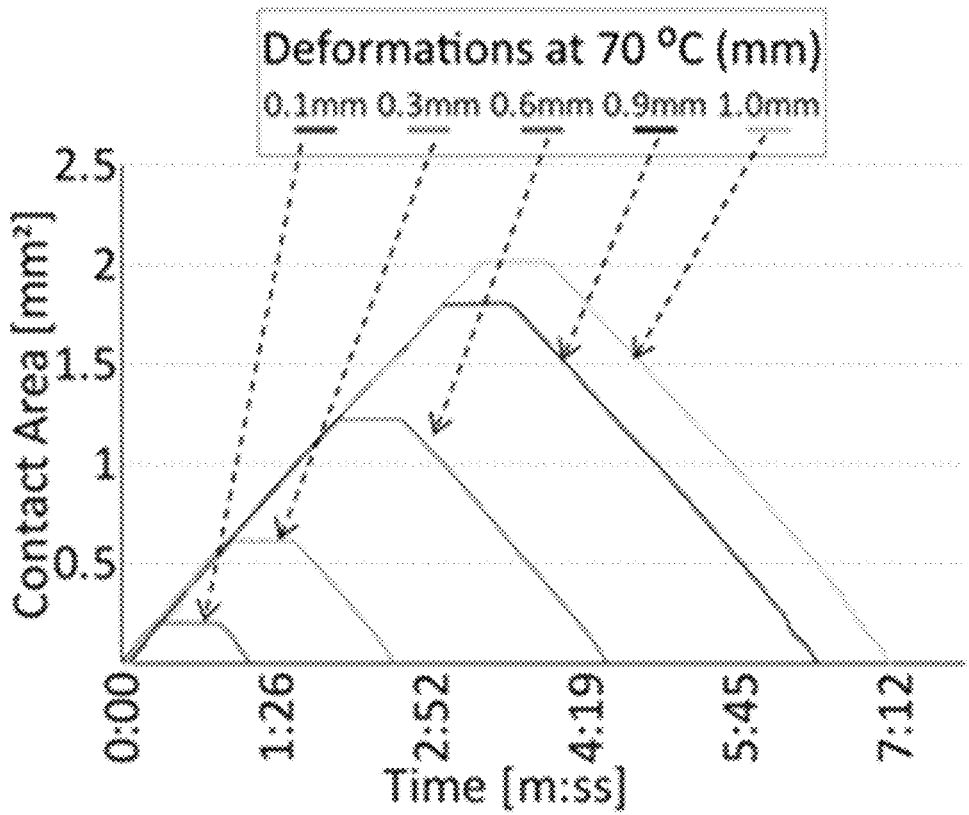
FIG. 13. Contact area plot as a function of time at different compressive deformations for the hemispherical features at 70° C. (T>$T_M$).
Figure 14:
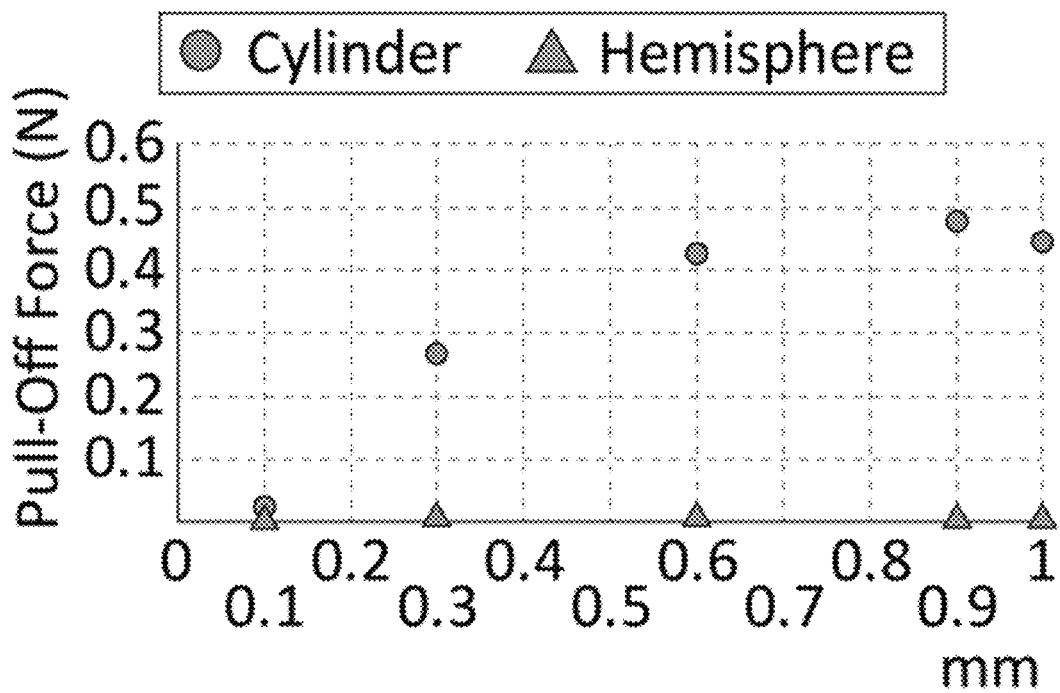
FIG. 14. Experimental data of pull-off force as a function of the total displacement for the cylindrical (circles) and hemispherical (triangles) features.
Figure 15:
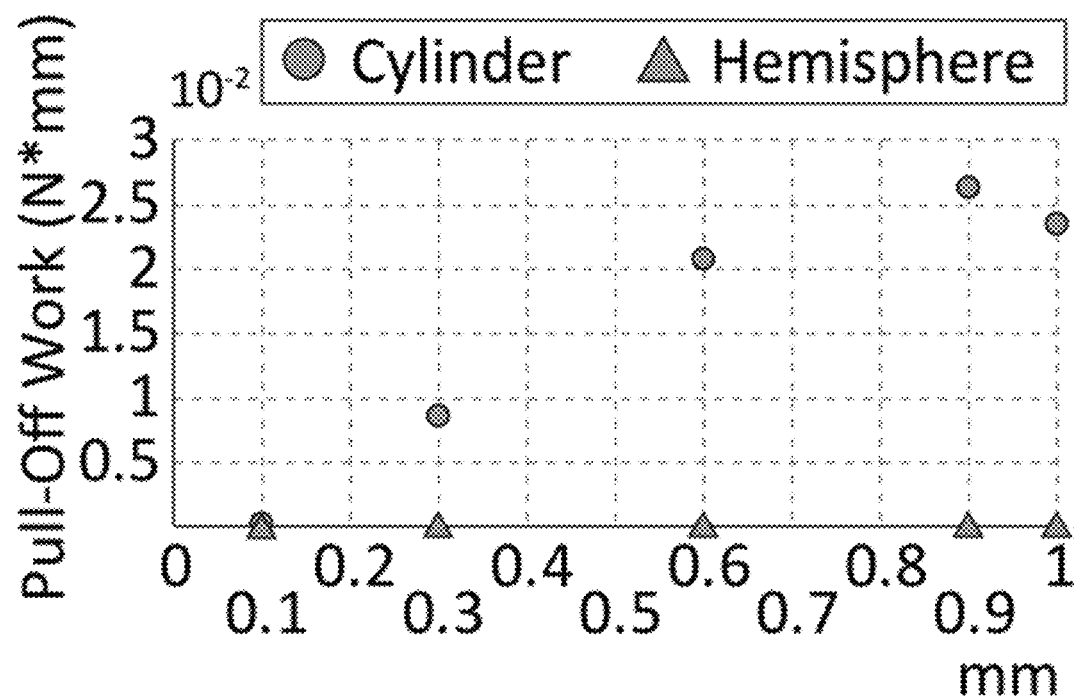
FIG. 15. Experimental data of pull-off work as a function of the total displacement for the cylindrical (circles) and hemispherical (triangles) features.
Figure 16:
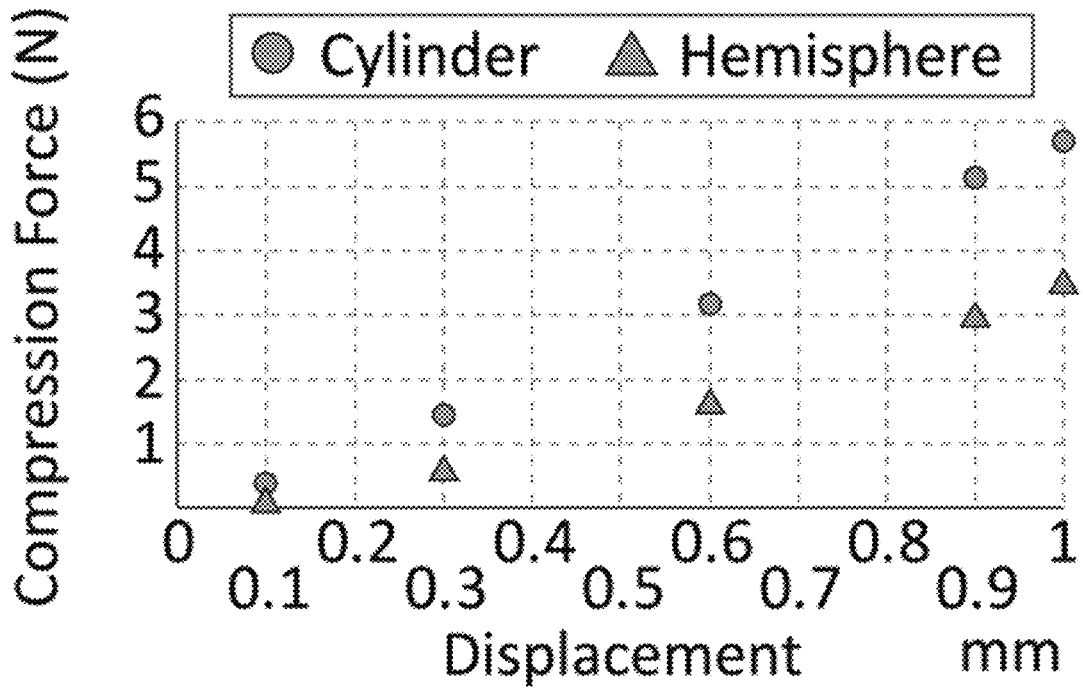
FIG. 16. Experimental data of maximum compression force as a function of the total displacement for the cylindrical (circles) and hemispherical (triangles) features.
Figure 17:
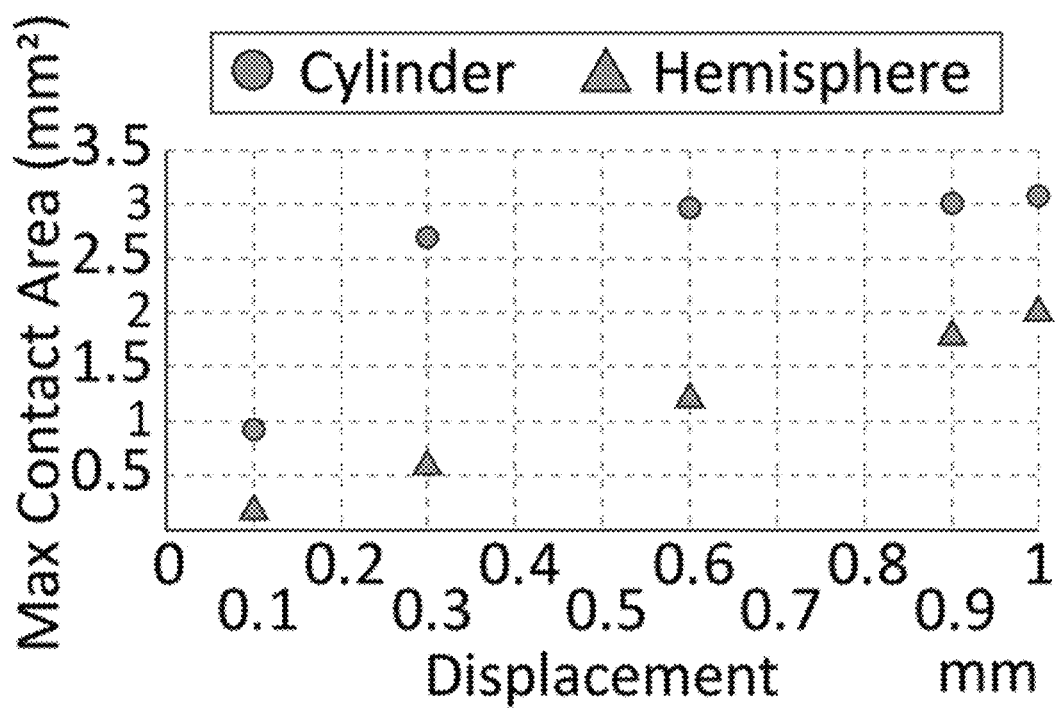
FIG. 17. Experimental data of maximum contact area as a function of the total displacement for the cylindrical (circles) and hemispherical (triangles) features.

Compressive deformation and adhesion above transition temperature. Compression experiments on shape-memory features were conducted to quantify how the adhesive force and contact area depend on feature geometry and load. Two feature geometries were examined (i) hemispheres that gradually increase their contact area and (ii) cylinders that maintain a relatively constant contact area (FIG. 7). The molded feature was heated to 70° C. and compressed at a constant rate (5 µm/s) in the z-direction against a mounted glass slide to various displacements ranging from 0.1 mm to 1 mm Following each compression, the mechanical load was reduced until the stamp experienced slight tension and separated from the glass slide. FIG. 8 and FIG. 9 shows examples of both force and contact area plotted against time for compression of the cylindrical and hemispherical features by 0.6 mm. The complete set of compressions to other displacements are included in FIG. 10-FIG. 13. FIG. 14 and FIG. 15 show the "pull-off force" and the "pull-off work" calculated as the integral of force and measured displacement. For the 0.3 mm to 1.0 mm displacements of the cylindrical features, a positive adhesive force was recorded when the stamp was separated from the glass slide. However, negligible adhesive contacts were measured as deformed hemispherical feature were unloaded. These results agree with the contact area measurements, in which the cylindrical feature establishes and maintains large contact area at all deformations from 0.3 mm to 1.0 mm, whereas the maximum contact area of the hemispherical feature linearly increases with the applied loading force (FIG. 17). FIG. 16 shows the maximum compression force as a function of the total displacement.

Figure 18:
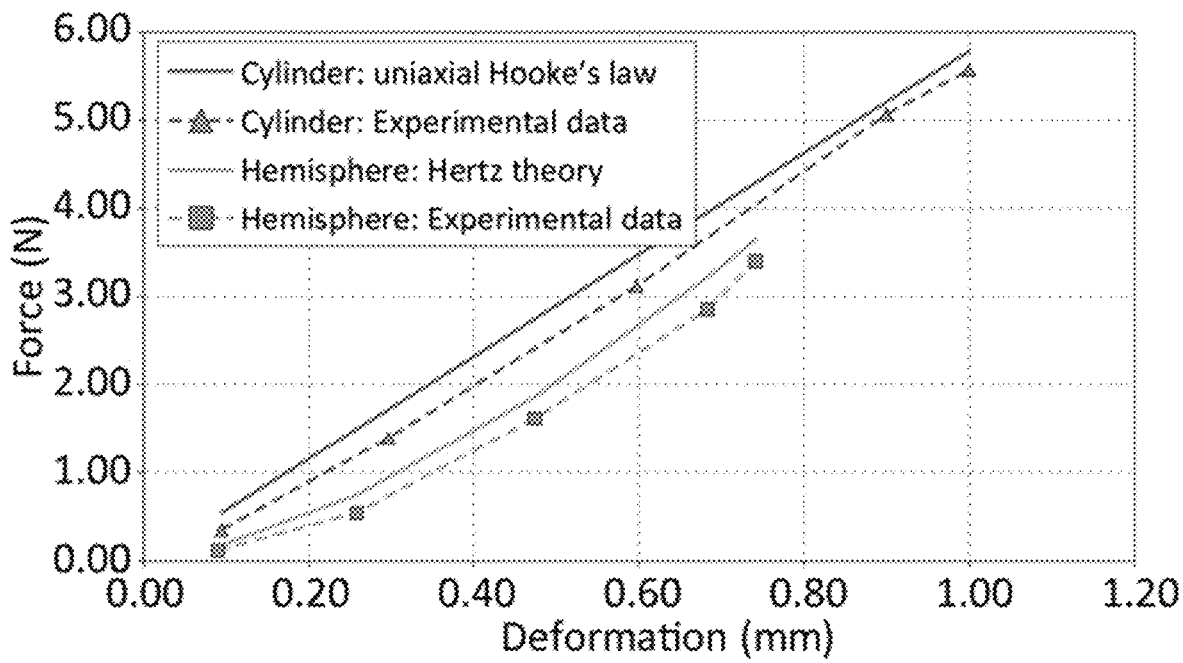
FIG. 18. Analytical solution (cylinder), Hertz theory calculation (hemisphere), and experimental data (cylinder and hemisphere) of the compressive force as a function of the vertical deformation length.
Figure 19:
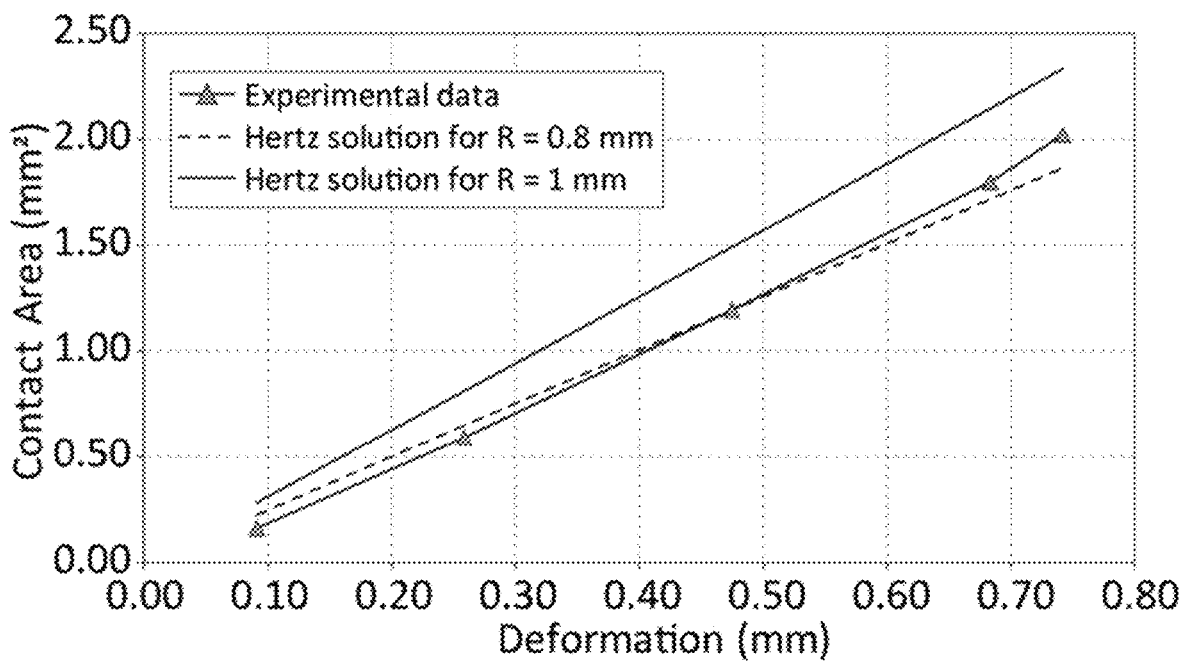
FIG. 19. Hertz theory calculations and experimental data (hemisphere for R=1 mm) of the hemispherical feature contact area as a function the vertical deformation length.

The contact mechanics of the elastic cylindrical and hemispherical features was analyzed numerically and also using Hertz contact theory to predict compression force, F, and contact area, $a_c$, as a function of vertical deformation, $\Delta$, for a given feature geometry. The numerical simulations used ABAQUS 2017 and assumed a purely elastic constitutive material (E=4.2 MPa) to allow comparisons with the Hertz theory. The comparison of experimental and model results is shown in FIG. 18 and FIG. 19. For the cylindrical features subjected to compressive deformation along its length, the force scales nearly linearly with compressive deformation, as predicted by simple uniaxial elasticity (Equation 1):

$$F = EA\delta/L \quad (1)$$

where E is the Young's modulus of the material, A is the cross-sectional area of the cylinder, L is the length of the cylinder, $\delta$ is the compressive displacement of the cylinder and F is the force applied. For the hemispherical features, the Hertz theory predicts a sub-quadratic dependence of force on deformation, with $F \sim d^{3/2}$ (Equation 3). Accordingly, relationships between force, displacement and contact area are given by:

$$a = \sqrt{Rd} \quad (2)$$

$$F = \frac{4}{3} E^* R^{1/2} d^{3/2} \quad (3)$$

$$a^3 = \frac{3FR}{4E^*} \quad (4)$$

where R is the radius of curvature of the hemisphere, d is the displacement of the hemisphere, and E* is the effective Young's modulus of the material. These analytical results are in good agreement with the finite element prediction. Likewise, the dependence of contact area on deformation is in good agreement with the analytical and computational results. For the cylindrical features the contact area is essentially unchanged, and, for the hemispherical features, Hertz theory predicts a linear dependence of contact area on deformation, as shown in FIG. 19. The disagreement between Hertz and the experimental results can be due to the slightly changing radius of curvature of the hemispherical feature with continuing deformation, and, possibly, a small dependence of elastic properties on deformation. In FIG. 19 it is demonstrated that a smaller radius of curvature provides a good agreement between the experimental data and this simple Hertz model.

In summary, elastic compression can predictably deform surface features and raise the feature-substrate contact area, but compression alone is ineffective in establishing and controlling interfacial adhesion because the elastic energy deposited into the material during compression is reversibly stored and performs work during unloading that overcomes any adhesive contact that was made.

Shape-Memory Assisted Adhesion through thermally induced phase-transition deformation. To demonstrate that thermo-mechanical programming of the shape-memory polymers can be used to modulate interfacial adhesion, semicrystalline polycaprolactone polymer (PCL-SP) hemispherical stamps were used. Following FIG. 20, hemispherical features were compressed to three different displacements (0.3 mm, 0.6 mm and 0.9 mm) at elevated temperature to increase their contact area and then were cooled below their crystallization point to freeze-in the temporary deformed "fixed" state, thereby storing elastic strain energy. Subsequently, features were detached from the glass slides to measure the adhesive interactions. Force traces are provided in FIG. 21. Results for process will be discussed in stages.

Figure 20:
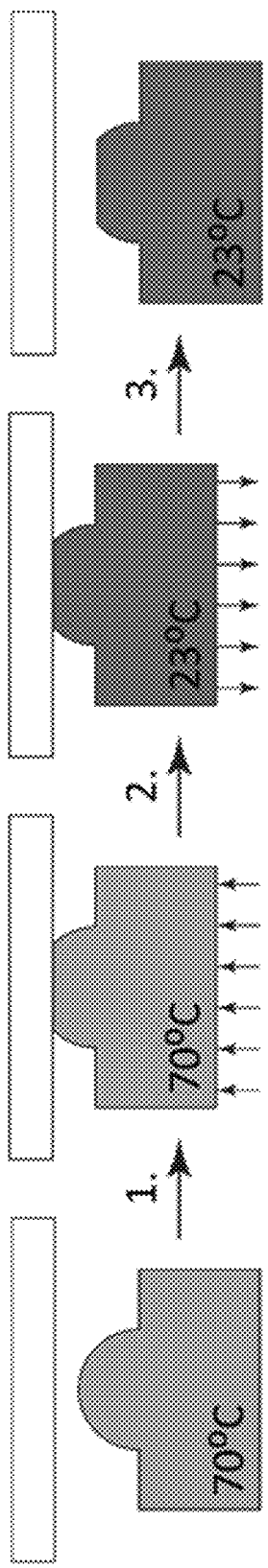
FIG. 20. Schematic illustration of shape-memory assisted adhesion experiments.
Figure 21:
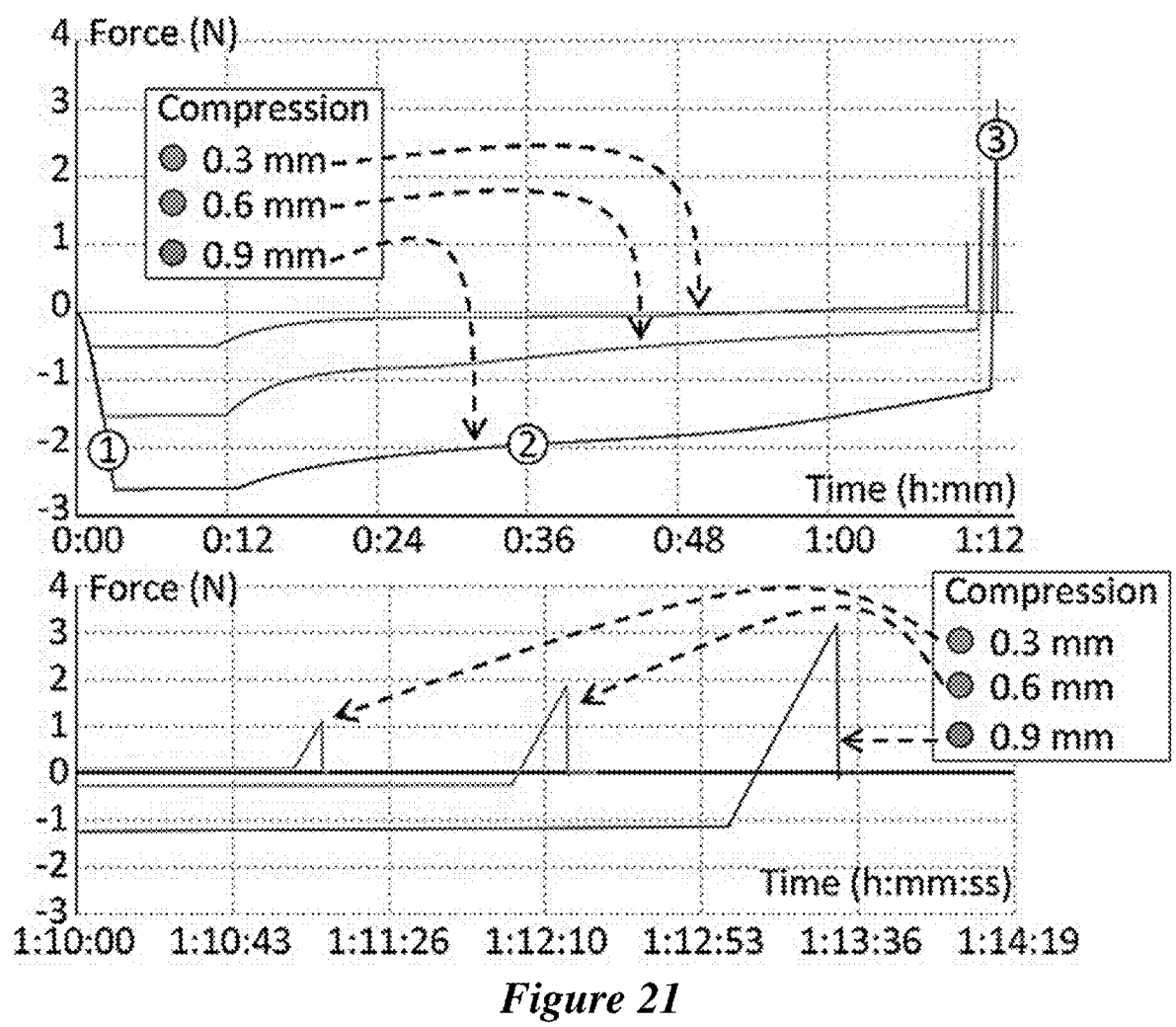
FIG. 21. Compression profiles as a function of time for the hemispherical feature during thermomechanical programming (1) elastic compression at 70° C.; (2) cooling to 23° C.; (3) separation from the glass slide at 23° C.
Figure 22:
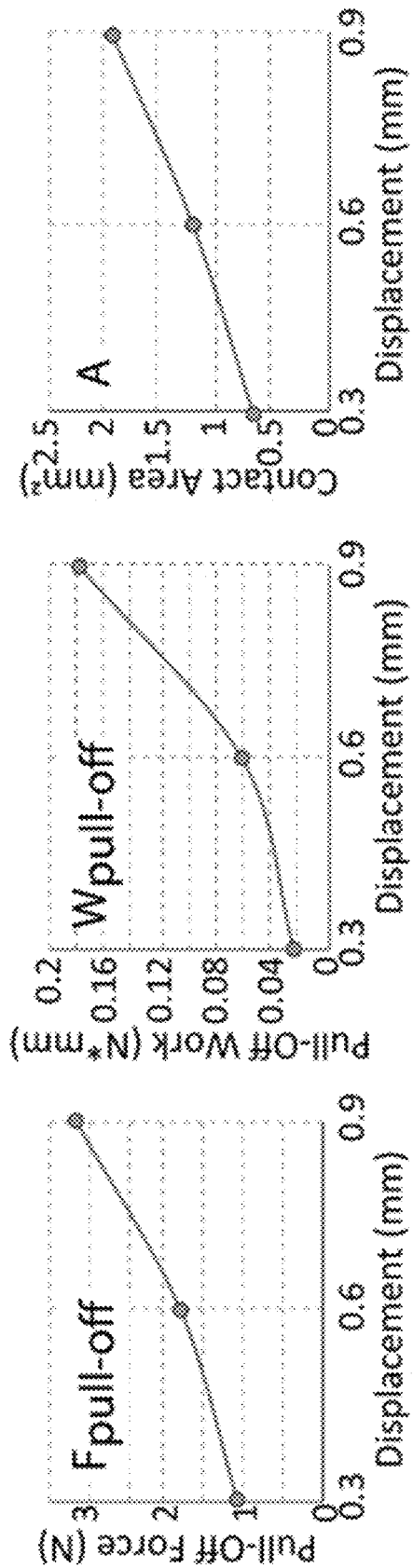
FIG. 22. Experimental data of pull-off force (left panel), pull-off work (center panel), and maximum contact area (right panel) as functions of shape-memory-assisted deformation displacement.
Figure 23:
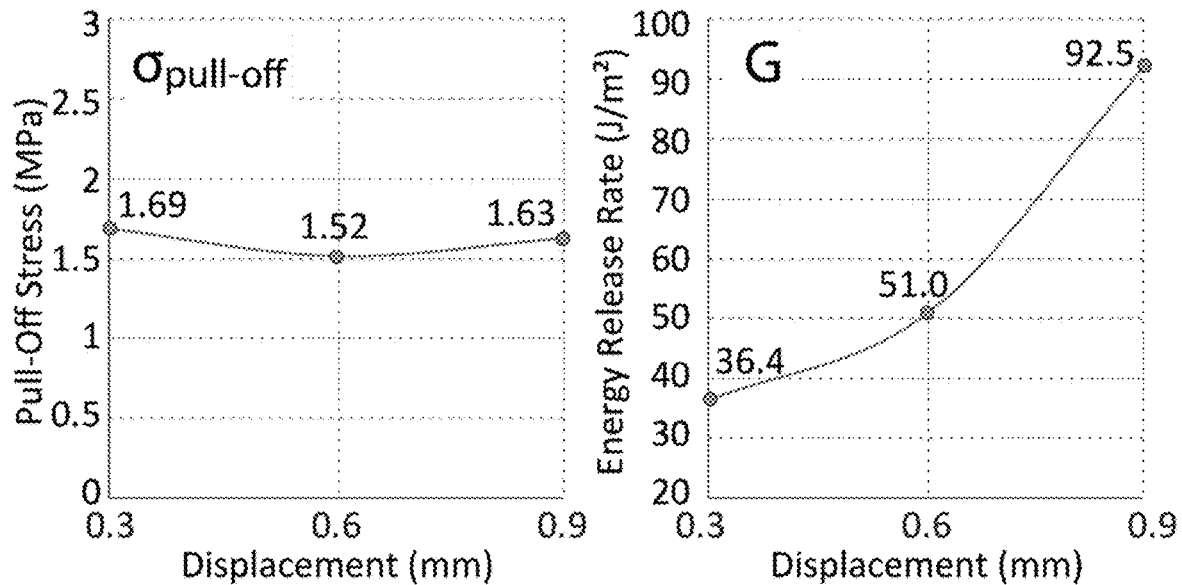
FIG. 23. Pull-off stress (left panel) and total energy release rate (right panel) as functions of shape-memory-assisted deformation displacement.

First, following compression and cooling (steps 1, 2 and 3 in FIG. 21), the deformed stamp was separated from the glass substrate to measure the initial pull-off force and the pull-off work (FIG. 20 and FIG. 22). FIG. 21 shows that a tensile force, applied to the attached feature, elastically stretches the polymer before separating it from the glass substrate (step 3 in FIG. 21). FIG. 22 shows that the maximum contact area (A), the maximum pull-off force ($F_{pull-off}$), and the pull-off work ($W_{pull-off}$) required to separate the compressed, crystallized feature all increase with the deformation displacement. These findings confirm that the increase in contact area of the shape-fixed hemispherical feature increases interfacial adhesion. It is hypothesized that during the elastic compression, the stamp and the glass interfaces achieve conformal Van der Waals contact, maximizing the amount of the adhesive interactions per unit area. In this regime, the separation pull-off force is mainly determined by the contact area, and the pull-off stress ($\delta_{pulloff}$) required to separate two interfaces largely depends on the types of the molecular interactions between the stamp and the glass slide. This notion is supported by the nearly constant pull-off stress observed following different load displacements (FIG. 23).

It was also observed (FIG. 23) that the total energy release rate, G, increases as a function of maximum contact area, A. The overall energy release rate is defined as the pull-off work per unit of contact area and can be divided into two terms: $G_{str}$, work per area required to elastically stretch the elastic feature and backing layer, and $G_{int}$ the work per area to break short-range, adhesive interactions. The experimental measurement of pull-off work is related to $G_{int}$ and $G_{str}$ by equation:

$$W_{pull-off} = W_{int} + W_{str} = GA = (G_{int} + G_{str})A \quad (5)$$

The JKR model was employed to estimate contributions of adhesive interactions and elastic deformations to the overall energy release rate (Johnson K L et al. *Proceedings of the Royal Society of London. A. Mathematical and Physical Sciences* 1971, 324(1558), 301-313). The interfacial energy release rate ($G_{int}$) of the glass-stamp interface was calculated from the measured pull-off force ($F_{pull\_off}$) and contact area (A). Here, it was assumed that the top surface of the deformed, semicrystalline feature can be modeled as a large hemisphere of radius $R_{eff}$ making a contact to a flat and rigid glass interface, allowing for the following relationships:

$$A = \pi\left(\frac{9}{8}R_{eff}^2 \pi \frac{G_{int}}{E^*}\right)^{\frac{2}{3}}; E^* = \frac{E}{1-v^2} \quad (6)$$

$$F_{pull-off} = \frac{3}{2}G_{int}\pi R_{eff} \quad (7)$$

where A is the contact area; $R_{eff}$ is the effective radius of the contacting elastic hemisphere; $E^*$ is the strain elastic modulus; E is Young's modulus (175 MPa for semicrystalline polycaprolactone at 23° C.); and v is Poisson's ratio (½ for polycaprolactone).

Here, the $R_{eff}$ is different and larger than a nominal radius R of the undeformed hemispherical feature. Under these assumptions, the unknown $G_{int}$ can be calculated from the measured $F_{pull-off}$ and A and polymer's strain elastic modulus $E^*$:

$$G_{int} = \frac{F_{pull-off}^2 \pi^{1/2}}{2A^{3/2}E^*} \quad (8)$$

Figure 24:
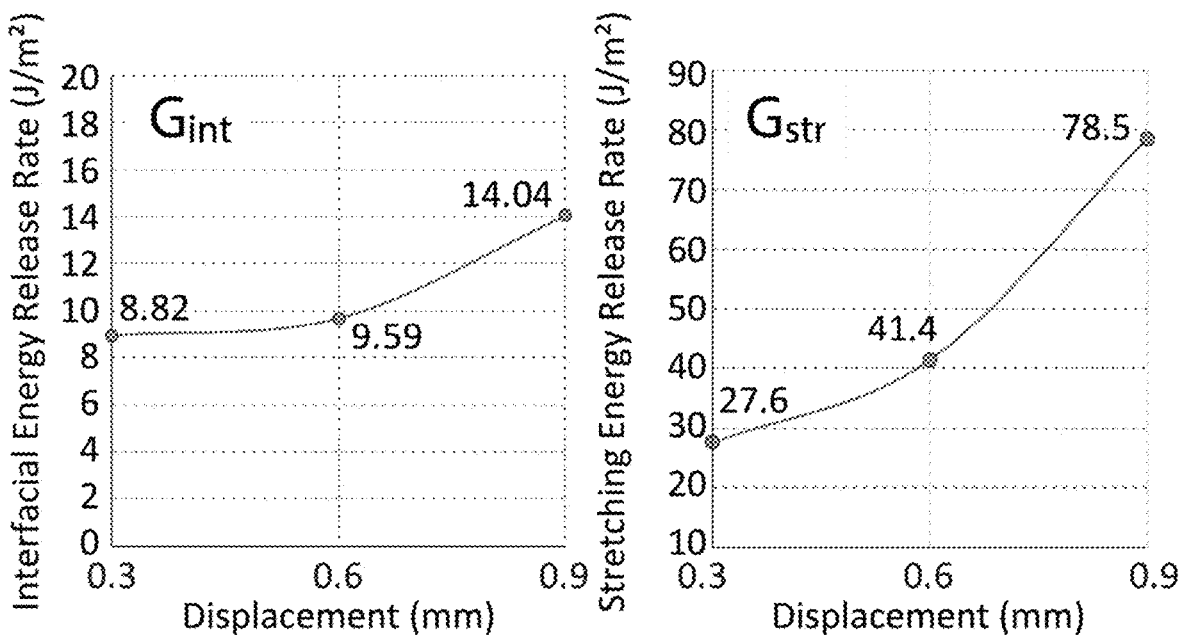
FIG. 24. Interfacial energy release rate ($G_{int}$) and stretching energy release rate ($G_{str}$) as functions of shape-memory-assisted deformation displacement.

FIG. 24 shows that the interfacial energy release rate mainly comprises elastic stretching of the bulk material with a smaller portion of energy attributed to separation of the two interfaces. The interfacial energy release rate changes only slightly as a function of the initial deformation, whereas the stretching energy release rate depends significantly on the initial deformation and the contact area between the hemispherical feature and the glass slide.

Results confirm that thermo-mechanical programming of the hemispherical shape-memory polymer's features can modulate interfacial adhesion. The data also show that both the overall change in contact area and the amount of stored elastic energy affect the amount of work required to separate the polymer from the glass substrate, and that the work spent in elastic stretching is larger than the work required to overcome the adhesion. These findings indicate that, in practical applications, the adhesive contact in phase-transitioning shape-memory polymer materials should be established based on the amount of expected pull-off force, rather than by maximizing the total contact area and increasing the overall work of adhesion. These experiments demonstrated that even small initial deformations in the elastic state at $T>T_M$ produce fully conformal contacts with maximized interfacial interactions, and that the additional work spent on deforming the polymer to maximize its contact area mostly contributes to the energy required to stretch the stiff polymer at $T<T_M$ before it can be separated from the substrate.

Deformations and Adhesive Interactions in the Compressed Semicrystalline State. In this section it is demonstrated, that, in addition to the thermo-mechanical programming of the shape-memory polymer features, their adhesive interactions can be modulated by the additional deformation in the compressed semicrystalline state.

Figure 25:
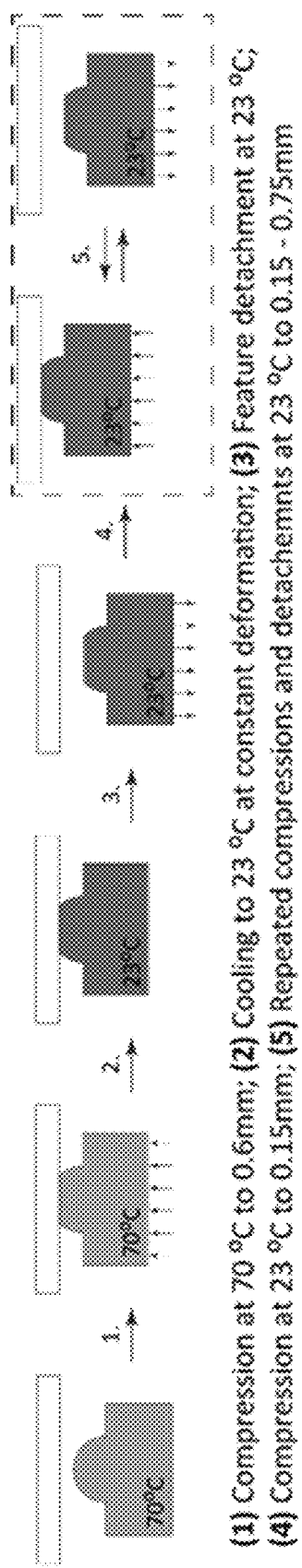
FIG. 25. Schematic illustration of compression tests on pre-deformed features at 23° C.
Figure 26:
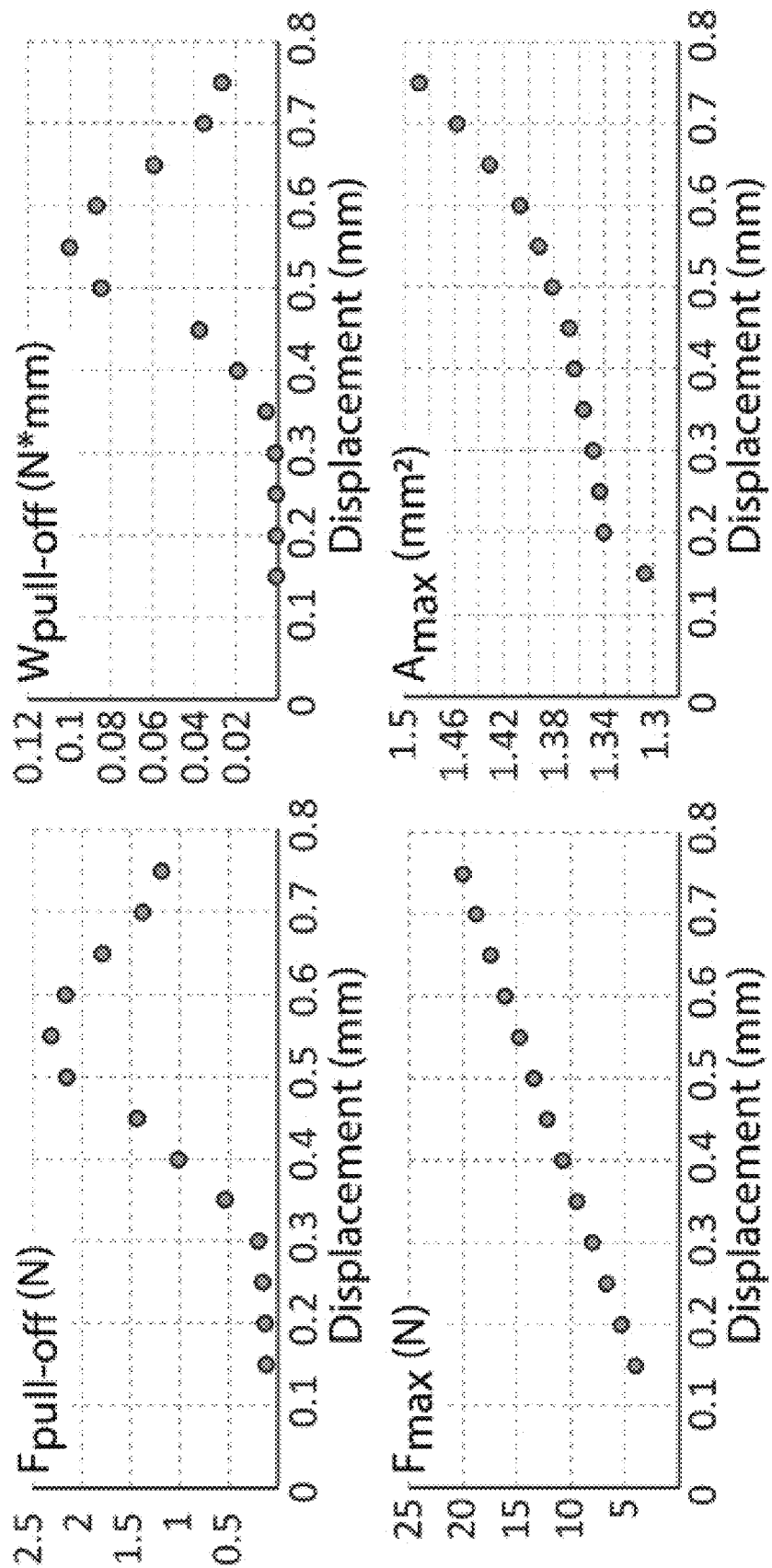
FIG. 26. Experimental data of pull-off force (upper left panel), pull-off work (upper right panel), maximum compression force (bottom left panel), and maximum contact area (bottom right panel) as functions of the deformation at 23° C. (the deformation in addition to the initial deformation in step 1).
Figure 27:
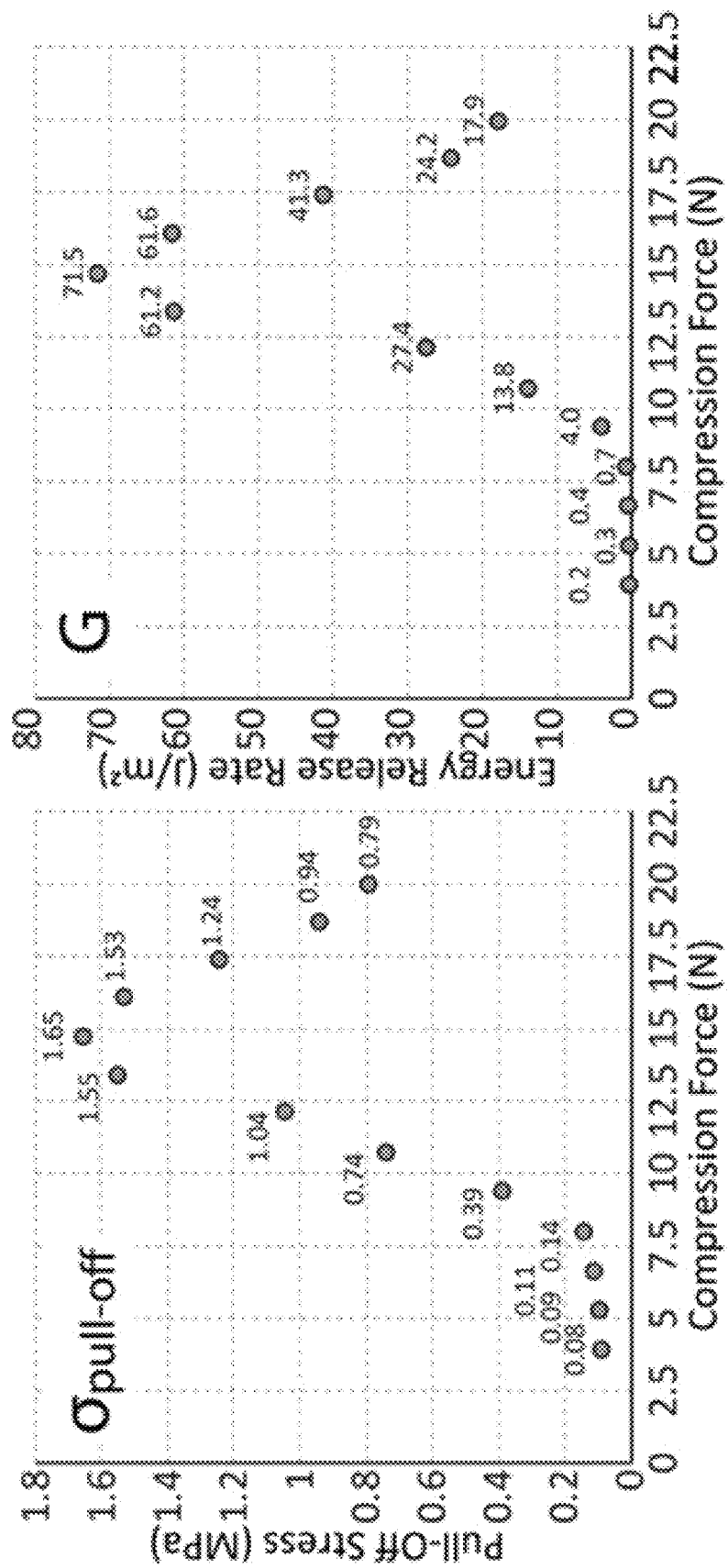
FIG. 27. Pull-off stress (left panel) and total energy release rate (right panel) as functions of the deformation at 23° C.
Figure 28:
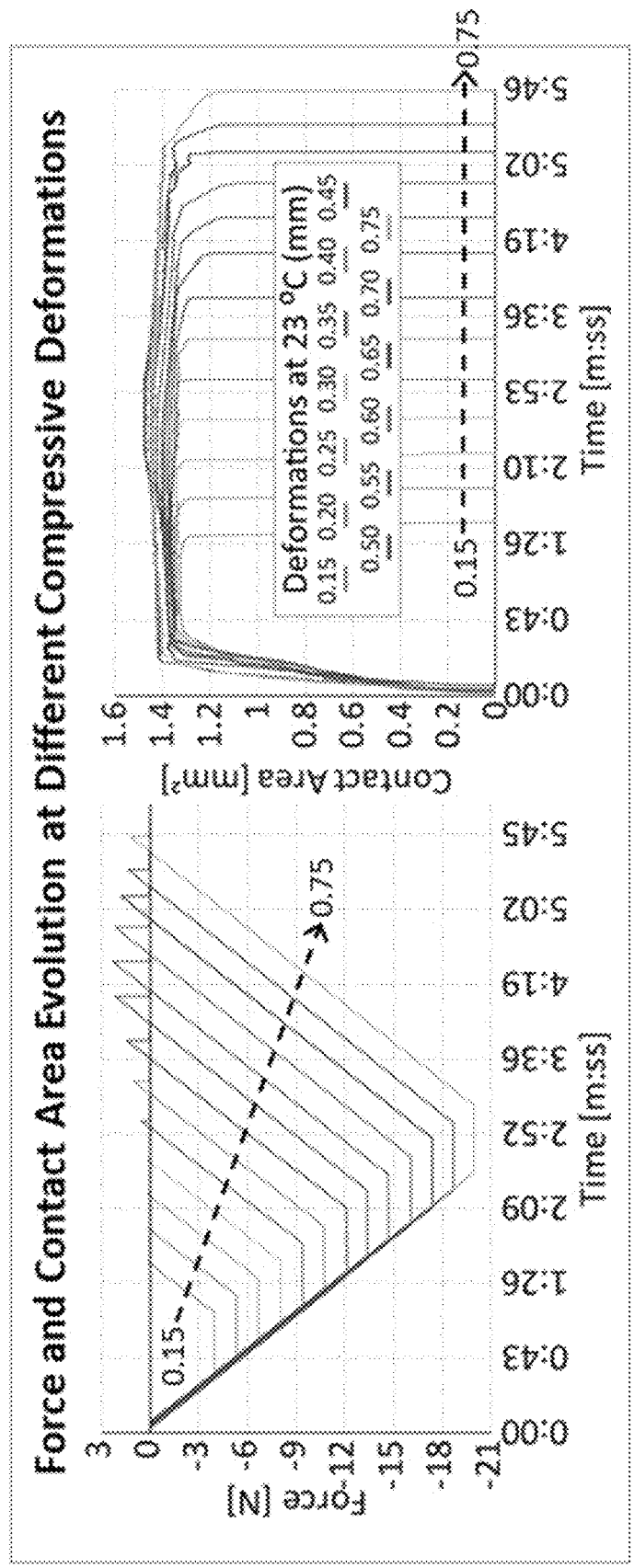
FIG. 28. Compression and contact area profiles as a function of time for the compressed hemispherical feature at 23° C.

In these experiments, a hemispherical semicrystalline polycaprolactone polymer feature at 70° C. was compressed to 0.6 mm against the glass slide and cooled with the deformation held in place to 23° C. After the feature was separated from the glass slide (initial pull-off), the stage was brought back to −0.6 mm position and calibrated as 0 mm. Then, the flattened feature was repeatedly compressed into and detached from the glass slide at 23° C. by additional displacements of 0.15-0.75 mm (FIG. 25, step 5). The pull-off force ($F_{pull-off}$), pull-off work ($W_{pull-off}$), maximum contact area ($A_{max}$), and maximum compression force ($F_{max}$) were plotted as functions of the additional displacement at 23° C. (FIG. 26); the pull-off stress ($\delta_{pull-off}$, pull-off force per unit area) and energy release rate (G, pull-off work per unit area) were plotted as functions of the maximum compression force during the additional cold displacement (FIG. 27 and FIG. 28). The maximum contact area and the compression force both continuously increase with the additional displacement (FIG. 26). However, the pull-off force and the pull-off work have maximum values at the intermediate cold displacement of 0.55 mm (FIG. 26). These results suggest that the adhesive interactions between the flattened semicrystalline polycaprolactone polymer feature and the glass slide were maximized at 0.55 mm displacement, and then weakened after the feature was compressed into the slide beyond 0.55 mm Correspondingly, the pull-off stress and the energy release rate were also maximized at the same 0.55 mm compression and the same maximum compression force of 14.7 N (FIG. 27).

It is hypothesized that the observed decrease in the pull-off stress and energy release rate at high compressive forces is due to deforming the polymer laterally along the polymer-glass interface. The increase in the maximum contact area with the additional displacements suggests that the flattened hemispherical feature continues to deform with increasing compressive forces. At compressions below 0.55 mm (compression force <14.7 N) the pull-off stress is also increasing with additional displacement up to the maximum value of 1.65 MPa. The shape-memory assisted adhesion experiments show that the same maximum pull-off stress of ~1.6 MPa for the semicrystalline polycaprolactone polymer is achieved when the elastic feature at $T>T_M$ is compressed into the substrate and then cooled below $T_M$. Therefore, up to the maximum pull-off stress of 1.65 MPa, compressions of the flattened semicrystalline feature lead to the strengthening of the adhesive contact by maximizing the conformity of the polymer-glass interface. Beyond this threshold value, the interface is no longer capable of increasing contact interactions, and the polymer material must deform laterally along the interface to accommodate the increasing compressive force. It is possible that such lateral flow degrades the quality of the adhesive contact leading to the decrease in both the pull-off stress and the total interfacial energy release rate.

These experiments show that the adhesive contact of the semicrystalline polycaprolactone polymer can be maximized through compressive deformations at $T<T_M$. Measurements of the pull-off stress indicate that the conformity of the polymer-glass interface achievable at cold compressions in the semicrystalline state can be comparable to the fully conformal contacts established in the elastic state at $T>T_M$, however a much higher compressive force (14.7 N vs 1.8 N) is needed to achieve this state at $T<T_M$. At the same time, the total energy release rate required to separate deformed interface at the maximum pull-off stress is higher than the energy release rate required for the separation of the contact produced by crystallization. It is possible, therefore, that cold compression of the shape-memory materials at $T<T_M$ can be used as an additional method to modulate the adhesion especially in temperature-sensitive applications.

Modeling of the Adhesive Interactions in the Compressed Semicrystalline State. To better understand the mechanism of cold-adhesion modulation, ABAQUS was used to create two models to represent the compression and adhesion behavior of the crystallized hemispherical semicrystalline polycaprolactone polymer stamp at 23° C. after an initial compression of 0.6 mm. It was observed (FIG. 26) that the slope of the contact area—displacement curve is very small, indicating the possibility of a local non-uniform hardening elastic response. To explore this working hypothesis, the pre-compressed semicrystalline polycaprolactone polymer hemispherical stamp was modeled as a combination of stiff and compliant material. This idea will be further examined in relation to the experimental data.

Adhesion between the pre-compressed stamp feature and the glass slide is modeled in ABAQUS using a local interfacial constitutive law, whereby local non-linear adhesion behavior is represented by a traction-separation law (TSL). The traction-separation law is governed by three parameters: an effective initial elastic stiffness $K_{nm}$ (units of N/mm²/mm) relating the traction to separation at the interface; the maximum traction $t_{n,max}$ at which adhesion begins to degrade; and the maximum separation max at which adhesion is entirely lost. Mathematically the traction-separation law can be expressed as (FIG. 29):

$$\begin{Bmatrix} t_n \\ t_s \\ t_t \end{Bmatrix} = \begin{bmatrix} K_{nn} & K_{ns} & K_{nt} \\ K_{sn} & K_{ss} & K_{st} \\ K_{tn} & K_{ts} & K_{tt} \end{bmatrix} \begin{bmatrix} \varepsilon_n \\ \varepsilon_s \\ \varepsilon_t \end{bmatrix} \qquad (9)$$

Figure 29:
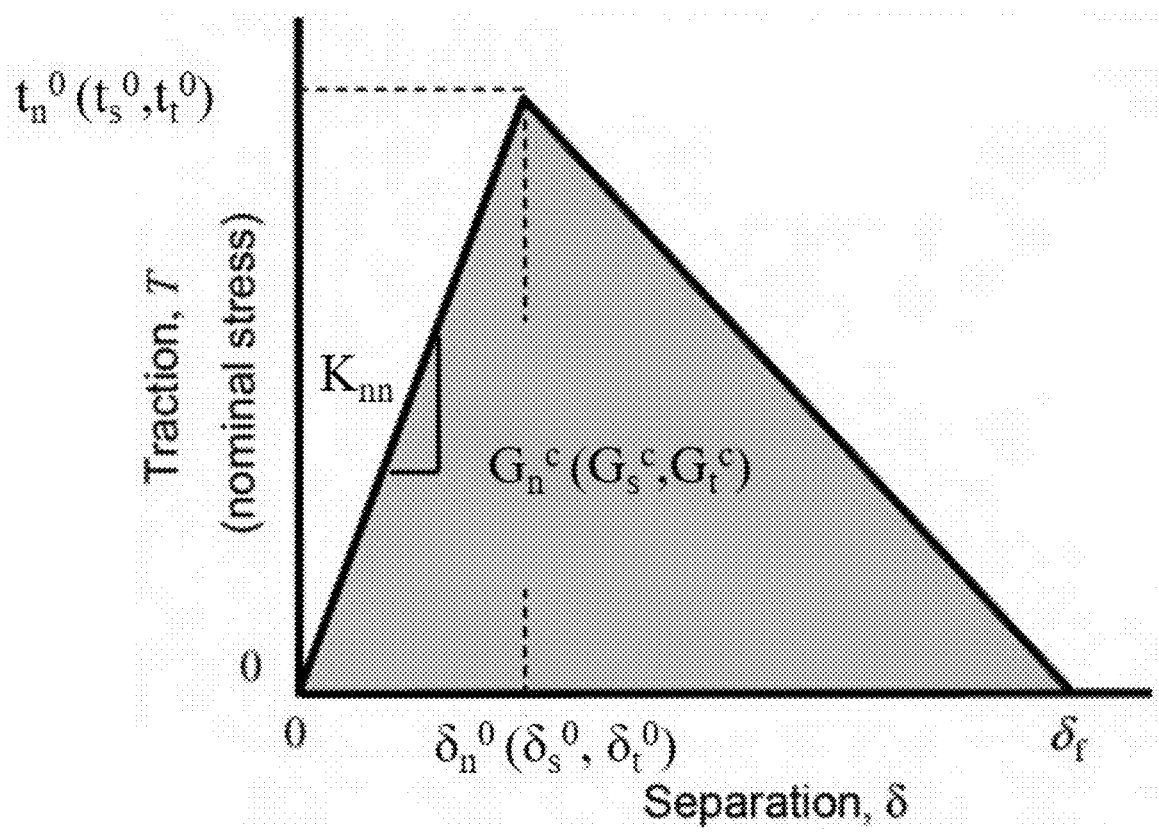
FIG. 29. Local traction-separation relationship describing the adhesive behavior at the interface. The area under the curve $G^c$ represents the total pull-off work.

The progressive local damage modeling of the adhesive interaction is considered to be linear as indicated by the curve after damage initiation (FIG. 29). The area under the traction-separation curve represents the pull-off work of the adhesive interaction (FIG. 29). In other words, it is the total interfacial energy expended in delamination of the stamp-glass interface, and the local traction separation law can relate local interface behavior to the experimentally measured averaged parameters.

Figure 30:
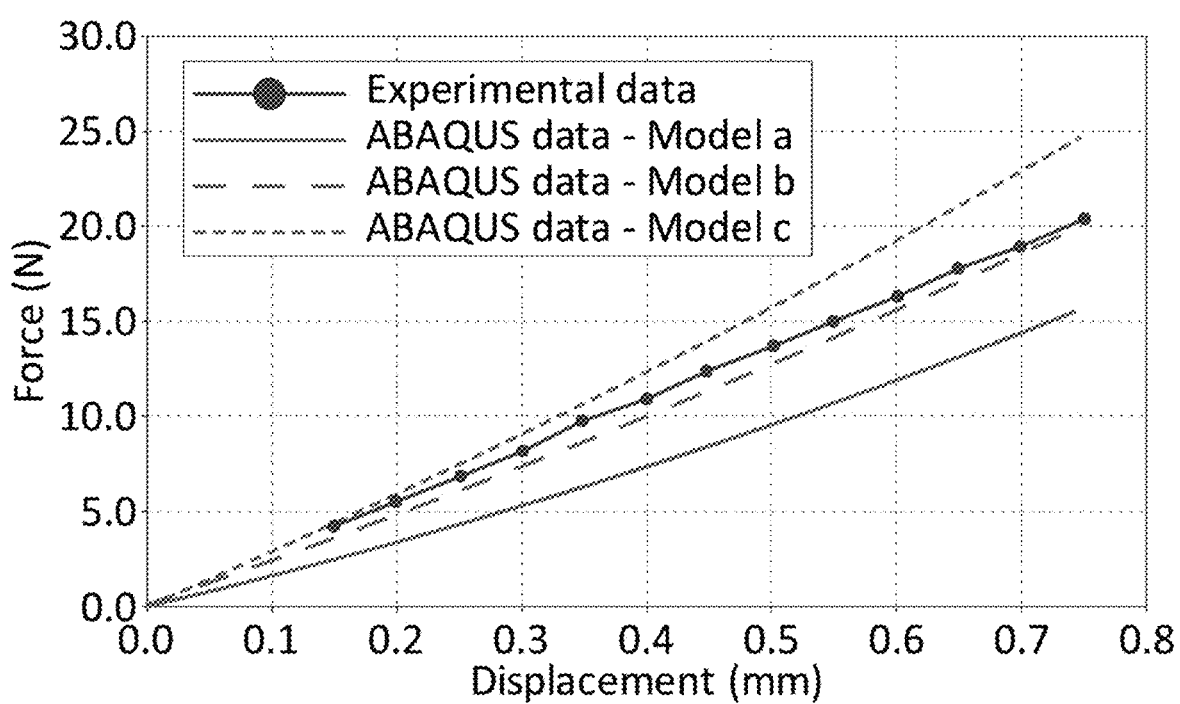
FIG. 30. Experimental and computational data comparison for the semicrystalline compression at 23° C. Model (a) corresponds to both stamp and backing layer being compliant; Model (b) has a stiff stamp and a compliant backing layers; and model (c) has stiff stamp and stiff near-surface backing layer.
Figure 31:
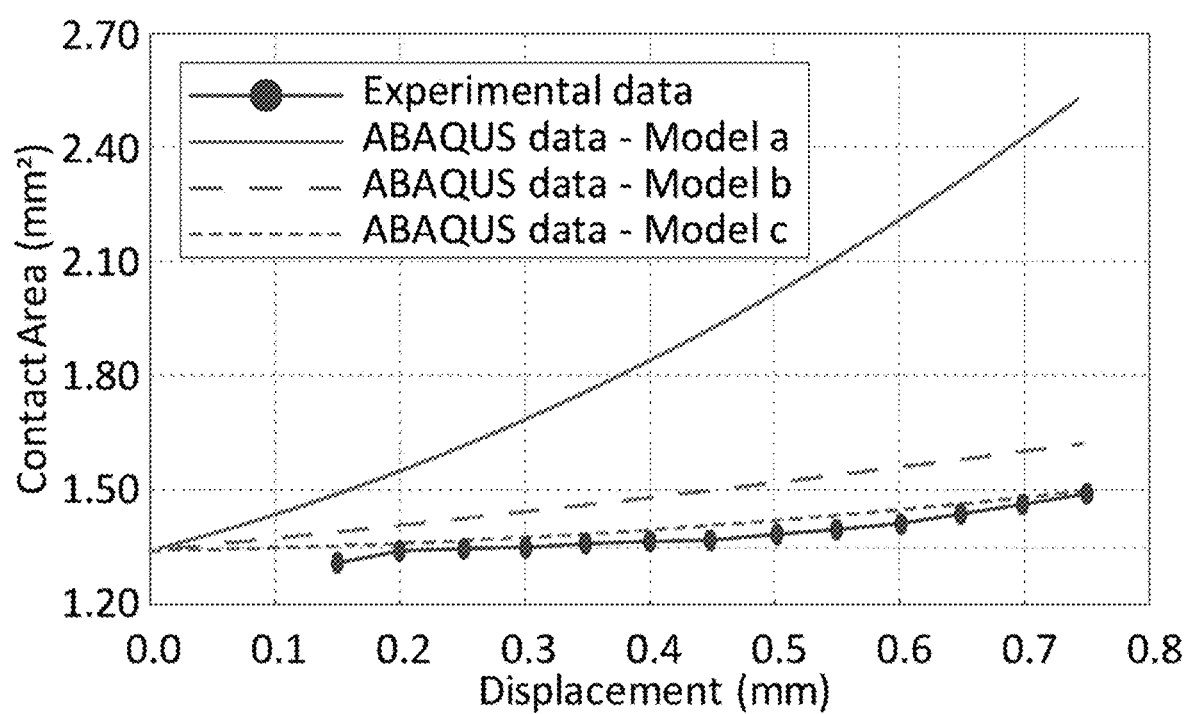
FIG. 31. Comparison of experimental data and numerical predictions for the dependence of the contact area on deformation. Model (a) corresponds to both stamp and backing layer being compliant; Model (b) has a stiff stamp and a compliant backing layers; and model (c) has stiff stamp and stiff near-surface backing layer.

FIG. 30 and FIG. 31 represents the experimental and numerical comparisons of the force and contact area dependence on deformation. To avoid an explicit effort describing the effect on the material response of pre-compression, feature compression was modeled via local hardening of the stamp and the backing layer. Three models (a, b and c) were considered to quantitatively represent the local hardening effect hypothesized: (a) compliant stamp and backing layer, (b) stiff stamp and compliant backing layer, and (c) stiff stamp and stiff near-surface backing layer. A comparison of the experimental data and numerical predications are summarized in FIG. 30 and FIG. 31. It was concluded that a stiff stamp and backing layer leads to a smaller change in contact area and accurately describes the contact force observed during pre-compression.

Figure 32:
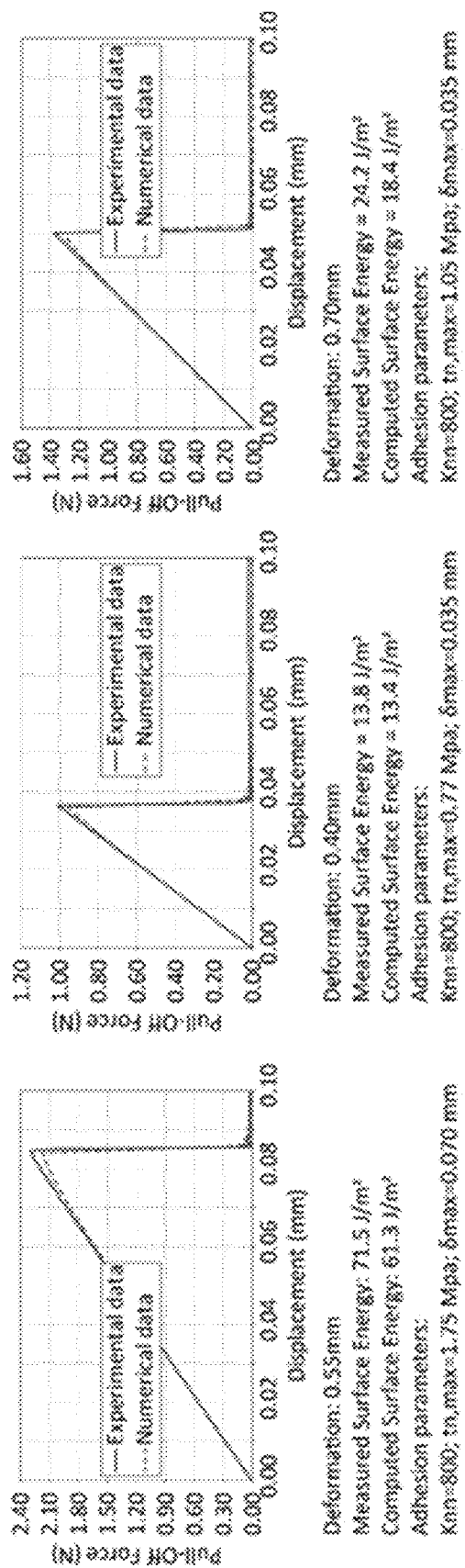
FIG. 32. Comparison of experimental data on the dependence of the pull-off force on (tensile) deformation with a numerical model describing adhesion via a local nonlinear traction dependence on local separation and allowing for elastic near-surface deformations.

The stiffer material model used to validate the compression data was then used in conjunction with the traction-separation law to study the pull-off force data. The parameters of the traction-separation law were selected so as to optimize the agreement with the experimental pull-off force dependence on the imposed overall tensile deformation. The inset text in FIG. 32 shows the computed surface energy value (via the traction-separation law model) as well as the experimentally determined surface energy (from the area under the pull-off force-displacement curve) and the initial area of contact. FIG. 32 shows a fair agreement between the experimental and numerical results. This approach leads to the extraction of the pull-off work from the experimentally measured dependence of the pull-off force on overall deformation. This agreement also lends credibility to the hypothesis of local elastic hardening.

Contact Delamination with Stored Elastic Energy. To visualize the effectiveness of phase change and contact area change in controlling ink-stamp adhesion for transfer printing application, a full cycle of shape memory programming and recovery was demonstrated using a free glass coverslip that was not fixed to the substrate holder (FIG. 33).

Figure 33:
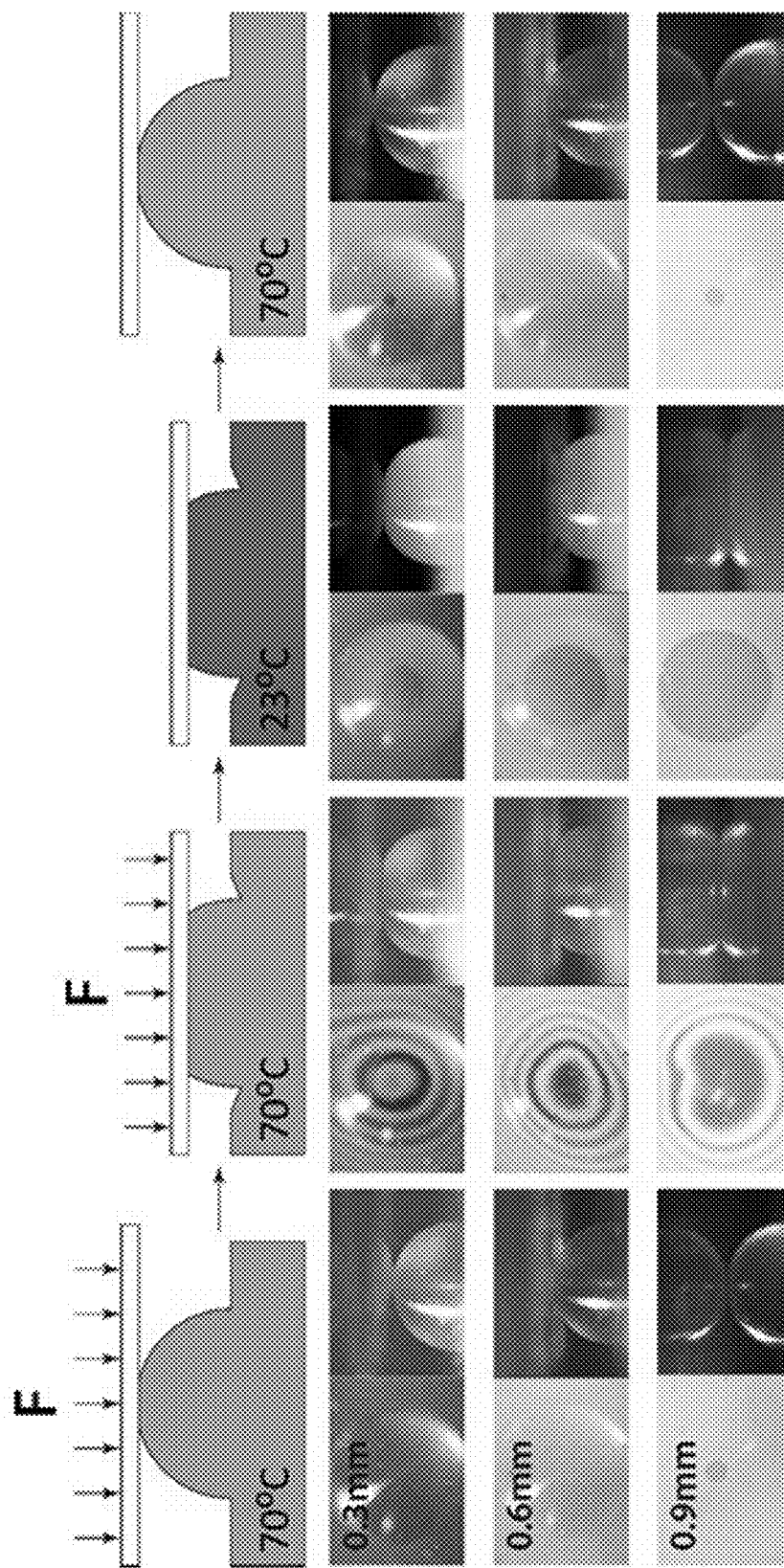
FIG. 33. Snapshots (left: top-view, right: side-view) at different stages of shape memory cycle experiment with a coverslip with 0.3 mm, 0.6 mm, and 0.9 mm deformation; first column: coverslip sitting on top of heated feature at amorphous state; second column: coverslip being pressed against heated feature at amorphous state; third column: coverslip being adhered to flattened feature at semi-crystalline state; fourth column: coverslip being pushed out of contact with recovered feature at amorphous state.

At 70° C., the coverslip was pressed by the substrate holder against the stamp feature as the fringe pattern showed (FIG. 33). As the system was cooled down to room temperature, the coverslip remained adhered to the feature even after the substrate holder was removed and held upside down. This confirmed that freezing the conformal contact below crystallizing temperature increased the pull-off work on the ink-stamp interface to surpass the weight of the coverslip. During recovery, by heating back up to 70° C., the elastic energy stored during shape fixation was released to work against the adhesive contact. The feature recovered its spherical surface from the temporary flattened surface, and the contact started delaminating from the outer edge towards the center. As a result, the coverslip was detached from the stamp, proving that the release of stored elastic energy during recovery of amorphous state can provide sufficient energy to break the interfacial adhesion formed during shape memory programming Hence, the demonstration portrayed successful concept of how thermo-mechanical cycling of shape memory features can be applied to contact printing by control of interfacial adhesion of stamp-ink.

Conclusion. This study demonstrates that purely elastic deformations of molded shape-memory polymer interfaces are incapable of controlling adhesive interactions; and that the elastic deformation followed by the temperature-induced crystallization can be used to continuously modulate adhesion of the shape-memory polymers when the geometry of the contacting polymeric features allows for the change in the contact area. The results also demonstrate that when the adhesive contact is established through such thermo-mechanical programming, a large portion of the work adhesion is spent on elastically stretching polymer during delamination, and that the quality of such adhesive contacts is largely independent of the magnitude of the initial elastic deformation.

It was also shown that deformation of the semicrystalline molds below $T_M$ can also be used to modulate the adhesion. Contrary to the purely elastic deformations at higher temperature, the quality of the adhesive contact in deformation below $T_M$ depends on the magnitude of the deforming force.

The modeling demonstrates that Hertz elastic contact analysis provides a useful starting point for assessing the relation of area of contact and contacting force to the imposed deformation. Modifications include a local hardening stiffness to account for initial pre-compression. A computational model for the constitutive relation of interfacial traction and separation allows a direct comparison of experimental and computational results for the extracted surface energy.

In summary, this work shows that the stored elastic energy in thermo-mechanically programmed shape-memory polymer features can be used to overcome all of the adhesive interactions between the shape-memory polymer and the substrate when the feature is heated above $T_M$. These results suggest that molded shape-memory polymer features can be used in applications that rely on reversible adhesive contacts that can be switched and programmed using mechanical deformation and temperature. This study shows tunable adhesion in large macroscopic shape-memory polymer features; a separate investigation can demonstrate that shape-memory polymers can be used in high-resolution contact printing of small micrometer to sub-micrometer features. The demonstrated adhesion-modulation technique relies on the features that change their contact area under compression. Although such features are easy to make at the millimeter scale, the manufacturing of large arrays of hemispherical micrometer features presents a separate challenge.

Example 3—Contact Printing of Multilayered Thin Films with Shape Memory Polymers Abstract: This study describes a method for transfer printing microarrays of multilayered organic-inorganic thin films using shape memory printing stamps and microstructured donor substrates. By applying the films on the micro-structured donor substrates during physical vapor deposition and modulating the interfacial adhesion using a shape memory elastomer during printing, this method achieves (1) high lateral and feature-edge resolution and (2) high transfer efficiency from the donor to the receiver substrate. For demonstration, polyurethane-acrylate stamps and silicon/silicon oxide donor substrates were used in the large-area transfer printing of organic-inorganic thin film stacks with micrometer lateral dimensions and sub-200 nm thickness.

Introduction: In recent years, contact transfer printing has been considered a promising manufacturing technique for the assembly and patterning of micro-/nano-scale objects. It uses an elastomeric stamp to pick-up an ink material from a donor substrate and then deposit it onto a receiver surface. In another iteration, the functional inks are directly deposited onto the stamp without the use of the donor substrate. Contact printing is intrinsically compatible with both top-down and bottom-up device manufacturing. As the traditional top-down approaches face compatibility challenges with atomically precise bottom-up processes (e.g., atomic layer deposition and etching), contact printing is gaining a renewed interested in semiconductor device manufacturing as a technique that can generate self-aligned patterns for new bottom-up electronic devices (Clark R et al. *Apl Mater* 2018, 6(5), 058203). In addition, contact transfer printing is often suggested as a complimentary technique to traditional photolithography because it is compatible with a wider set of materials (organic, inorganic, biological, self-assembled monolayers, colloidal, polymeric, etc.); because of its ability to pattern flexible and nonplanar surfaces; and because of its scalability and cost efficiency (Voskuhl J et al. *Curr Opin Chem Biol* 2014, 18, 1-7; Yoon J et al. *Adv Opt Mater* 2015, 3(10), 1313-1335; Kim S. *Micromachines (Basel)* 2019, 10(4), 267; Zhou H et al. *Nanomaterials (Basel)* 2019, 9(2), 283; Park J et al. *Acs Nano* 2020, 14(1), 12-20).

Examples of applying transfer printing in microelectronics and photonics include fabrication of light emitting displays (Bower C A et al. *Photonics Research* 2017, 5(2), A23-A29; Cha S et al. *Acs Appl Mater Inter* 2018, 10(28), 24003-24012; Li J et al. *ACS Appl Mater Interfaces* 2016, 8(26), 16809-15; Li Y et al. *Appl Optics* 2019, 58(31), 8383-8389; Park T H et al. *Organic Electronics* 2011, 12(6), 1063-1067), photovoltaic cells (Obaid S et al. *IEEE Photonics Journal* 2019, 11(1), 1-8; Sheng X et al. *Nat Mater* 2014, 13(6), 593-8), and photoconductors (Mahmoud N et al. *ACS Applied Nano Materials* 2018, 2(1), 299-306; McPhillimy J et al. *Opt Express* 2018, 26(13), 16679-16688) where functional materials are prefabricated on donor interfaces and vertically integrated onto receiver substrates. More recently, contact printing has been considered in semiconductor device fabrication for the assembly of multilayered, fully integrated devices. This process enables single-step, large-area patterning of multicomponent structures with reduced alignment requirements and no diffraction/diffusion limits associated with the photolithography and shadow mask deposition. Contact printing is also compatible with flexible and non-planar substrates in addition to organic semiconductors and inorganic light-emitting materials that cannot be structured using traditional photolithography (Park J et al. *Adv Mater* 2004, 16(6), 520-+; Kim K H et al. *Organic Electronics* 2008, 9(6), 1118-1121; Kim B H et al. *Acs Nano* 2016, 10(5), 4920-4925; Chen Z et al. *Journal of Physics D-Applied Physics* 2021, 54(12), 123001; Parbrook P J et al. *Laser Photonics Rev* 2021, 15(5), 2000133). However, the examples of transfer printing of heterogeneous multilayer micro-features are rare and often limited to sequential layer-by-layer thin film assembly due to the problems associated with integration of dissimilar materials (Jeon S et al. *Appl Surf Sci* 2018, 428, 280-288; Si S H et al. *Microelectron Eng* 2018, 197, 39-44; Keum H et al al. *Sci Rep-Uk* 2016, 6, 29925; Corbett B et al. Prog Quant Electron 2017, 52, 1-17).

As the association and disassociation of inks with stamps and donor/receiver substrates rely primarily on non-covalent interactions, the key factor for a successful and complete printing process of heterogeneous materials is a precise control over interfacial adhesion at the stamp-ink and ink-donor/receiver interfaces during the pick-up and transfer. The adhesion between the ink and the stamp needs to be greater than the adhesion between the donor and the ink during the pick-up, while it should be lesser than the adhesion between the ink and the receiver during the transfer step. One way to achieve this requirement is to chemically modify the stamp polymer to adjust its surface energy for a particular donor/ink/receiver combination. For example, several studies describe modifications of stamp materials such as polydimethylsiloxane (PDMS), polyolefin plastomers (POPs), Kraton elastomers, and polyurethane acrylates (PUAs) to render them compatible with various hydrophilic and hydrophobic inks (Li J H et al. *J Mater Chem C* 2016, 4(19), 4155-4165; Sadhu V B et al. *Langmuir* 2007, 23(12), 6850-6855; Peng P et al. *Adv Mater Technol-Us* 2018, 3(3), 1700264). However, most of these examples are limited to half-printing cycles (e.g., when the ink is directly deposited on the stamp and subsequently transferred onto the receiver without the pick-up step). They also require optimization of the polymer composition to achieve the desired level of surface hydrophobicity. It is also possible to customize the surface energy of the stamp without changing its composition by using release/sacrificial layers (Ahmed N et al. *J Microelectromech S* 2015, 24(4), 1016-1028; Liu W et al. *Acs Nano* 2019, 13(1), 440-448; Hwang S H et al. *Acs Appl Mater Inter* 2019, 11(8), 8645-8653; Smythe E J et al. *Acs Nano* 2009, 3(1), 59-65; Choi W et al. *Jpn J Appl Phys* 2011, 50(8), 080219; Liu J S et al. *Microsyst Nanoeng* 2020, 6(1), 80). However, this approach limits the variety of the inks to the materials that are immiscible with the sacrificial layers and can also contaminate the printed interface with the releasing layer molecules.

Researchers have also explored various approaches to achieve a stimuli-responsive interfacial adhesion to modulate the strength of non-covalent interactions during the ink pick-up and transfer. A common and effective approach to such switchable adhesion is to vary the stamp contact kinetics that influences the degree of interfacial adhesion in viscoelastic materials. For example, it has been demonstrated that adhesion in transfer printing can be modulated by applying directional load and varied rates of peel to promote adhesion switching, owing to the viscoelastic nature of PDMS stamps (Carlson A et al. *Appl Phys Lett* 2011, 98(26), 264104; Meitl M A et al. *Nat Mater* 2006, 5(1), 33-38; Yang S Y et al. *Adv Mater* 2012, 24(16), 2117-2122; Kim T H et al. *Appl Phys Lett* 2009, 94(11), 113502; Jiang D J et al. *Soft Matter* 2012, 8(2), 418-423). Alternatively, external triggers such as electromagnetic switching can use magnetic fields or electrostatic forces to actuate micro/macro-structured surfaces to change their areas of contact. For example, Linghu et al. created a stamp with reservoirs filled with magnetic particles, which push and bulge the thin surface membrane to promote delamination (Linghu C et al. *Soft Matter* 2018, 15(1), 30-37), while Kim et al.'s method utilizes dense fibrils of dielectric-coated carbon nanotubes, which increase adhesion by 100-fold by applying 30 V with their compliance and the long-range electrostatic attraction (Kim S et al. *Sci Adv* 2019, 5(10), eaax4790). Furthermore, thermally induced phase transitions are often exploited to control changes in adhesive forces via change in contact quality and mechanics. Eisenhaure et al. have performed various examples of dry adhesive assembly of inks composed of Si, $SiO_2$, Au, and SU8 using micro-structured shape memory polymers (SMPs)—achieving high adhesion by freezing the temporarily increased contact area created with reduced Young's modulus while assisting detachment with the release of the stored elastic energy during the shape recovery phase (Eisenhaure J D et al. *Acs Appl Mater Inter* 2013, 5(16), 7714-7717; Eisenhaure J D et al. *J Microelectromech S* 2016, 25(1), 69-77; Eisenhaure J et al. *Adv Mater Technol-Us* 2016, 1(7), 1600098). While most of these methods have successfully demonstrated macro-assembly of ink layers with feature dimensions in the hundreds of micrometers, they face challenges in transferring small sub-10 μm features such as (1) invariability of the interfacial energy release rate from the contact kinetics at small scales, (2) manufacturing problems in making small multicomponent stamp features that incorporate stimuli-responsive materials, or (3) incompatibility with both classes of inorganic (hard) and organic (soft) ink materials.

In this work, a method for contact printing of organic-inorganic multilayer features using a micro-structured donor substrate and a flat shape memory polymer stamp is presented. The donor substrate serves as a patterning template for microfeatures with high edge resolution. As the target features are evaporated onto the elevated platforms, the thin-film inks do not require additional patterning steps or masks and are separated from the background upon deposition. The thermomechanical shape-memory indentation of the flat stamp against the donor substrate locks-in the conformal contact between the stamp and the multilayered features during the pick-up step. During the transfer step, the recovery of the indentations helps release the features onto the receiving substrate. Specifically, a transfer of 140 nm multilayered thin film stacks in the form of dense 3.7 μm circular features over a 5×5 $mm^2$ size area is demonstrated. Additionally, it is shown that the donor substrates and stamps can be regenerated and reused. The resolution, material transfer completeness, and the overall transfer efficiency over the total areas of the donor and receiver substrates is also analyzed. Control experiments demonstrate that the thermo-mechanical programming of the shape memory polymer stamp is a key element in enabling a full cycle of the material transfer and that without it the transfer is ineffective.

Materials

Donor Substrate. Negative photoresist SU-8, developer (MicroChem), and Si (100) wafers with a 500 nm thick thermal oxide layer (Universitywafer) were used in photolithography to make micro disk arrays for the donor substrates. Nanostrip (VWR), 7:1 buffer oxide etch (BOE, VWR), KOH solution (Fisher Chemical, 30%, wt %), and 1H,1H,2H,2H-perfluorodecanethiol solution (Sigma, 100 mmol/L in isopropanol) were used to manufacture the undercut features of the donor substrate and to modify its surface energy.

$PUA_G$ Stamp. Poly(ethylene glycol) (PEG, avg Mn 400), isophorone diisocyante (IPDI, 98%), tin(II) 2-ethylhexanoate (92.5%), 4,4'-methylenebis(2,6-di-tert-butylphenol) (98%), hydroxypropyl acrylate (mixture of isomers, contains 200 ppm inhibitor, 95%), trimethylolpropane propoxylate triacrylate (avg Mn 644), 1,6-hexanediol diacrylate (HDODA, 80%), 1-hydroxycyclohexyl phenyl ketone (99%), and 2-hydroxy-2-methyl-propiophenone (97%) were acquired from Sigma Aldrich.

Thin Film Ink. Tris(4-carbazoyl-9-yl-phenyl)amine (TCTA, sublimed), bis(3,5-difluoro-2-(pyridin-2-yl)phenyl) (picolinoyloxy)iridium (FIrpic, 99%), aluminum (Al, 99.999%), and molybdenum(VI) oxide ($MoO_3$, 99.97%) were obtained from KODAK, Nichem Fine Technology, Kurt J. Lesker, and Sigma Aldrich, respectively. Indium tin oxide (ITO, 100 nm, 15 Ω/sq) coated glass substrates were custom ordered from Tinwell Electronics and used as a receiving substrate.

Equipment

Photolithography mask aligner (OAI 200 Mask Aligner) was used with a Cr photomask (photo science, 5 μm diameter circles array with 5 μm spacing) to fabricate the donor substrate.

Reactive ion etcher (RIE, South Bay Technology Reactive Ion Etcher RIE-2000) was used to etch the $SiO_2$ layer of the donor substrate and to clean the substrate with $O_2$ plasma.

Dynamic mechanical analysis (TA Instruments RSA G2) was used to measure glass transition temperature and Young's modulus of the $PUA_G$ material. Temperature sweep data was acquired on a thin film elastomer (6 mm×30 mm×0.25 mm) from 10° C. to 90° C. at 5° C. $min^{-1}$. Oscillation was set to 0.50% strain and angular frequency of 2π (rad/s.

Water contact angle measurements (AST Products VCA Optima) were recorded at advancing and receding mode to calculate dynamic angles. Surface tension was calculated with geometric-mean method.

Figure 34:
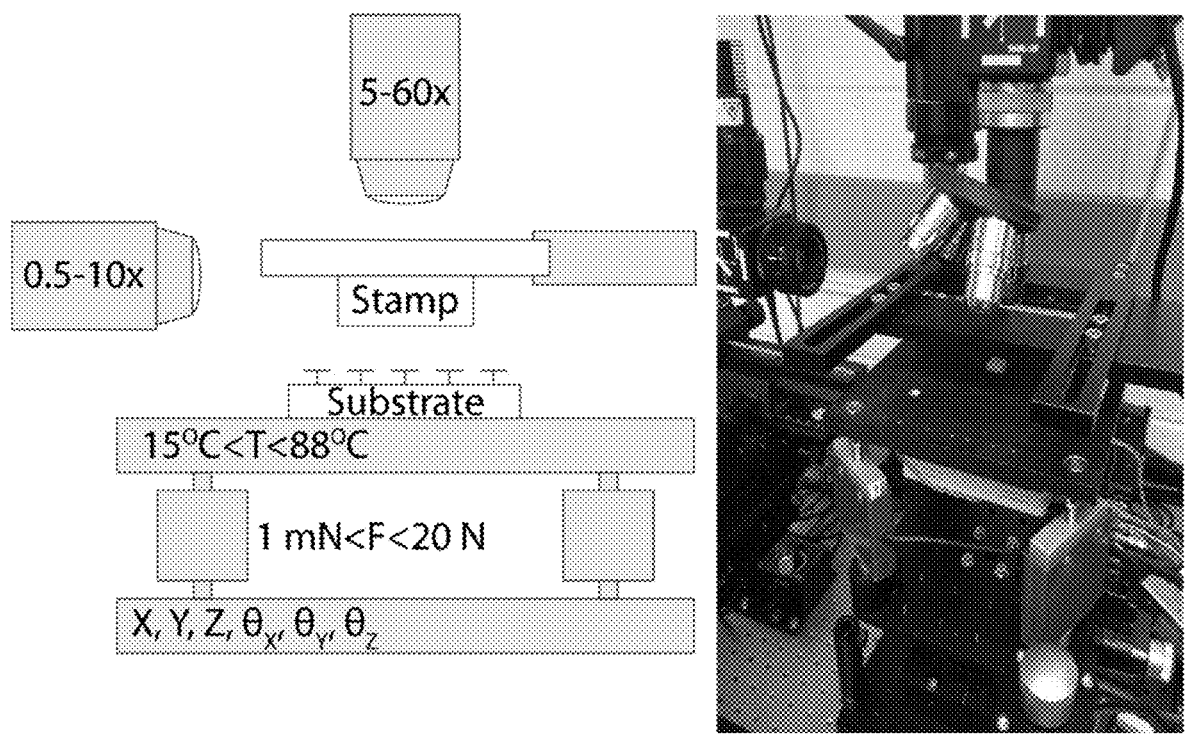
FIG. 34. Schematic (left) and photograph (right) of contact mechanics measuring system (CMMS).

Indentations and transfer printing were performed on a custom-built Contact Mechanics Measuring System (CMMS) introduced in a previous work (FIG. 34) (Example 2).

The system is equipped with a fixed glass substrate holder, XYZ-axis stepper/piezo motor (Thorlabs apt precision control BSC 203/303, range: 50 mm/20 μm, resolution: 0.5 μm/20 nm), a multi-channel amplifier with 4 load cells (Interface BSC8D-12, range: 5N per cell, resolution: 0.05%) for force monitoring, a thermoelectric heater (TE Technology TC-720, range: 15° C.-88° C., resolution: 0.01° C.), and custom-built lateral and vertical microscopes for profile and plan views.

The donor/receiver substrate was mounted with adhesive tape in the middle of the stage with temperature control, position control, and force measurement. A clean microscope glass slide was mounted into the substrate holder, with the elastomeric stamp attached upside down, facing the substrate on the stage. Two orthogonally positioned microscope cameras were aligned with the substrate holder (profile view) and the polymer sample (plan view). The stamp was compressed against and detached from the glass slide by the stage movement control, while continuously monitoring the stage position, stamp-substrate contact area, and force data. Pull-off work was calculated by integration of calculated tension-versus-displacement curves using a pull-off rate of 5 μm/s.

Atomic force microscopy (AFM, NT-MDT Solver NEXT SPM) was used to measure surface topography and roughness using semi-contact mode.

Optical microscope (Carl Zeiss Axio Imager A2m) was operated with varying magnifications (objectives: ×10-×50) and light sources (bright field mode: Halogen 100-Watt, fluorescence mode: 200-Watt metal-halide lamp) to record surface indentations and thin film transfers on the donor substrates and stamps.

Scanning electron microscope (SEM, Zeiss Auriga SEM/FIB) was operated with the InLens mode, 6 kV and a working distance ranging from 4 mm to 8 mm Images were recorded in the top view and at 45° angle.

X-ray photoelectron spectrometer (XPS, Kratos AXIS Ultra DLD XPS) was equipped with a mono-Al X-ray source (1468.6 eV). The XPS spectra were collected over ~600×900 μm substrate area with multiple sweeps for the survey and regional scans to increase signal-to-noise ratio. Unless specified, the electron collection angle θ in all XPS measurements was 90°. Casa XPS software was used for the data processing and analysis.

Methods

Figure 35:
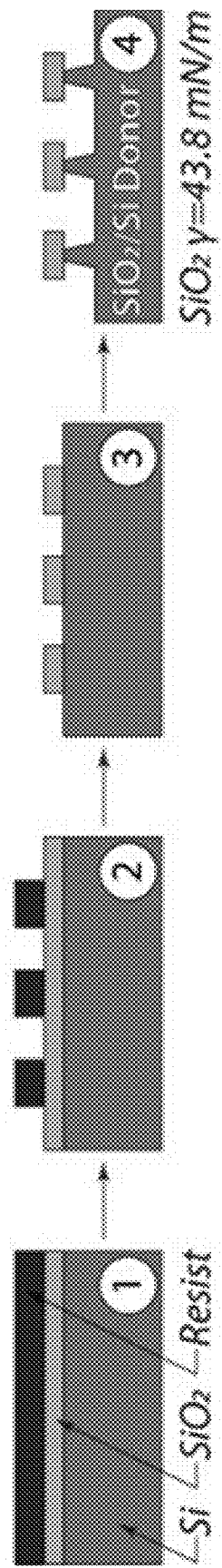
FIG. 35. Fabrication of the donor substrate. First, a pattern of $SiO_2$ micro-disks (3.7 μm diameter, 500 nm height) were prepared on a silicon wafer using photolithography (step 1-2) and RIE (step 2-3). After Nanostrip and oxygen plasma cleaning, concentrated KOH solution was used to selectively remove silicon and make undercut silicon oxide features (step 3-4).
Figure 37:
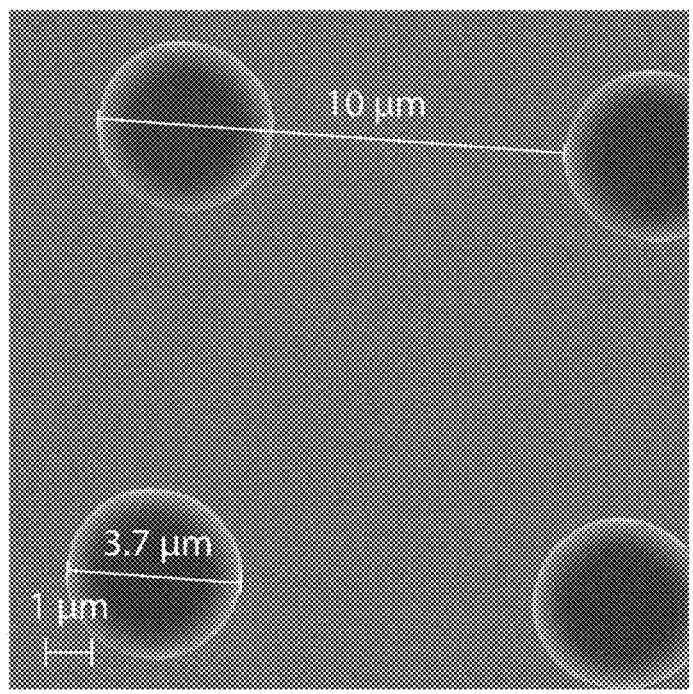
FIG. 37. Vertical SEM image of the final donor substrate features.

Donor Substrate Fabrication and Regeneration. The fabrication process is shown in FIG. 35. A Si (100) wafer with a 500 nm thermal oxide layer was immersed in Nanostrip at 75° C. for 30 min, rinsed with isopropanol and DI water, and dried with $N_2$ flow. A 2 μm layer of negative photoresist SU-8 was spin-coated onto the substrate and exposed under UV light with a photomask to form an array of 5 μm diameter circular features. After post bake (95° C., 2 min) and development, the SU-8 micro disk array was used as a mask in reactive ion etching (RIE) of the $SiO_2$ layer. RIE was operated with a mixture of 42.5 sccm Ar, 2.5 sccm $O_2$ and 5.0 sccm $CHF_3$ gases at P=140 mTorr and 100 W forward power. Twenty minute etching (5 min per step with 1 min pause intervals between each step to prevent heat accumulation) was applied to etch through the thermal oxide layer. After RIE, the substrate was immersed in Nanostrip for 1 hour at 75° C. and cleaned with $O_2$ plasma for 5 min at 100 W forward power to remove the remaining photoresist and other organic residues. The under-cut structures were manufactured using KOH wet etching of the exposed Si(100) regions. As such, the cleaned substrate was first immersed in 7:1 BOE solution at room temperature for 1 min to remove the native oxide layer. Subsequently the substrate was immersed in 30% (wt %) KOH solution at 70° C. for 70 sec and cleaned with DI water. After the wet etch, the substrate was sputtered with 12 nm thick Au layer and functionalized with 1H,1H,2H,2H-perfluorodecanethiol solution in isopropanol (100 mmol/L, 12 hours at 23° C.) to reduce its surface energy. The process yields a pattern of 3.7 μm $SiO_2$ circular features on Si with 10 μm periodicity (FIG. 37). XPS was used to monitor the material transfer during the printing process and to analyze the composition of the donor substrate after cleaning and regeneration.

$PUA_G$ Synthesis and Stamp Molding. The polyurethane acrylate (PUA) monomer (A in FIG. 39) was prepared from IPDI (0.01 mol), tin(II) 2-ethylhexanoate (0.0001 mol), 4,4'-methylenebis(2,6-di-tert-butylphenol) (0.0001 mol), PEG (0.05 mol) and hydroxypropyl acrylate (0.1 mol) by following a previously published protocol (Li J H et al. *J Mater Chem C* 2016, 4(19), 4155-4165). Monomer (A) was then diluted with trimethylolpropane proxylate triacrylate (B, 40 v/v %) and HDODA (C 20 v/v %) to reduce viscosity and introduce reactive points for crosslinking. This mixture was added with the photo-initiators: 1-hydroxycyclohexyl phenyl ketone (1 wt %) and 2-hydroxy-2-methyl-propiophenone (1 wt %).

To prepare flat shape memory polymer stamps, the mixture was degassed and poured into a flat-bottom mold with 2.2 mm spaces and covered with a glass substrate. The assembly was cured using UV light lamp (UVP UVGL-15, 365 nm, 4 watt) overnight and a UV crosslinkers system (Spectrolinker™ XL-1500, 254 nm, 6×15 watts) for an additional 300 seconds. The sample was then cut into ~5 mm×5 mm flat stamps.

Thin Film Deposition via Thermal Evaporation. Donor substrate was deposited with TCTA doped with FIrpic (2.8+1.2 Å/s, 60 nm, 30%), followed by aluminum (5~10 Å/s, 80 nm). Receiver substrate was deposited with $MoO_3$ (1 Å/s, 1 nm) and TCTA (2.8 Å/s, 20 nm).

Compression Cycle and Transfer Printing Experiments. Donor/receiving substrates were placed in the middle of the stage, which has temperature control, position control, and force measurement. The elastomer stamp was attached to a microscopic glass slide with double-sided Kapton tape and mounted on the substrate holder, with the stamp side facing the stage. The sample was compressed with 400 μm displacement against and detached from the donor/receiving substrates by the stage movement control, while the force data was continuously monitored. Pull-off work was calculated by integrating the area under the pull-off peak area in 'force vs. time' data while converting time to displacement using a constant stage movement rate of 5 μm/s. AFM measurements were taken for roughness and feature profiles. Optical microscopy and SEM were used for imaging the thin film microstructures and calculating transfer yields using ImageJ. XPS data were taken to confirm the transfer and recycling steps with compositional analysis. The specific details of different compression and printing cycles are listed below.

Adhesion Measurement: Each stamp sample was processed with the following compression procedure and the corresponding pull-off work was calculated by integration of calculated tension-versus-displacement curves using a pull-off rate of 5 μm/s.

Cold: Stamp was pressed against a clean donor substrate at room temperature for 10 minutes, then detached.

Hot: Stamp was pressed against a clean donor substrate at 80° C. for 10 minutes, then detached.

Thermo-Mechanical Cycle: Stamp was heated to 80° C. and compressed against a clean donor substrate for 10 minutes, cooled to room temperature for 1 hour, then detached from the donor substrate.

Micro-Indentation and Shape Recovery: Stamp was processed through the thermo-mechanical cycle procedure with a clean donor substrate. Surface topography and roughness of the stamp was measured using AFM in a semi-contact mode to confirm shape memory deformation. As evidence of shape recovery, a sequence of microscopic images of the stamp surface were recorded with an optical microscope while heating the stamp to 80° C.

Transfer Printing with Thermo-Mechanical Cycle: Stamp was processed through the thermo-mechanical cycle procedure with a donor substrate after the thin film deposition. The stamp with picked-up thin film stacks was then brought into contact (<0.1 N/stamp) with the receiving substrate, heated to 80° C. for 25 minutes and detached, leaving the films adhered to the receiving substrate. Optical microscopy with both bright-field and fluorescent modes was used to examine organic and metallic thin film layers on the donor substrate, stamp, and receiver substrate after each step. The images were compiled and processed with ImageJ for yield calculation. SEM images were acquired as well to visually confirm the quality of the transferred features with higher resolution and magnification. XPS was used to confirm successful transfer of the thin film stacks.

Control Transfer Printing at Fixed Temperature: Stamps were processed through both the cold and hot compression procedures with donor substrates after the thin film deposition. Both samples were imaged with an optical microscope in bright field mode. The images were compiled and processed with ImageJ for yield calculation.

Results And Discussion

Donor Substrate. The transfer printing of rigid inorganic materials presents a more significant challenge than the printing of soft organic thin films. The stiffness of a continuous inorganic layer prevents clean separation/breakage of the features from the rest of the film during the pick-up step. Continuous inorganic films are either completely delaminated from the donor surface when pulled off by an adhesive stamp or randomly broken into irregularly shaped pieces near the stamp-film contact edges (Eisenhaure J D et al. *J Microelectromech S* 2014, 23(5), 1012-1014). Thus, the pre-patterning of the inorganic and/or stiff multilayered ink films is necessary and can be done by either shadow mask lithography or by using the structured donor substrates.

Shadow mask lithography patterns the film using physical vapor deposition (PVD) through a micro-scale hole array. Because the mask is separated by a micrometer gap, the material diffusion in the area between the mask and the substrate limits the resolution of the deposited features to ~5-10 μm (Vazquez-Mena O et al. *Nanotechnology* 2009, 20(41), 415303). Another alternative is to deposit the film onto the array of photolithographically defined features on the donor substrates. However, because the evaporated material deposits onto the walls of the donor structures, the deposited film on the top of the features is not separated from the background, preventing its clean release during the pick-up step.

Figure 36:
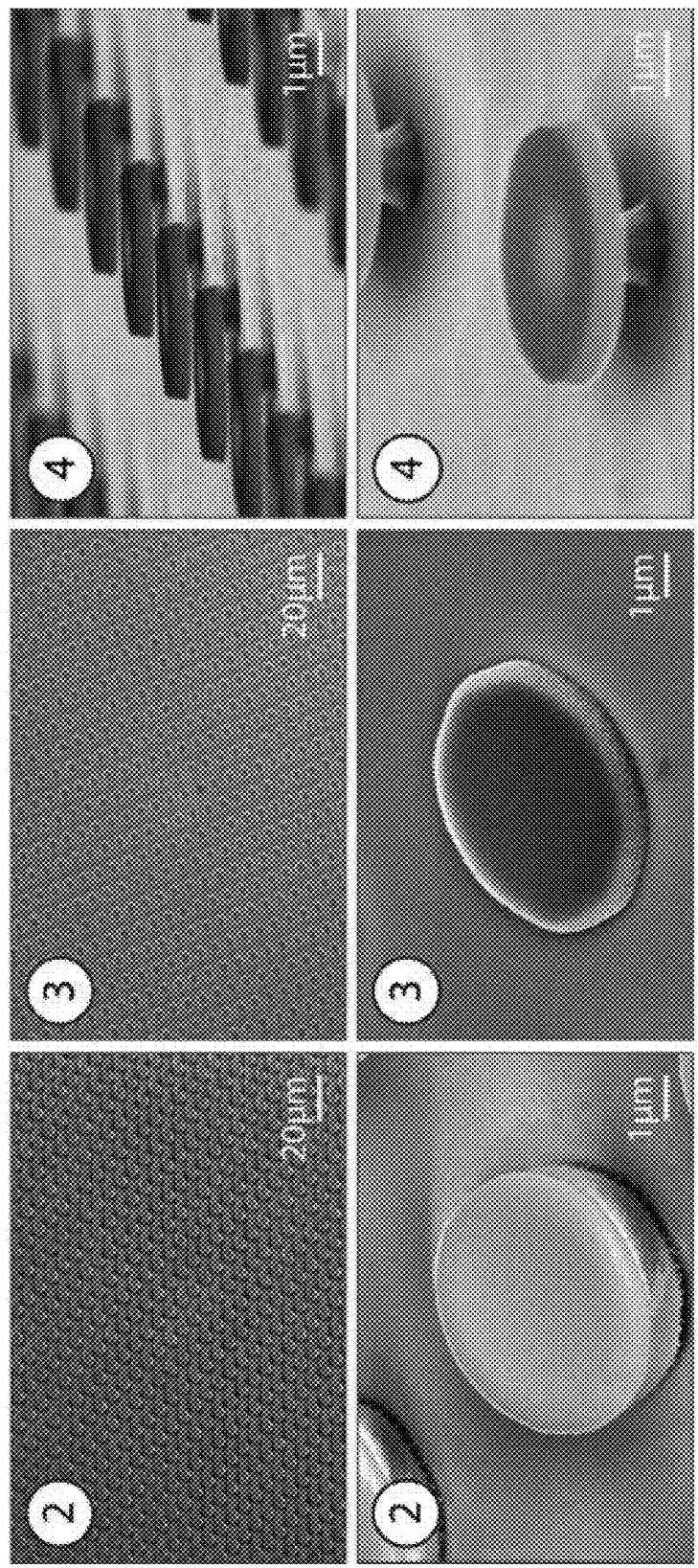
FIG. 36. Tilted SEM images of the donor substrate features after photolithography (2), RIE (3), and KOH etch (4).

To overcome this limitation, a new donor substrate was developed with undercut, mushroom-like structures that enable separation of the deposited ink features from the background during the PVD step. Analogous mushroom-like features were reported in different applications like adhesion enhancement (del Campo A et al. *Langmuir* 2007, 23(20), 10235-10243; Murphy M P et al. *Acs Appl Mater Inter* 2009, 1(4), 849-855; Yi H et al. *Acs Appl Mater Inter* 2016, 8(34), 22671-22678), localized surface plasmon resonance (LSPR) sensing (Li W et al. *Biosensors and Bioelectronics* 2015, 68, 468-474; Shin S H et al. *Nanotechnology* 2019, 30(38), 385302), superomniphobic surface (Kim S et al. *Langmuir* 2009, 25(13), 7196-7199; Hensel R et al. *Langmuir* 2013, 29(4), 1100-1112; Kang S M et al. *Soft Matter* 2012, 8(33), 8563-8568), and whispering gallery devices (Long H et al. *Chinese Physics B* 2017, 26(5), 054211; Kippenberg T J et al. *Appl Phys Lett* 2003, 83(4), 797-799). However, many of the reported structures were fabricated using soft organic materials unsuitable for contact printing applications, and so far, such structures have not been considered as structuring masks for pre-patterning PVD films. The fabricated structures contain a silica flat platform to provide the transferring sites for the ink films and a silicon pillar to elevate the platform from the surface (FIG. 35-FIG. 37). Such geometry (1) ensures separation of the ink features from the background and (2) overcomes the diffusion limitation of the shadow mask deposition by eliminating the gap between the ink feature and the substrate. Because the structures are made from rigid and inert silicon and silica layers, they can withstand vertical compressive and pulling forces during the ink pick-up and can be cleaned and regenerated after a printing cycle.

The donor substrate fabrication is shown in FIG. 35. First, a pattern of $SiO_2$ micro-disks (3.7 μm diameter, 500 nm height) were prepared on a silicon wafer using photolithography (step 1-2) and RIE (step 2-3). After Nanostrip and oxygen plasma cleaning, concentrated KOH solution was used to selectively remove silicon and make undercut silicon oxide features (step 3-4). The extent of the undercut can be controlled by the KOH etch time and temperature.

FIG. 36-FIG. 37 shows tilted and vertical images of the resulting donor substrate features. The features occupy 10.75% of the donor surface area (3.7 μm diameter discs separated by 10 μm). The surface energy (43.8 mN/m, water contact angle) and roughness (4.5 nm, AFM) of the donor substrate was measured on the corresponding flat samples that had the same composition as the top interface of the donor substrate features. Due to the high surface energy of the silica layer (43.8 mN/m), the donor substrate was sputtered with a thin layer of gold (12 nm) and functionalized with 1H,1H,2H,2H-perfluorodecanethiol solution in isopropanol to create a hydrophobic self-assembled monolayer (SAM) that lowers the surface energy (15.9 mN/m) while maintaining low roughness (5.2 nm, FIG. 38, step 4→5). Because the SAM is covalently attached to the sputtered gold surface, it does not migrate during transfer printing. The successful surface treatment was verified by XPS with an increase in the F1s signal and the absence of the Si2p signal (FIG. 38).

Figure 38:
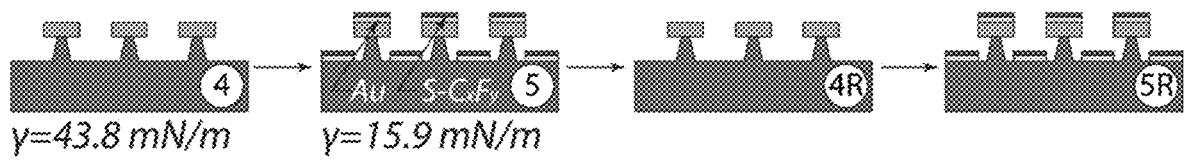
FIG. 38. Preparation and regeneration of the donor substrate and XPS analysis of the regenerating cycle (R). XPS analysis shows the % of F, O, C, Si, and AU (left to right in bars).
Figure 38:

It was shown that the donor substrate can be regenerated and reused after a complete printing cycle of an inorganic-organic ink film (FIG. 38, steps 5-5R). After the printing, the donor substrate was immersed in a Nanostrip solution at 75° C. for 1 hour to remove the remaining ink film and the Au-SAM layers, exposing clean silica and silicon interfaces (FIG. 38, substrate 4R). Subsequently, the donor substrate was re-functionalized with the Au-SAM layers yielding a material that had the same surface composition as the freshly prepared donor substrate (FIG. 38, substrates 5 and 5R). This regenerated donor substrate was reused again in the printing experiments.

Figure 39:
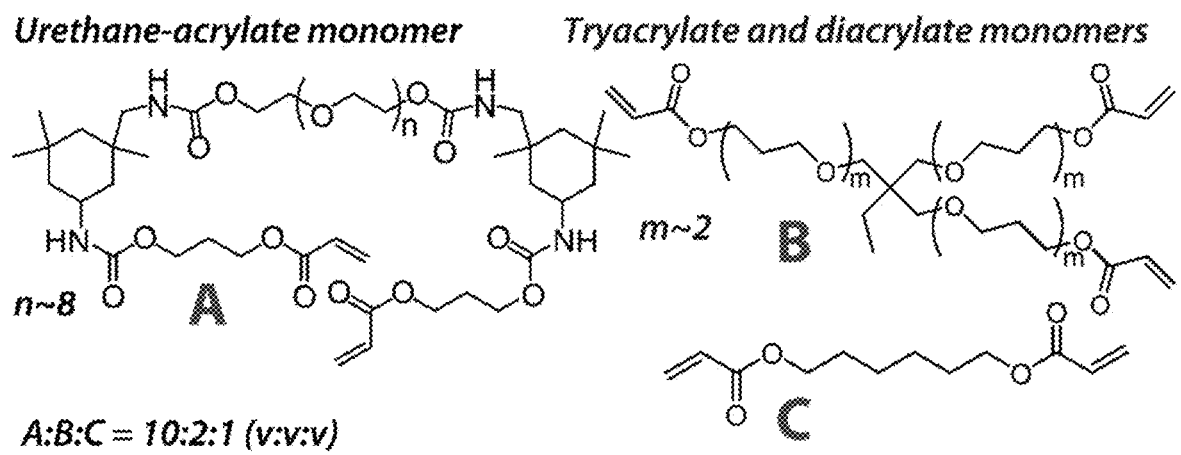
FIG. 39. Composition of the $PUA_G$ shape memory polymer stamp.

Shape Memory Polymer Stamp. Shape memory polymers (SMPs) are a class of materials that can adopt and hold an arbitrarily deformed shape and then recover its initial form through the application of external stimuli such as heat, light, or electro-magnetic fields (Behl M et al. *Adv Polym Sci* 2010, 226, 1-40). Thermal shape memory polymers are by far the most common and studied type of shape memory materials. These polymers can effectively hold a temporarily deformed shape by undergoing a temperature induced phase transition from a rubbery to a glassy or semi-crystalline state, resulting in a significant increase in the Young's modulus of the material. A large stiffness change and an insignificant volume change of glassy shape memory polymers during the phase transition make them promising materials for switchable dry adhesive stamps in micro-/nano-scale printing applications. For this study, a urethane-acrylate polymer ($PUA_G$) was selected as the shape memory polymer material due to its suitable glass transition temperature (Tg) above room temperature (Tg 58° C.), its more than 10 fold increase in elasticity modulus ($E'_{rubbery}$~20 MPa, $E'_{glassy}$~300 MPa), the exhibited good moldability with negligible volume change, and the material's low surface roughness (RMS 5.2 nm) (Li J H et al. *J Mater Chem C* 2016, 4(19), 4155-4165). The chemical structures of the polymer components are shown in FIG. 39.

Figure 40:
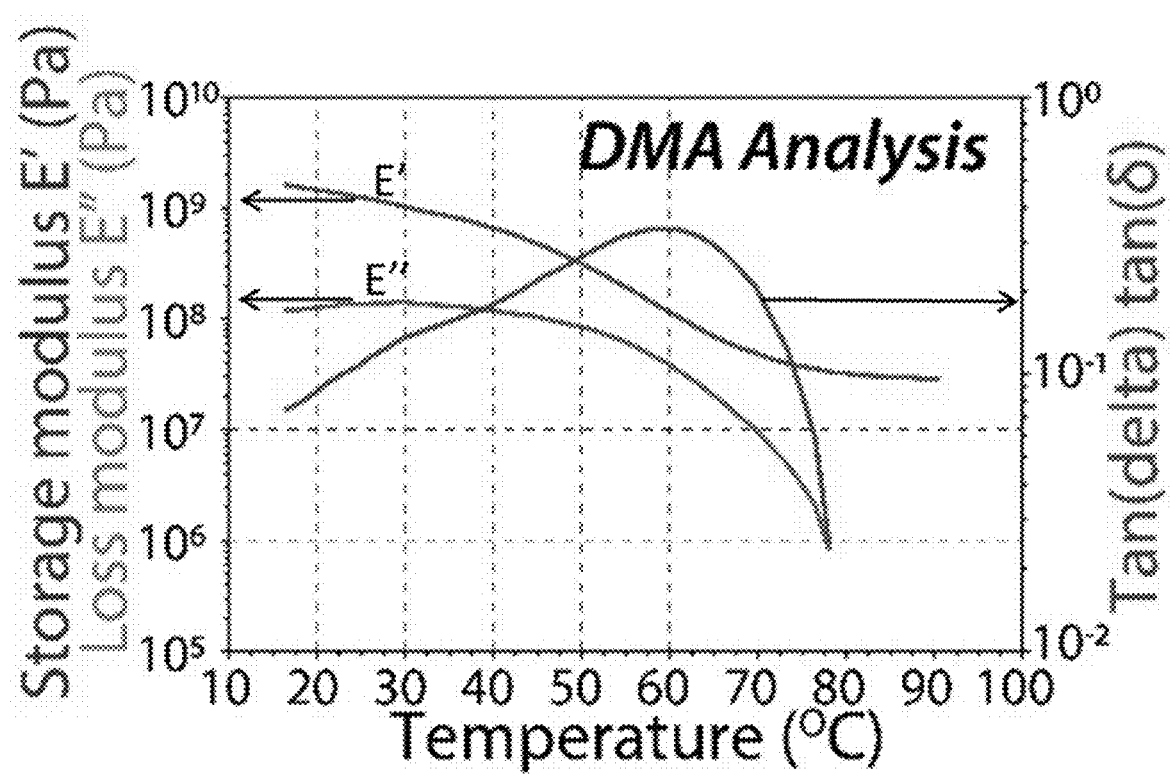
FIG. 40. Physical properties of the $PUA_G$ shape memory polymer stamp.

DMA analysis was performed to measure the glass transition temperature and stiffness of the shape memory polymer stamp in its glassy and rubbery states (FIG. 40). Upon the glass transition, the Young's modulus of the $PUA_G$ increases by an order of magnitude (Young's Modulus at 25° C. is 300 MPA; Young's modulus at 80° C. is 20 MPA). AFM analysis and water contact angle measurements were performed to determine surface roughness and surface energy of the molded shape memory polymer at 25° C. The water contact angle was 20.20°. The surface tension was 68.11 mN/m. The surface roughness (RMS) was 5.2 nm. It was hypothesized that, above the glass transition temperature, $PUA_G$ would uniformly conform to the ink interface when the holding pressure is applied, but the conformality would fail when the holding force is removed due to its high elasticity and relatively low surface energy. However, when the conformal contact is maintained during the phase transition into a glassy state, the significant increase in stiffness would prevent the stamp recovery into its original undeformed state, stabilizing the Van der Waals contact (used in the pick-up step from the donor substrate). During the transfer step, thermal energy would reverse the effect and break the Van der Waals interactions between the ink and stamp, enabling the ink release.

Figure 41:
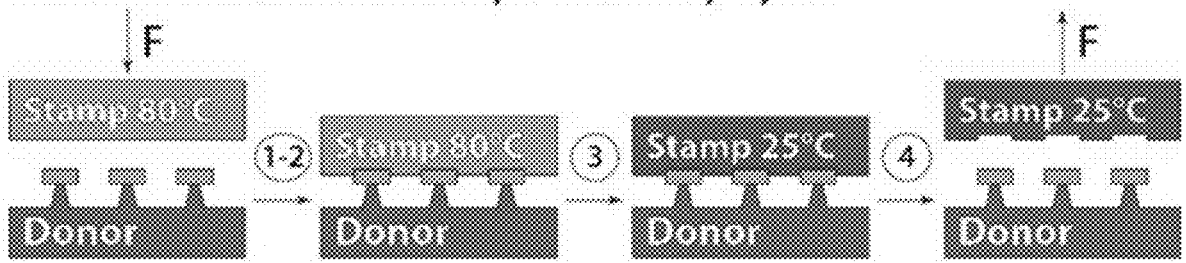
FIG. 41. Adhesive interactions between the $PUA_G$ stamp and the donor substrate during the thermo-mechanical shape-memory cycle.
Figure 42:
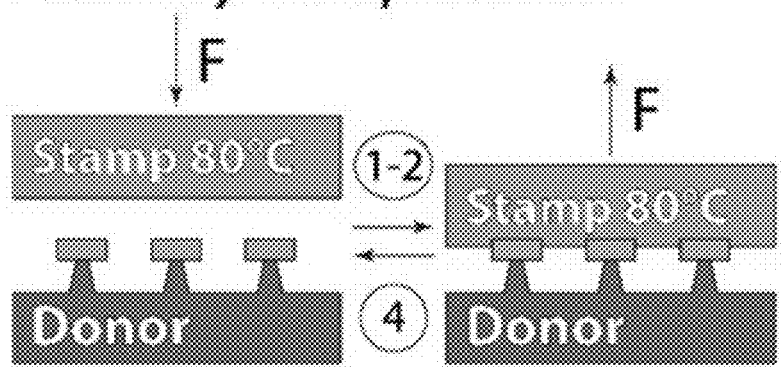
FIG. 42. Adhesive interactions between the $PUA_G$ stamp and the donor substrate during rubbery compression (T>Tg).
Figure 43:
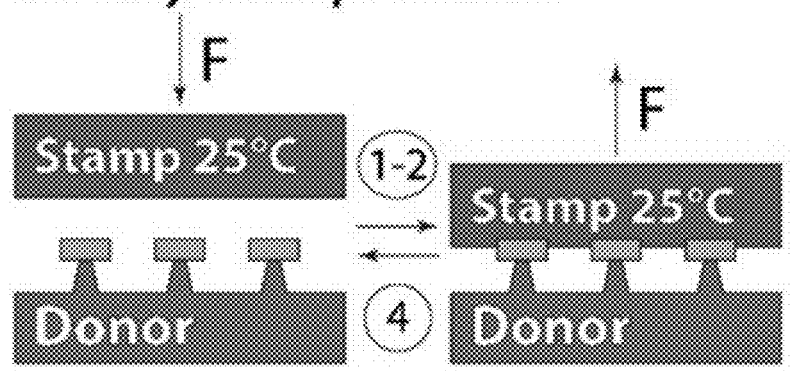
FIG. 43. Adhesive interactions between the $PUA_G$ stamp and the donor substrate during glassy compression (T<Tg).
Figure 44:
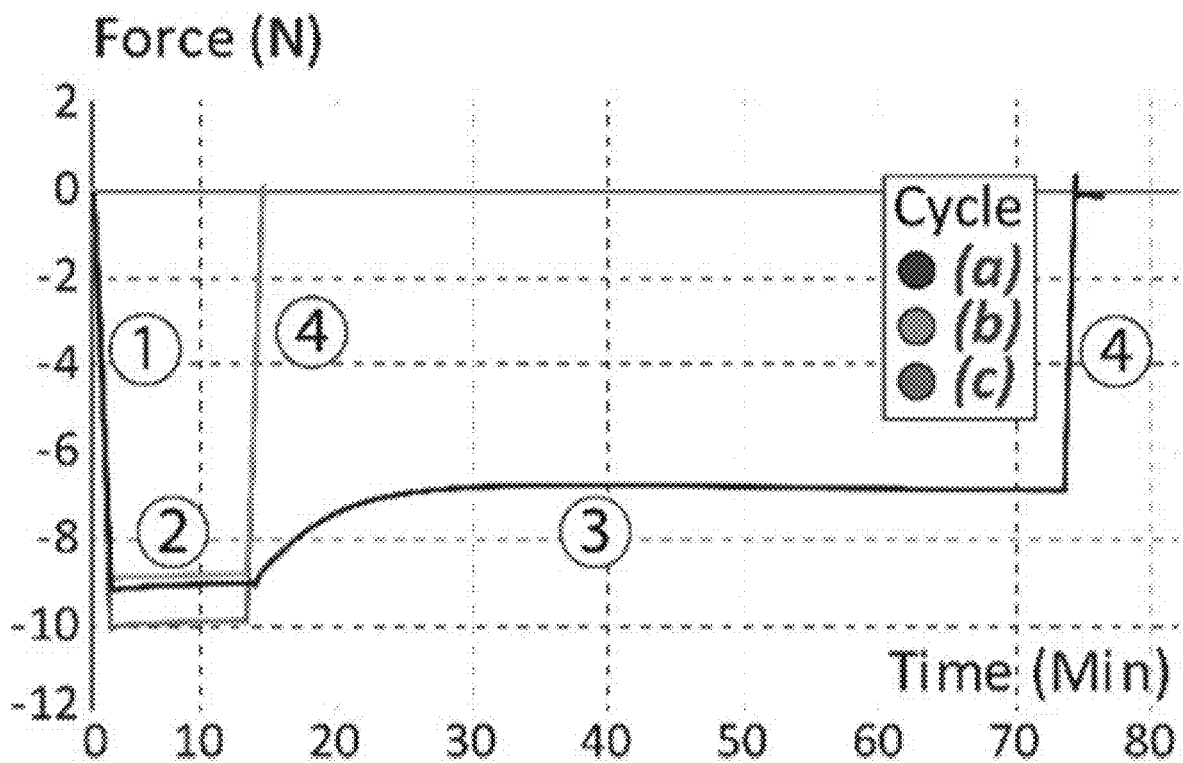
FIG. 44. Adhesive interactions between the $PUA_G$ stamp and the donor substrate during (a) shape-memory cycles; (b) and (c) control experiments at T>Tg and T<Tg, respectively (FIG. 41-FIG. 43).
Figure 45:
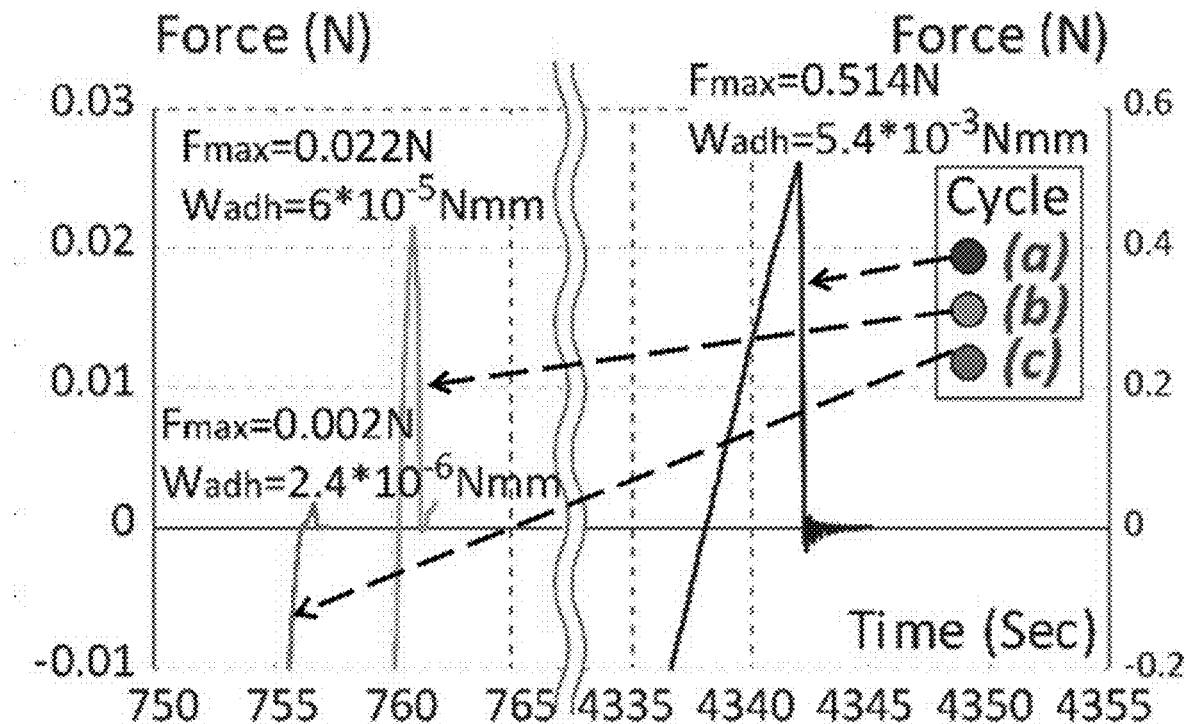
FIG. 45. Adhesive interactions between the $PUA_G$ stamp and the donor substrate during (a) shape-memory cycles; (b) and (c) control experiments at T>Tg and T<Tg, respectively (FIG. 41-FIG. 43).

To demonstrate that the thermo-mechanical programming of the shape memory polymer can be used to modulate its adhesive interactions, the pull-off force and the work required to separate the stamp from the patterned $Si/SiO_2$ donor substrate were measured. First, the adhesive interactions in the rubbery and glassy states were measured by compressing and detaching the stamp from the donor features at T>Tg and T<Tg, respectively (FIG. 42 and FIG. 43). For the thermo-mechanical shape-memory cycle, the elastic stamp was first compressed into the donor features at T>Tg, then the elastic stamp was cooled to T<Tg under the applied compressive load, and then the elastic stamp was separated from the donor substrate (FIG. 41). Both rubbery and glassy compressions achieved small levels of adhesion indicated by the pull-off force required to separate the stamp from the donor and the overall work of adhesion ($F_{MAX}$=0.022 N, $W_{ADH}$=2.36×10$^{-6}$ Nmm at T>Tg; and $F_{MAX}$=0.002 N, $W_{ADH}$=6×10$^{-5}$ Nmm at T<Tg) (FIG. 44 and FIG. 45). At T>Tg the low adhesive contact can be explained by the elastic energy deposited into the stamp during the compression that acts to restore the original geometry of the stamp interface when the compressive load is removed. The low adhesion at T<Tg is likely attributed to the inability of the stamp interface to deform and achieve a high surface area Van der Waals contact with the donor substrate due to its increased stiffness.

After a thermo-mechanical shape-memory cycle, a significant increase in both the pull-off force and the work of adhesion required to separate the polymer form the donor substrate was observed (FIG. 41, FIG. 44, FIG. 45, $F_{MAX}$=0.514 N, $W_{ADH}$=5.4×10$^{-3}$ Nmm). This change in adhesion can be attributed to the geometrical changes on the stamp interface and the formation of conformal contact between the stamp and the donor substrate, which is stabilized by the stiffening glass transition during the cooling of the stamp to T<Tg.

Figure 46:
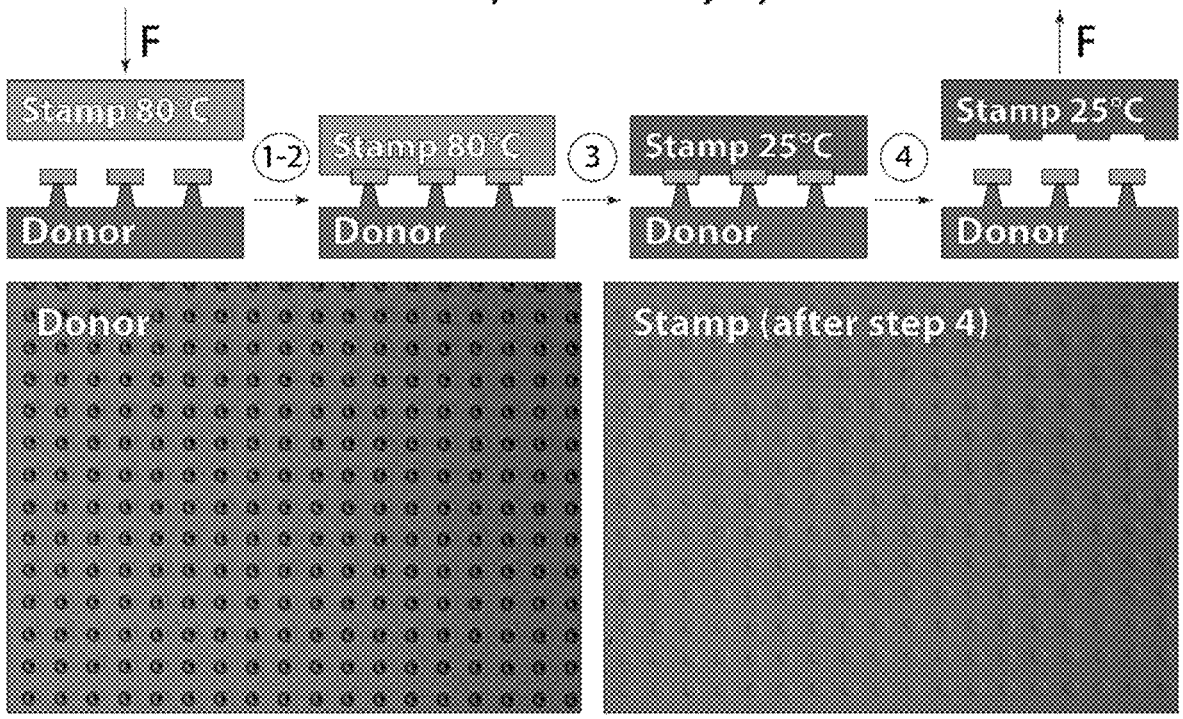
FIG. 46. Stabilized features in the $PUA_G$ stamp after thermo-mechanical shape-memory cycle (recorded as optical microscopic images).
Figure 47:
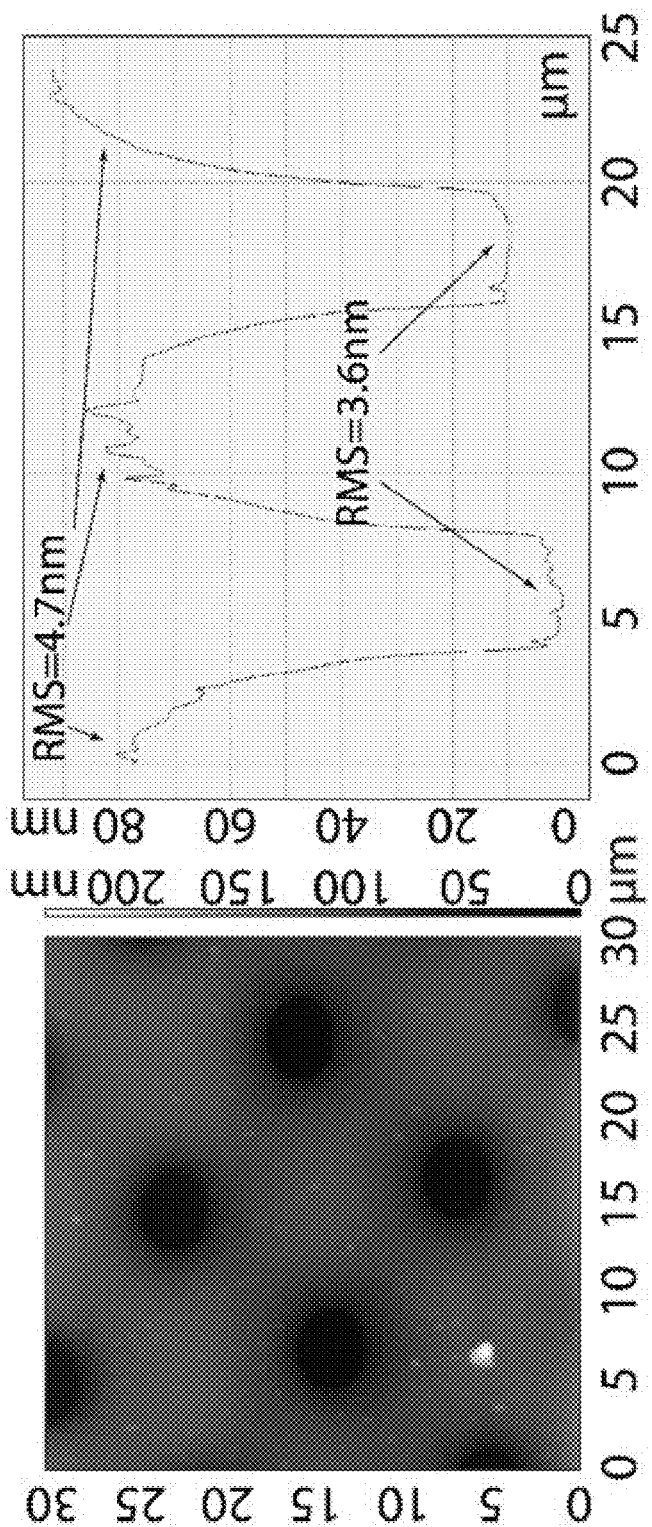
FIG. 47. Stabilized features in the $PUA_G$ stamp after thermo-mechanical shape-memory cycle (recorded as AFM surface profile).

The suggested mechanism of adhesion modulation was supported by the formation of indentations in the stamp interface after the thermo-mechanical cycle (FIG. 46). The dimensions of the stamp features are comparable to that of the circular features on the donor substrate. AFM analysis shows that the imprinted features on the stamp surface exhibit a slightly lower surface roughness than the rest of the stamp interface (FIG. 47, AFM line scan).

Figure 48:
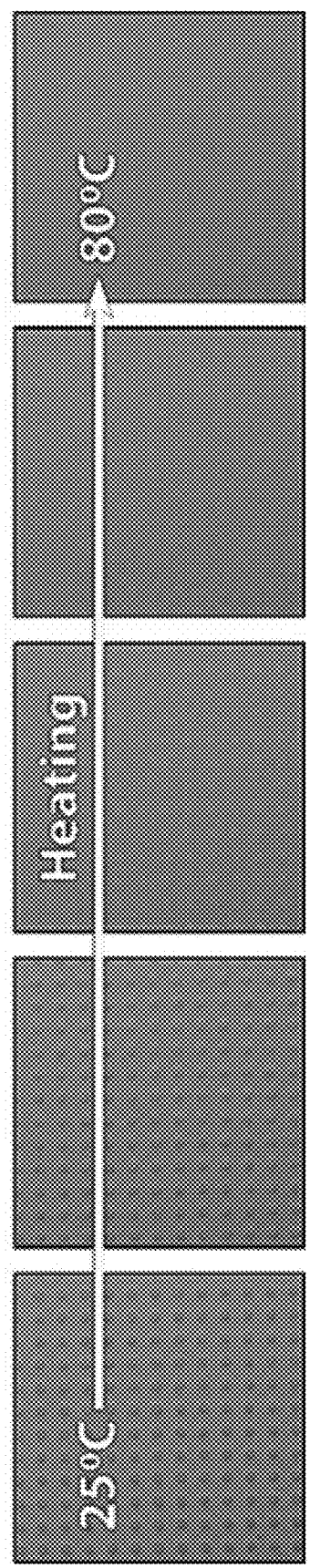
FIG. 48. Sequential optical images of indentation shape recovery upon heating.

Upon heating the stamp to T>Tg, the imprinted features disappeared, and the stamp returned to its original undeformed shape (FIG. 48). These results suggest that the thermo-mechanical shape-memory programming of the stamp interface can be used to control interfacial adhesion. This change in adhesion is attributed to the formation of a high surface area conformal contact between the stamp and the donor substrate under the applied load at T>Tg, and the stabilization of this contact upon cooling to T<Tg.

Figure 49:
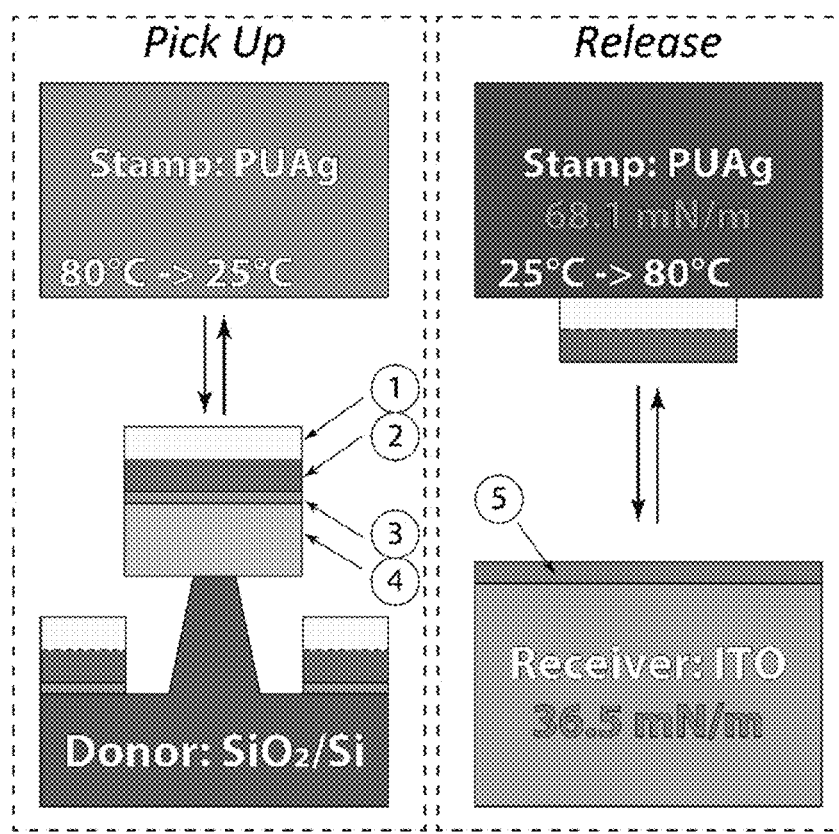
FIG. 49. Donor substrate, ink layers and receiver substrate components and surface energies.

Transfer Printing Experiments. The main goal of this study was to demonstrate selective and accurate large-area transfer of the multilayer thin films from the donor substrate to the receiver substrate using a shape-memory stamp and thermo-mechanical programming of the adhesive interactions. The overall transfer summary and the thin film stack components are described in FIG. 49.

A stack of TCTA doped with FIrpic (60 nm with 30 v/v %) and Al (80 nm) thin films were used as the printing ink materials. The first layer comprised TCTA-FIrpic (60 nm, 38 mN/m), co-deposited as the organic component. This material is commonly applied as an emitting layer in OLED displays. The fluorescence imaging of this layer can be used to assess the efficiency of the material transfer by monitoring the initial and residual fluorescence before and after TCTA-FIrpic removal. The second layer was made up of an Al (80 nm, 49.2 mN/m) thin film as the inorganic component, which is typically applied as an electrode in various thin film electronic devices. The initial surface energy of the untreated $SiO_2$ donor substrate was 43.8 mN/m, but after treatment with Au-SAM, the surface energy decreased to 15.9 mN/m, assisting in the release of the evaporated films during the pick-up step. The receiver substrate was prepared with $MoO_3$ (1 nm), a common hole injection layer, followed by TCTA (20 nm) to match the surface energy of the donor interface with the transferring inks (27 mN/m and 38 mN/m correspondingly).

During the ink pick-up step, conformal contact between the stamp in the glassy state and the aluminum film of the ink will have higher adhesion than a contact between the SAM-functionalized donor surface and the TCTA-FIrpic layer of the ink (68.1 mN/m-49.2 mN/m vs. 15.9 mN/m-38 mN/m). Therefore, the layers are expected to separate at the SAM/TCTA-FIrpic interface. During the transfer step, the lowest surface energy contact will be between the TCTA-FIrpic layer of the ink and the TCTA layer of the receiver substrate (38 mN/m-27 mN/m). Thus, to enable the transfer, the conformality of the stamp-ink substrate must be reduced by a phase transition into the rubbery state where the restored elastic energy can be applied to separate the materials (Example 2).

Figure 50:
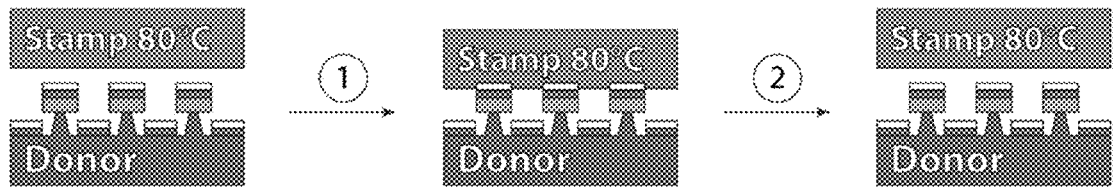
FIG. 50. Top: control pick-up experiments with rubbery and glassy flat stamps without the phase transition; bottom: stitched optical micrographs of the stamp surface after the detachment from the donor substrate (~5×5 mm² area). Magnified inserts show examples of areas with partially picked up features (less than 5% of the total contacted area).
Figure 50:
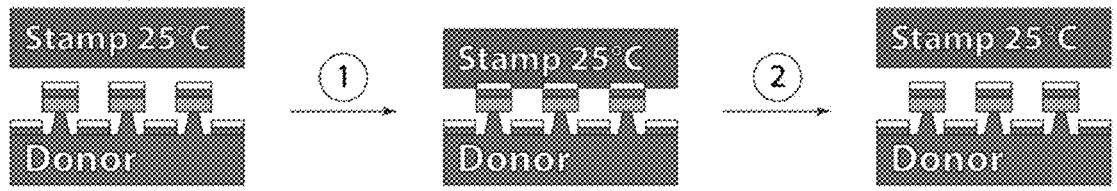
Figure 50:
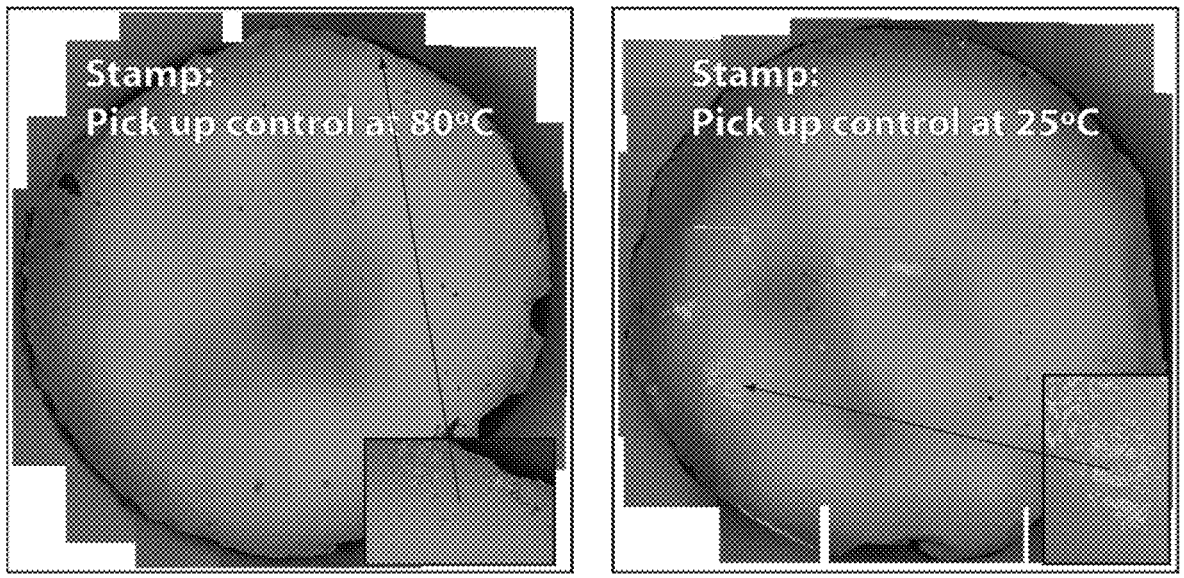

Control experiments were conducted at 80° C. and 25° C., where the flat $PUA_G$ stamps were held in conformal contact with the donor substrates bearing TCTA-FIrpic/Al layers and then detached at the same temperatures (FIG. 50). In both cases, less than ~5% of the features were removed from the donor surface after the stamp detachment. These experiments suggest that the thermo-mechanical shape-memory programming is necessary to enable successful material transfer, and that the stiffening phase-transition that occurs under the compressive load during the cooling of the stamp is the key element in this process.

Figure 51:
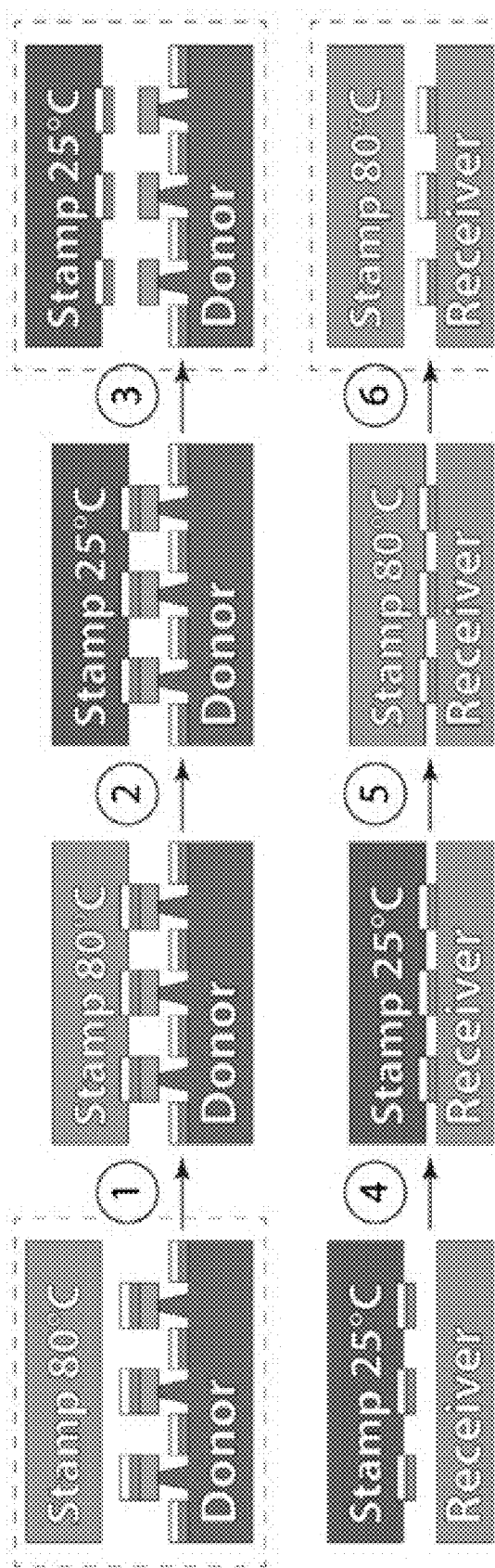
FIG. 51. Steps and components of the shape-memory assisted contact printing cycle.

FIG. 51 shows the steps of the complete contact printing protocol. First, the TCTA-FIrpic/Al stack was deposited onto the donor substrate using thermal evaporation. The flat $PUA_G$ stamp was then compressed into the donor substrate at 80° C. (Step 1, rubbery state). While maintaining the compressive load, the stamp was cooled to 25° C. (Step 2, glassy state) and separated from the donor, lifting off the TCTA-FIrpic/Al stack (Step 3). Subsequently, the stamp at 25° C. with the attached TCTA-FIrpic/Al features was contacted with the receiver substrate—an ITO electrode covered with a thin layer of TCTA (Step 4). While maintaining this contact, the stamp was heated to 80° C. (Step 5), and then detached from the receiver plate leaving behind a pattern of the TCTA-FIrpic/Al features on the receiver surface (Step 6).

Figure 52:
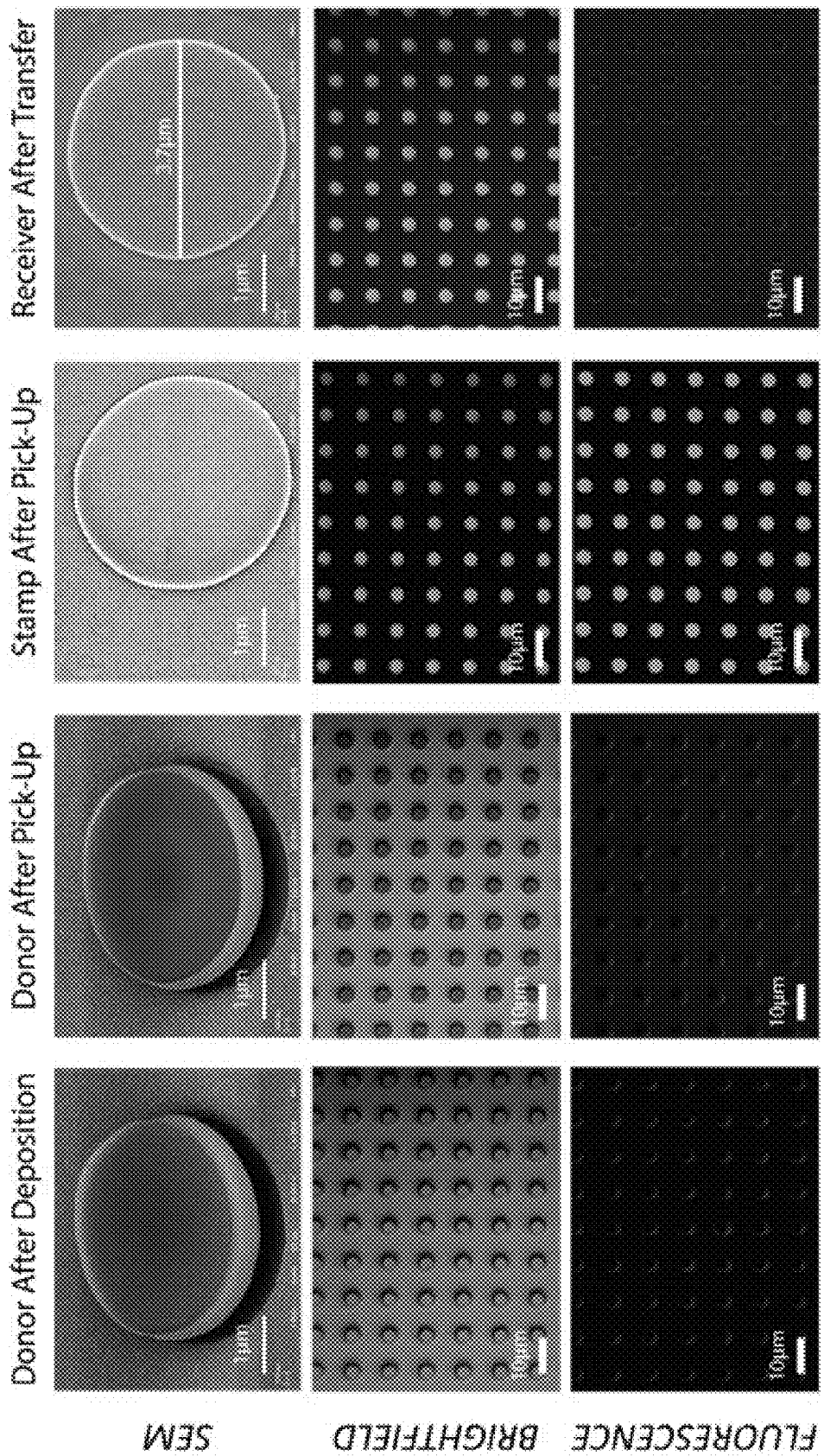
FIG. 52. SEM (top row), brightfield (BF; middle row) and fluorescent (FL; bottom row) micrographs of the donor substrate before (first column) and after (second column) the pick-up step, the stamp after the pick-up step (third column), and the receiver substrate after the transfer step (fourth column).
Figure 54:
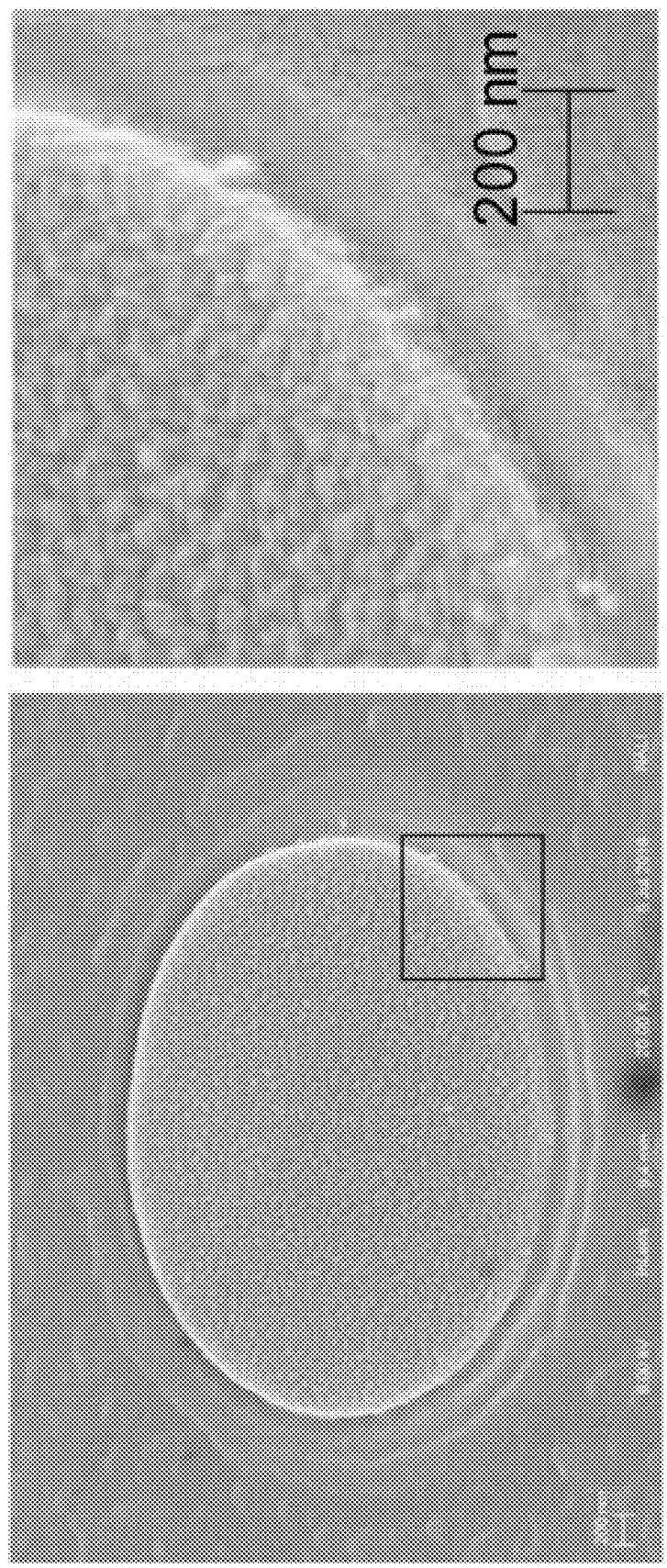
FIG. 54. Tilted-SEM micrographs of the transferred thin film features on the ITO receiver substrate FIG. 55. XPS Spectra and elemental composition of the donor substrate before and after pick-up.

FIG. 52 shows SEM images and optical micrographs of the donor substrate before and after the thin film pick-up, the stamp with picked-up features, and the receiver substrate after the final release step. Brightfield (BF) and fluorescent (FL) microscopy, together with SEM imaging were used to confirm successful pattern transfer from the donor to the receiving substrate. Brightfield mode is suitable for identifying reflective Al films, while the fluorescent micrographs show the presence of the fluorescent TCTA-FIrpic material. Before the pick-up, the features on the donor substrate have the same brightness as the background, while after the pick-up they are darker, confirming the aluminum layer removal from the top of the donor features. The fluorescent micrographs of the donor substrate show no fluorescence before or after the pick-up, confirming that the TCTA-FIrpic layer under the aluminum layer was completely removed from the donor substrate. The brightfield images of the stamp after the pick-up clearly show a reflective aluminum layer under a thin and transparent TCTA-FIrpic layer. The fluorescent images of the stamp show fluorescent features, confirming the presence of the TCTA-FIrpic layer. The brightfield features on the receiver substrate after the transfer show high reflectivity, confirming the presence of the aluminum layer, while the receiver features on the fluorescent micrographs only show slight fluorescence from the edges because the TCTA-FIrpic layer is covered by the reflective Al layer. Together brightfield and fluorescent images confirm that both TCTA-FIrpic and aluminum layers were completely transferred from the receiver substrate to the donor surface without layer separation or partial material transfer. The tilted SEM images of the donor substrate before and after the printing also show that the TCTA-FIrpic/Al ink layers were removed from the donor features. SEM images of the transferred features on the stamp and the receiver substrate show that the features were not distorted during the printing and that they maintained their dimensions and geometry. The edge resolution of the printed features is below 100 nm (FIG. 54).

Figure 53:
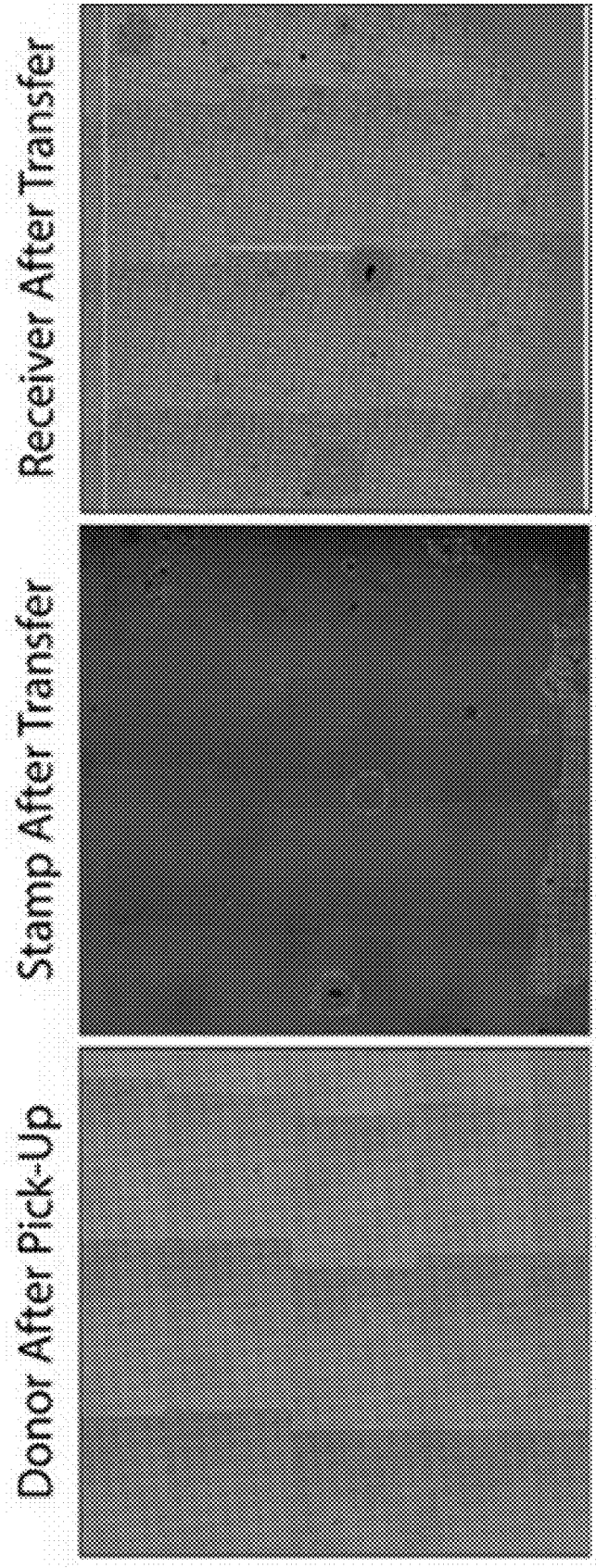
FIG. 53. Stitched optical micrographs of the entire donor substrate after the pick-up (left panel), the stamp after the transfer (center panel), and the receiver substrate after the transfer (right panel) (~5×5 mm² area).

To examine the efficiency of the developed technique in a large-area pattern replication, the entire patterned area (~5×5 mm²) of the donor, stamp and receiver substrates were imaged after the printing to construct stitched micrographs (FIG. 53). The efficiency of each printing step was calculated using ImageJ to determine the ratios between the successfully processed area and the no-transfer area. Table 1 shows that ~68% of the features were successfully transferred from the donor substrate to the stamp and ~90% of the features from the stamp to the receiver surface. The existence of printing defects is mostly correlated with the presence of dust particles that preclude conformal contact between the stamp and the donor or receiver plates. Another source of printing defects stems from an incomplete attachment of the stamp to the receiver plate at the pattern edge due to lateral substrate misalignment. Such problems can be avoided in more controlled environments (all reported experiments were conducted in a typical wet chemistry lab) and using more precise opto-mechanical alignment and force distribution systems.

TABLE 1

Pick-up and transfer efficiency of shape memory assisted contact printing calculated with areas processed by ImageJ.

| Pick-Up Area (mm²) | Transfer Area (mm²) | Total Stamp Area (mm²) |
|---|---|---|
| 16.1 | 14.6 | 23.7 |
| Pick-up Efficiency | Transfer Efficiency | Total Transfer Efficiency |
| 68% | 90% | 61% |

Figure 55:
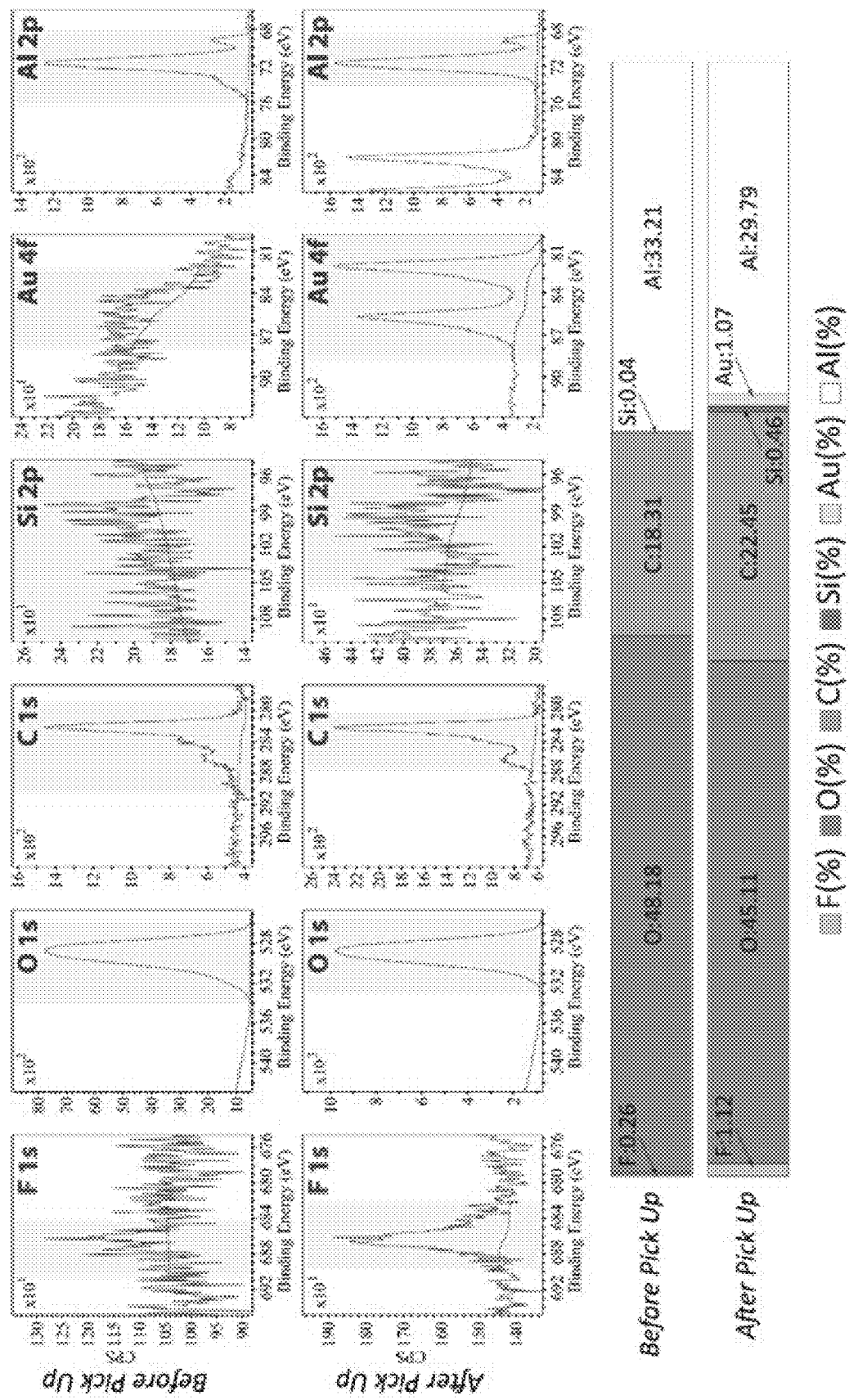

XPS analysis was conducted to confirm that the whole TCTA-FIrpic/Al stack was completely transferred from the donor substrate to the stamp without delamination or partial material transfer, and that the SAM-Au layer on the donor surface was not picked-up by the stamp. FIG. 55 shows region scans of F1s, O1s, C1s, Si2p, Au4f, and Al2p atoms on the donor substrate before and after the pick-up step.

Before the pick-up step, the donor surface is composed of oxygen and aluminum atoms in the oxidized aluminum layer and of carbon atoms from randomly physiosorbed organic species. Both F1s and Au4f signal intensities are very low because the Au-SAM layer is covered by the TCTA-FIrpic/Al films. After the pick-up, the concentration of Al atoms decreases, while the F1s, C1s and Au4f signals all increase, confirming the removal of the TCTA-FIrpic/Al layers and the unmasking of the Au-SAM interface that contains dense per-fluorinated organic molecules. The XPS measurements also indicate that the concentration of the Al atoms on the donor surface decreases by ~10.3% after the pick-up step, which is in good agreement with the pattern density of the transferring sites ($\pi(3.7 \mu m/2)^2/100 \mu m^2 = 10.75\%$).

Conclusions: In this paper, the transfer printing of microscale metal-organic thin film features using shape memory effect and a platform donor substrate was presented. By controlling adhesive interactions between the shape memory polymer stamp and the bilayer features, the protocol enables clean and efficient feature transfer without layer delamination or geometrical distortion. Because the platform structure of the donor substrate works as a template during the thin film fabrication, this technique allows fabrication of high edge-resolution microarrays of the metal-organic thin film. The elevated platform also permits the use of flat shape memory polymer stamps, and it aids in controlling adhesive interactions by concentrating the shape memory effect onto the micro-indented area. These results serve as a promising starting point for future studies targeted to manufacture complete electronic devices by transferring the entire multilayered thin-film devices in one printing cycle and compare the electrical performance of the printed and vacuum-deposited devices.

The methods and compositions of the appended claims are not limited in scope by the specific methods and compositions described herein, which are intended as illustrations of a few aspects of the claims and any methods and compositions that are functionally equivalent are within the scope of this disclosure. Various modifications of the methods and compositions in addition to those shown and described herein are intended to fall within the scope of the appended claims. Further, while only certain representative methods, compositions, and aspects of these methods and compositions are specifically described, other methods and compositions and combinations of various features of the methods and compositions are intended to fall within the scope of the appended claims, even if not specifically recited. Thus a combination of steps, elements, components, or constituents can be explicitly mentioned herein; however, all other combinations of steps, elements, components, and constituents are included, even though not explicitly stated.

What is claimed is:

1. A method of contact printing with a shape-memory stamp, the shape-memory stamp comprising a shape-memory polymer having a transition temperature, the method comprising:
   a) heating the shape-memory stamp to a temperature above the transition temperature;
   b) contacting the shape-memory stamp with a donor substrate while the shape-memory stamp is above the transition temperature, wherein the donor substrate has a first surface and a set of protrusions extending from the first surface along an axis to a second surface, the second surface being opposite and axially spaced apart from the first surface, the second surface being planar, wherein the donor substrate has a thin film disposed on the second surface and contacting the shape-memory stamp with the donor substrate comprises contacting a surface of the shape-memory stamp with the thin film;
   c) while the surface of the shape-memory stamp is in contact with the thin film, cooling the shape-memory stamp to a temperature below the transition temperature, thereby temporarily fixing the shape-memory polymer and the shape-memory stamp, such that the shape-memory polymer and the shape-memory stamp are in a temporarily fixed state;
   d) separating the shape-memory stamp in the temporarily fixed state from the donor substrate, thereby picking up the thin film from the donor substrate with the shape-memory stamp in the temporarily fixed state, such that the shape-memory stamp in the temporarily fixed state includes the thin film on the surface thereof after being separated from the donor substrate, such that the shape-memory stamp is in a printed temporarily fixed state and has a printed surface;
   e) contacting the printed surface of the shape-memory stamp in the printed temporarily fixed state with a top surface of a receiver substrate;
   f) heating the shape-memory stamp in the printed temporarily fixed state to a temperature above the transition temperature while in contact with the top surface of the receiver substrate, thereby depositing the thin film on the top surface; and
   g) after heating the shape-memory stamp in the printed temporarily fixed state to a temperature above the transition temperature, separating the shape-memory stamp from the receiver substrate, wherein the thin film remains on the top surface of the receiver substrate after the shape-memory stamp is separated from the receiver substrate, thereby transferring the thin film onto the top surface of the receiver substrate, the thin film transferred to the top surface of the receiver substrate being a printed element having an average size of from 1 nanometer (nm) to 100 micrometers (microns, μm).

2. The method of claim 1, further comprising, after step g), re-using the shape-memory stamp to repeat steps a)-g).

3. The method of claim 1, further comprising, before step a), making the shape-memory stamp, the shape-memory polymer, or a combination thereof.

4. The method of claim 1, wherein the shape-memory polymer comprises a semi-crystalline polymer, a glass forming network polymer, or a combination thereof.

5. The method of claim 1, wherein the shape-memory polymer comprises a polycaprolactone polymer, a urethane-acrylate polymer, a thiol-vinyl network polymer, or a combination thereof.

6. The method of claim 1, further comprising, before step a), determining the transition temperature.

7. The method of claim 1, wherein the transition temperature is above room temperature.

8. The method of claim 1, wherein the shape-memory polymer has a first Young's modulus at a temperature above the transition temperature and a second Young's modulus at a temperature below the transition temperature, the first Young's modulus being lower than the second Young's modulus.

9. The method of claim 1, wherein the shape-memory stamp has a third surface and a set of features extending from the third surface along a central axis to a fourth surface, the fourth surface being opposite and axially spaced apart from the third surface, wherein contacting the surface of the shape-memory stamp with the thin film comprises contacting the fourth surface with the thin film.

10. The method of claim 1, wherein the method further comprises, after step b) and before step c), compressing the shape-memory stamp against the donor substrate.

11. The method of claim 1, wherein the set of protrusions have a first section and a second section, the first section extending from the first surface along a first portion of the axis, the second section adjoining the first section and extending along a second portion of the axis to the second surface; wherein the first section has a first average characteristic dimension where the first section adjoins the second section; wherein the second section has a second average characteristic dimension where the first section adjoins the second section; and wherein the first average characteristic dimension is smaller than the second average characteristic dimension.

12. The method of claim 1, further comprising, before step a) or step b), making the donor substrate.

13. The method of claim 1, wherein the thin film comprises an organic semiconductor, an inorganic light-emitting material, or a combination thereof.

14. The method of claim 1, wherein the thin film has an average thickness of from 1 nanometer (nm) to 50 micrometers (μm, microns).

15. The method of claim 1, wherein the thin film comprises a plurality of layers, each of the plurality of layers having a composition, and the composition of a given layer differs from the other layer(s) contacting said given layer.

16. The method of claim 1, wherein the method has a resolution of 10 micrometers or less.

* * * * *